United States Patent
Juntunen et al.

(10) Patent No.: US 9,983,244 B2
(45) Date of Patent: May 29, 2018

(54) POWER TRANSFORMATION SYSTEM WITH CHARACTERIZATION

(71) Applicant: Honeywell International Inc., Morristown, NJ (US)

(72) Inventors: Robert D. Juntunen, Minnetonka, MN (US); Jonathan P. Frenz, Minneapolis, MN (US); Devin Diedrich, Ramsey, MN (US)

(73) Assignee: Honeywell International Inc., Morris Plains, NJ (US)

( * ) Notice: Subject to any disclaimer, the term of this patent is extended or adjusted under 35 U.S.C. 154(b) by 727 days.

(21) Appl. No.: 14/301,175

(22) Filed: Jun. 10, 2014

(65) Prior Publication Data

US 2015/0002165 A1    Jan. 1, 2015

Related U.S. Application Data

(63) Continuation-in-part of application No. 14/300,232, filed on Jun. 9, 2014, now abandoned, and a
(Continued)

(51) Int. Cl.
*G01R 27/16* (2006.01)
*H02J 7/34* (2006.01)
(Continued)

(52) U.S. Cl.
CPC ............. *G01R 27/16* (2013.01); *H02J 7/345* (2013.01); *H02J 50/00* (2016.02); *G01R 19/2513* (2013.01); *Y10T 307/492* (2015.04)

(58) Field of Classification Search
CPC .................................................. H02J 50/00
See application file for complete search history.

(56) References Cited

U.S. PATENT DOCUMENTS 3,464,673 A    9/1969 Cargo et al.
3,665,159 A    5/1972 Becker et al.
(Continued)

FOREIGN PATENT DOCUMENTS

CA    1035448 A    7/1978
DE    3334117 A1    4/1985
(Continued)

OTHER PUBLICATIONS

Lux, "TX1500 Series Smart Temp Electronic Thermostat," Owner's Manual, 6 pages, prior to Jul. 7, 2004.
(Continued)

*Primary Examiner* — Manuel A Rivera Vargas
(74) *Attorney, Agent, or Firm* — Seager, Tufte & Wickhem, LLP

(57) ABSTRACT

A power transformation system having a power stealing mode for powering a device indirectly through an electrical load connected to a power source and also has a characterization mode. The transfer of energy from the power source via the load may go undetected. The system may store energy from the load in an ultra or super capacitor. This energy may be used to power Wi-Fi and various thermostat applications, among other things, associated with HVAC and building automation and management systems. Energy from the load may be supplemented or substituted with energy from a battery and/or a buck converter. In the characterization mode, the system may obtain data relative to power usage of a load and determine a profile to identify one or more components and their operating conditions.

12 Claims, 39 Drawing Sheets

Related U.S. Application Data continuation-in-part of application No. 14/300,228, filed on Jun. 9, 2014, now abandoned.

(60) Provisional application No. 61/841,191, filed on Jun. 28, 2013, provisional application No. 61/899,427, filed on Nov. 4, 2013.

(51) Int. Cl.
*H02J 50/00* (2016.01)
*G01R 19/25* (2006.01)

(56) References Cited

U.S. PATENT DOCUMENTS

| | | |
|---|---|---|
| 3,899,713 A | 8/1975 | Barkan et al. |
| 3,942,028 A | 3/1976 | Baker |
| 4,078,720 A | 3/1978 | Nurnberg |
| 4,079,366 A | 3/1978 | Wong |
| 4,093,943 A | 6/1978 | Knight |
| 4,151,387 A | 4/1979 | Peters, Jr. |
| 4,174,807 A | 11/1979 | Smith et al. |
| 4,197,571 A | 4/1980 | Grunert |
| 4,206,872 A | 6/1980 | Levine |
| 4,224,615 A | 9/1980 | Penz |
| 4,232,819 A | 11/1980 | Bost |
| 4,257,555 A | 3/1981 | Neel |
| 4,264,034 A | 4/1981 | Hyltin et al. |
| 4,274,045 A | 6/1981 | Goldstein |
| 4,296,334 A | 10/1981 | Wong |
| 4,298,946 A | 11/1981 | Hartsell et al. |
| 4,300,199 A | 11/1981 | Yoknis et al. |
| 4,308,991 A | 1/1982 | Peinetti et al. |
| 4,316,256 A | 2/1982 | Hendricks et al. |
| 4,332,352 A | 6/1982 | Jaeger |
| 4,337,822 A | 7/1982 | Hyltin et al. |
| 4,337,893 A | 7/1982 | Flanders et al. |
| 4,373,664 A | 2/1983 | Barker et al. |
| 4,379,483 A | 4/1983 | Farley |
| 4,382,544 A | 5/1983 | Stewart |
| 4,384,213 A | 5/1983 | Bogel |
| 4,386,649 A | 6/1983 | Hines et al. |
| 4,388,692 A | 6/1983 | Jones et al. |
| 4,431,134 A | 2/1984 | Hendricks et al. |
| 4,446,913 A | 5/1984 | Krocker |
| 4,479,604 A | 10/1984 | Didner |
| 4,503,471 A | 3/1985 | Hanajima et al. |
| 4,504,778 A | 3/1985 | Evans |
| 4,506,827 A | 3/1985 | Jamieson et al. |
| 4,556,169 A | 12/1985 | Zervos |
| 4,585,164 A | 4/1986 | Butkovich et al. |
| 4,606,401 A | 8/1986 | Levine et al. |
| 4,621,336 A | 11/1986 | Brown |
| 4,622,544 A | 11/1986 | Bially et al. |
| 4,628,201 A | 12/1986 | Schmitt |
| 4,641,013 A | 2/1987 | Dunnigan et al. |
| 4,646,964 A | 3/1987 | Parker et al. |
| 4,692,596 A | 9/1987 | Payne |
| 4,706,177 A | 11/1987 | Josephson |
| 4,717,333 A | 1/1988 | Carignan |
| 4,725,001 A | 2/1988 | Carney et al. |
| 4,745,300 A | 5/1988 | Kammerer et al. |
| 4,745,311 A | 5/1988 | Iwasaki |
| 4,806,843 A | 2/1989 | Mertens et al. |
| 4,811,163 A | 3/1989 | Fletcher |
| 4,829,779 A | 5/1989 | Munson et al. |
| 4,837,731 A | 6/1989 | Levine et al. |
| 4,881,686 A | 11/1989 | Mehta |
| 4,918,439 A | 4/1990 | Wozniak et al. |
| 4,939,995 A | 7/1990 | Feinberg |
| 4,942,613 A | 7/1990 | Lynch |
| 4,948,040 A | 8/1990 | Kobayashi et al. |
| 4,969,508 A | 11/1990 | Tate et al. |
| 4,992,779 A | 2/1991 | Sugino et al. |
| 4,997,029 A | 3/1991 | Otsuka et al. |
| 5,005,365 A | 4/1991 | Lynch |
| 5,012,973 A | 5/1991 | Dick et al. |
| 5,025,134 A | 6/1991 | Bensoussan et al. |
| 5,036,698 A | 8/1991 | Conti |
| 5,038,851 A | 8/1991 | Mehta |
| 5,053,752 A | 10/1991 | Epstein et al. |
| 5,065,813 A | 11/1991 | Berkeley et al. |
| 5,081,411 A | 1/1992 | Walker |
| 5,086,385 A | 2/1992 | Launey et al. |
| 5,088,645 A | 2/1992 | Bell |
| 5,118,963 A | 6/1992 | Gesin |
| 5,120,983 A | 6/1992 | Samann |
| 5,140,310 A | 8/1992 | DeLuca et al. |
| 5,161,606 A | 11/1992 | Berkeley et al. |
| 5,170,935 A | 12/1992 | Federspiel et al. |
| 5,172,565 A | 12/1992 | Wruck et al. |
| 5,181,653 A | 1/1993 | Foster et al. |
| 5,187,797 A | 2/1993 | Nielsen et al. |
| 5,192,874 A | 3/1993 | Adams |
| 5,210,685 A | 5/1993 | Rosa |
| 5,221,877 A | 6/1993 | Falk |
| 5,226,591 A | 7/1993 | Ratz |
| 5,230,482 A | 7/1993 | Ratz et al. |
| 5,238,184 A | 8/1993 | Adams |
| 5,251,813 A | 10/1993 | Kniepkamp |
| 5,259,445 A | 11/1993 | Pratt et al. |
| 5,272,477 A | 12/1993 | Tashima et al. |
| 5,277,244 A | 1/1994 | Mehta |
| 5,289,047 A | 2/1994 | Broghammer |
| 5,294,849 A | 3/1994 | Potter |
| 5,329,991 A | 7/1994 | Mehta et al. |
| 5,348,078 A | 9/1994 | Dushane et al. |
| 5,351,035 A | 9/1994 | Chrisco |
| 5,361,009 A | 11/1994 | Lu |
| 5,386,577 A | 1/1995 | Zenda |
| 5,390,206 A | 2/1995 | Rein et al. |
| 5,404,934 A | 4/1995 | Carlson et al. |
| 5,414,618 A | 5/1995 | Mock et al. |
| 5,429,649 A | 7/1995 | Robin |
| 5,439,441 A | 8/1995 | Grimsley et al. |
| 5,452,197 A | 9/1995 | Rice |
| 5,482,209 A | 1/1996 | Cochran et al. |
| 5,495,887 A | 3/1996 | Kathnelson et al. |
| 5,506,572 A | 4/1996 | Hills et al. |
| 5,526,422 A | 6/1996 | Keen |
| 5,537,106 A | 7/1996 | Mitsuhashi |
| 5,544,036 A | 8/1996 | Brown, Jr. et al. |
| 5,566,879 A | 10/1996 | Longtin |
| 5,570,837 A | 11/1996 | Brown et al. |
| 5,579,197 A | 11/1996 | Mengelt et al. |
| 5,590,831 A | 1/1997 | Manson et al. |
| 5,603,451 A | 2/1997 | Helander et al. |
| 5,654,813 A | 8/1997 | Whitworth |
| 5,668,535 A | 9/1997 | Hendrix et al. |
| 5,671,083 A | 9/1997 | Connor et al. |
| 5,673,850 A | 10/1997 | Uptegraph |
| 5,679,137 A | 10/1997 | Erdman et al. |
| 5,682,206 A | 10/1997 | Wehmeyer et al. |
| 5,711,785 A | 1/1998 | Maxwell |
| 5,732,691 A | 3/1998 | Maiello et al. |
| 5,736,795 A | 4/1998 | Zuehlke et al. |
| 5,761,083 A | 6/1998 | Brown, Jr. et al. |
| 5,782,296 A | 7/1998 | Mehta |
| 5,801,940 A | 9/1998 | Russ et al. |
| 5,810,908 A | 9/1998 | Gray et al. |
| 5,818,428 A | 10/1998 | Eisenbrandt et al. |
| 5,833,134 A | 11/1998 | Ho et al. |
| 5,839,654 A | 11/1998 | Weber |
| 5,840,094 A | 11/1998 | Osendorf et al. |
| 5,862,737 A | 1/1999 | Chin et al. |
| 5,873,519 A | 2/1999 | Beilfuss |
| 5,886,697 A | 3/1999 | Naughton et al. |
| 5,899,866 A | 5/1999 | Cyrus et al. |
| 5,902,183 A | 5/1999 | D'Souza |
| 5,903,139 A | 5/1999 | Kompelien |
| 5,909,429 A | 6/1999 | Satyanarayana et al. |
| 5,915,473 A | 6/1999 | Ganesh et al. |
| 5,917,141 A | 6/1999 | Naquin, Jr. |
| 5,917,416 A | 6/1999 | Read |
| D413,328 S | 8/1999 | Kazama |

(56) References Cited

U.S. PATENT DOCUMENTS

| | | |
|---|---|---|
| 5,937,942 A | 8/1999 | Bias et al. |
| 5,947,372 A | 9/1999 | Tiernan |
| 5,950,709 A | 9/1999 | Krueger et al. |
| 6,009,355 A | 12/1999 | Obradovich et al. |
| 6,013,121 A | 1/2000 | Chin et al. |
| 6,018,700 A | 1/2000 | Edel |
| 6,020,881 A | 2/2000 | Naughton et al. |
| 6,032,867 A | 3/2000 | Dushane et al. |
| D422,594 S | 4/2000 | Henderson et al. |
| 6,059,195 A | 5/2000 | Adams et al. |
| 6,081,197 A | 6/2000 | Garrick et al. |
| 6,084,523 A | 7/2000 | Gelnovatch et al. |
| 6,089,221 A | 7/2000 | Mano et al. |
| 6,101,824 A | 8/2000 | Meyer et al. |
| 6,104,963 A | 8/2000 | Cebasek et al. |
| 6,119,125 A | 9/2000 | Gloudeman et al. |
| 6,121,875 A | 9/2000 | Hamm et al. |
| 6,140,987 A | 10/2000 | Stein et al. |
| 6,141,595 A | 10/2000 | Gloudeman et al. |
| 6,145,751 A | 11/2000 | Ahmed |
| 6,149,065 A | 11/2000 | White et al. |
| 6,152,375 A | 11/2000 | Robison |
| 6,154,081 A | 11/2000 | Pakkala et al. |
| 6,167,316 A | 12/2000 | Gloudeman et al. |
| 6,190,442 B1 | 2/2001 | Redner |
| 6,192,282 B1 | 2/2001 | Smith et al. |
| 6,196,467 B1 | 3/2001 | Dushane et al. |
| 6,205,041 B1 | 3/2001 | Baker |
| 6,208,331 B1 | 3/2001 | Singh et al. |
| 6,216,956 B1 | 4/2001 | Ehlers et al. |
| 6,236,326 B1 | 5/2001 | Murphy |
| 6,259,074 B1 | 7/2001 | Brunner et al. |
| 6,260,765 B1 | 7/2001 | Natale et al. |
| 6,285,912 B1 | 9/2001 | Ellison et al. |
| 6,288,458 B1 | 9/2001 | Berndt |
| 6,290,140 B1 | 9/2001 | Pesko et al. |
| D448,757 S | 10/2001 | Okubo |
| 6,315,211 B1 | 11/2001 | Sartain et al. |
| 6,318,639 B1 | 11/2001 | Toth |
| 6,321,637 B1 | 11/2001 | Shanks et al. |
| 6,330,806 B1 | 12/2001 | Beaverson et al. |
| 6,344,861 B1 | 2/2002 | Naughton et al. |
| 6,351,693 B1 | 2/2002 | Monie et al. |
| 6,356,038 B2 | 3/2002 | Bishel |
| 6,385,510 B1 | 5/2002 | Hoog et al. |
| 6,394,359 B1 | 5/2002 | Morgan |
| 6,397,612 B1 | 6/2002 | Kemkamp et al. |
| 6,398,118 B1 | 6/2002 | Rosen et al. |
| 6,448,896 B1 | 9/2002 | Bankus et al. |
| 6,449,726 B1 | 9/2002 | Smith |
| 6,453,687 B2 | 9/2002 | Sharood et al. |
| D464,948 S | 10/2002 | Vasquez et al. |
| 6,460,774 B2 | 10/2002 | Sumida et al. |
| 6,466,132 B1 | 10/2002 | Caronna et al. |
| 6,490,174 B1 | 12/2002 | Kompelien |
| 6,502,758 B2 | 1/2003 | Cottrell |
| 6,507,282 B1 | 1/2003 | Sherwood |
| 6,512,209 B1 | 1/2003 | Yano |
| 6,518,953 B1 | 2/2003 | Armstrong |
| 6,518,957 B1 | 2/2003 | Lehtinen et al. |
| 6,546,419 B1 | 4/2003 | Humpleman et al. |
| 6,556,899 B1 | 4/2003 | Harvey et al. |
| 6,566,768 B2 | 5/2003 | Zimmerman et al. |
| 6,574,537 B2 | 6/2003 | Kipersztok et al. |
| 6,578,770 B1 | 6/2003 | Rosen |
| 6,580,950 B1 | 6/2003 | Johnson et al. |
| 6,581,846 B1 | 6/2003 | Rosen |
| 6,587,739 B1 | 7/2003 | Abrams et al. |
| 6,595,430 B1 | 7/2003 | Shah |
| 6,596,059 B1 | 7/2003 | Greist et al. |
| D478,051 S | 8/2003 | Sagawa |
| 6,608,560 B2 | 8/2003 | Abrams |
| 6,619,055 B1 | 9/2003 | Addy |
| 6,619,555 B2 | 9/2003 | Rosen |
| 6,621,507 B1 | 9/2003 | Shah |
| 6,622,925 B2 | 9/2003 | Carner et al. |
| 6,635,054 B2 | 10/2003 | Fjeld et al. |
| 6,663,010 B2 | 12/2003 | Chene et al. |
| 6,685,098 B2 | 2/2004 | Okano et al. |
| 6,702,811 B2 | 3/2004 | Stewart et al. |
| 6,726,112 B1 | 4/2004 | Ho |
| D492,282 S | 6/2004 | Lachello et al. |
| 6,771,996 B2 | 8/2004 | Bowe et al. |
| 6,783,079 B2 | 8/2004 | Carey et al. |
| 6,786,421 B2 | 9/2004 | Rosen |
| 6,789,739 B2 | 9/2004 | Rosen |
| 6,801,849 B2 | 10/2004 | Szukala et al. |
| 6,807,041 B2 | 10/2004 | Geiger et al. |
| 6,808,524 B2 | 10/2004 | Lopath et al. |
| 6,810,307 B1 | 10/2004 | Addy |
| 6,810,397 B1 | 10/2004 | Qian et al. |
| 6,824,069 B2 | 11/2004 | Rosen |
| 6,833,990 B2 | 12/2004 | LaCroix et al. |
| 6,842,721 B2 | 1/2005 | Kim et al. |
| 6,851,621 B1 | 2/2005 | Wacker et al. |
| 6,868,293 B1 | 3/2005 | Schurr et al. |
| 6,893,438 B2 | 5/2005 | Hall et al. |
| 6,934,862 B2 | 8/2005 | Sharood et al. |
| D512,208 S | 12/2005 | Kubo et al. |
| 6,973,410 B2 | 12/2005 | Seigel |
| 7,001,495 B2 | 2/2006 | Essalik et al. |
| 7,013,845 B1 | 3/2006 | McFarland et al. |
| D520,989 S | 5/2006 | Miller |
| 7,050,026 B1 | 5/2006 | Rosen |
| 7,055,759 B2 | 6/2006 | Wacker et al. |
| 7,080,358 B2 | 7/2006 | Kuzmin |
| 7,083,109 B2 | 8/2006 | Pouchak |
| 7,083,189 B2 | 8/2006 | Ogata |
| 7,084,774 B2 | 8/2006 | Martinez |
| 7,089,088 B2 | 8/2006 | Terry et al. |
| 7,108,194 B1 | 9/2006 | Hankins, II |
| 7,130,719 B2 | 10/2006 | Ehlers et al. |
| D531,588 S | 11/2006 | Peh |
| 7,133,748 B2 | 11/2006 | Robinson |
| D533,515 S | 12/2006 | Klein et al. |
| 7,146,253 B2 | 12/2006 | Hoog et al. |
| 7,152,806 B1 | 12/2006 | Rosen |
| 7,156,318 B1 | 1/2007 | Rosen |
| 7,163,156 B2 | 1/2007 | Kates |
| 7,188,002 B2 | 3/2007 | Chapman, Jr. et al. |
| D542,236 S | 5/2007 | Klein et al. |
| 7,212,887 B2 | 5/2007 | Shah et al. |
| 7,222,800 B2 | 5/2007 | Wruck et al. |
| 7,225,054 B2 | 5/2007 | Amundson et al. |
| 7,231,605 B1 | 6/2007 | Ramakasavan |
| 7,232,075 B1 | 6/2007 | Rosen |
| 7,240,289 B2 | 7/2007 | Naughton et al. |
| 7,244,294 B2 | 7/2007 | Kates |
| 7,261,762 B2 | 8/2007 | Kang et al. |
| 7,263,283 B2 | 8/2007 | Knepler |
| 7,274,973 B2 | 9/2007 | Nichols et al. |
| 7,302,642 B2 | 11/2007 | Smith et al. |
| 7,331,187 B2 | 2/2008 | Kates |
| 7,341,201 B2 | 3/2008 | Stanimirovic |
| 7,354,005 B2 | 4/2008 | Carey et al. |
| RE40,437 E | 7/2008 | Rosen |
| 7,419,532 B2 | 9/2008 | Sellers et al. |
| 7,435,278 B2 | 10/2008 | Terlson |
| 7,451,606 B2 | 11/2008 | Harrod |
| 7,452,396 B2 | 11/2008 | Terlson et al. |
| 7,476,988 B2 | 1/2009 | Mulhouse et al. |
| 7,489,094 B2 | 2/2009 | Steiner et al. |
| 7,496,627 B2 | 2/2009 | Moorer et al. |
| 7,500,026 B2 | 3/2009 | Fukanaga et al. |
| 7,505,914 B2 | 3/2009 | McCall |
| 7,542,867 B2 | 6/2009 | Steger et al. |
| 7,556,207 B2 | 7/2009 | Mueller et al. |
| 7,574,283 B2 | 8/2009 | Wang et al. |
| 7,584,897 B2 | 9/2009 | Schultz et al. |
| 7,594,960 B2 | 9/2009 | Johansson |
| 7,595,613 B2 | 9/2009 | Thompson et al. |
| 7,600,694 B2 | 10/2009 | Helt et al. |
| 7,604,046 B2 | 10/2009 | Bergman et al. |
| 7,617,691 B2 | 11/2009 | Street et al. |

(56) References Cited

U.S. PATENT DOCUMENTS

| | | | |
|---|---|---|---|
| 7,642,674 B2 | 1/2010 | Mulhouse et al. |
| 7,644,591 B2 | 1/2010 | Singh et al. |
| 7,665,019 B2 | 2/2010 | Jaeger |
| 7,676,282 B2 | 3/2010 | Bosley |
| 7,692,559 B2 | 4/2010 | Face et al. |
| 7,707,189 B2 | 4/2010 | Haselden et al. |
| 7,713,339 B2 | 5/2010 | Johansson |
| 7,739,282 B1 | 6/2010 | Smith et al. |
| 7,755,220 B2 | 7/2010 | Sorg et al. |
| 7,770,242 B2 | 8/2010 | Sell |
| 7,793,056 B2 | 9/2010 | Boggs et al. |
| 7,814,516 B2 | 10/2010 | Stecyk et al. |
| 7,837,676 B2 | 11/2010 | Sinelnikov et al. |
| 7,838,803 B1 | 11/2010 | Rosen |
| 7,859,815 B2 | 12/2010 | Black et al. |
| 7,865,252 B2 | 1/2011 | Clayton |
| 7,941,431 B2 | 5/2011 | Bluhm et al. |
| 7,952,485 B2 | 5/2011 | Schecter et al. |
| 7,956,719 B2 | 6/2011 | Anderson, Jr. et al. |
| 7,957,775 B2 | 6/2011 | Allen, Jr. et al. |
| 7,984,220 B2 | 7/2011 | Gerard et al. |
| 7,992,764 B2 | 8/2011 | Magnusson |
| 7,992,794 B2 | 8/2011 | Leen et al. |
| 8,032,254 B2 | 10/2011 | Amundson et al. |
| 8,060,470 B2 | 11/2011 | Davidson et al. |
| 8,087,593 B2 | 1/2012 | Leen |
| 8,091,796 B2 | 1/2012 | Amundson et al. |
| 8,136,738 B1 | 3/2012 | Kopp |
| 8,138,634 B2 | 3/2012 | Ewing et al. |
| 8,167,216 B2 | 5/2012 | Schultz et al. |
| 8,216,216 B2 | 7/2012 | Warnking et al. |
| 8,239,066 B2 | 8/2012 | Jennings et al. |
| 8,269,376 B1 | 9/2012 | Elberbaum |
| 8,276,829 B2 | 10/2012 | Stoner et al. |
| 8,280,556 B2 | 10/2012 | Besore et al. |
| 8,314,517 B2 | 11/2012 | Simard et al. |
| 8,346,396 B2 | 1/2013 | Amundson et al. |
| 8,417,091 B2 | 4/2013 | Kim et al. |
| 8,437,878 B2 | 5/2013 | Grohman et al. |
| 8,511,577 B2 | 8/2013 | Warren et al. |
| 8,523,083 B2 | 9/2013 | Warren et al. |
| 8,532,190 B2 | 9/2013 | Shimizu et al. |
| 8,554,374 B2 | 10/2013 | Lunacek et al. |
| 8,574,343 B2 | 11/2013 | Bisson et al. |
| 8,613,792 B2 | 12/2013 | Ragland et al. |
| 8,623,117 B2 | 1/2014 | Zavodny et al. |
| 8,629,661 B2 | 1/2014 | Shimada et al. |
| 8,680,442 B2 | 3/2014 | Reusche et al. |
| 8,704,672 B2 | 4/2014 | Hoglund et al. |
| 8,731,723 B2 | 5/2014 | Boll et al. |
| 8,734,565 B2 | 5/2014 | Hoglund et al. |
| 8,752,771 B2 | 6/2014 | Warren et al. |
| 8,768,341 B2 | 7/2014 | Coutelou et al. |
| 8,881,172 B2 | 11/2014 | Schneider |
| 8,886,179 B2 | 11/2014 | Pathuri et al. |
| 8,886,314 B2 | 11/2014 | Crutchfield et al. |
| 8,892,223 B2 | 11/2014 | Leen et al. |
| 8,902,071 B2 | 12/2014 | Barton et al. |
| 9,002,523 B2 | 4/2015 | Erickson et al. |
| 9,071,145 B2 | 6/2015 | Simard et al. |
| 9,080,784 B2 | 7/2015 | Dean-Hendricks et al. |
| 9,098,279 B2 | 8/2015 | Mucignat et al. |
| 9,206,993 B2 | 12/2015 | Barton et al. |
| 9,234,877 B2 | 1/2016 | Hattersley et al. |
| 9,261,287 B2 | 2/2016 | Warren et al. |
| 9,272,647 B2 | 3/2016 | Gawade et al. |
| 9,366,448 B2 | 6/2016 | Dean-Hendricks et al. |
| 9,374,268 B2 | 6/2016 | Budde et al. |
| 2001/0029585 A1 | 10/2001 | Simon et al. |
| 2001/0052459 A1 | 12/2001 | Essalik et al. |
| 2002/0011923 A1 | 1/2002 | Cunningham et al. |
| 2002/0022991 A1 | 2/2002 | Sharood et al. |
| 2002/0082746 A1 | 6/2002 | Schubring et al. |
| 2002/0092779 A1 | 7/2002 | Essalik et al. |
| 2002/0181251 A1 | 12/2002 | Kompelien |
| 2003/0033230 A1 | 2/2003 | McCall |
| 2003/0034897 A1 | 2/2003 | Shamoon et al. |
| 2003/0034898 A1 | 2/2003 | Shamoon et al. |
| 2003/0040279 A1 | 2/2003 | Ballweg |
| 2003/0060821 A1 | 3/2003 | Hall et al. |
| 2003/0073891 A1 | 4/2003 | Chen et al. |
| 2003/0103075 A1 | 6/2003 | Rosselot |
| 2003/0177012 A1 | 9/2003 | Drennan |
| 2004/0262410 A1 | 12/2004 | Hull |
| 2005/0083168 A1 | 4/2005 | Breitenbach |
| 2005/0270151 A1 | 12/2005 | Winick |
| 2006/0112700 A1 | 6/2006 | Choi et al. |
| 2006/0196953 A1 | 9/2006 | Simon et al. |
| 2006/0242591 A1 | 10/2006 | Van Dok et al. |
| 2007/0013534 A1 | 1/2007 | DiMaggio |
| 2007/0045429 A1 | 3/2007 | Chapman, Jr. et al. |
| 2007/0114293 A1 | 5/2007 | Gugenheim |
| 2007/0114295 A1 | 5/2007 | Jenkins et al. |
| 2007/0114848 A1 | 5/2007 | Mulhouse et al. |
| 2007/0115135 A1 | 5/2007 | Mulhouse et al. |
| 2007/0119961 A1 | 5/2007 | Kaiser |
| 2007/0163844 A1 | 7/2007 | Jahkonen |
| 2007/0241203 A1 | 10/2007 | Wagner et al. |
| 2007/0277061 A1 | 11/2007 | Ashe |
| 2007/0289731 A1 | 12/2007 | Deligiannis et al. |
| 2007/0290924 A1 | 12/2007 | McCoy |
| 2007/0296260 A1 | 12/2007 | Stossel |
| 2008/0015740 A1 | 1/2008 | Osann |
| 2009/0143880 A1 | 6/2009 | Amundson et al. |
| 2009/0154206 A1 | 6/2009 | Fouquet et al. |
| 2009/0165644 A1 | 7/2009 | Campbell |
| 2009/0167265 A1 | 7/2009 | Vanderzon |
| 2009/0206657 A1 | 8/2009 | Vuk et al. |
| 2010/0006660 A1 | 1/2010 | Leen et al. |
| 2010/0026379 A1 | 2/2010 | Simard et al. |
| 2010/0084482 A1 | 4/2010 | Kennedy et al. |
| 2010/0204834 A1 | 8/2010 | Comerford et al. |
| 2010/0225267 A1 | 9/2010 | Elhalis |
| 2010/0314458 A1 | 12/2010 | Votaw et al. |
| 2011/0073101 A1 | 3/2011 | Lau et al. |
| 2011/0133558 A1 | 6/2011 | Park |
| 2011/0185895 A1 | 8/2011 | Freen |
| 2011/0251807 A1* | 10/2011 | Rada .............. G01D 4/00 702/61 |
| 2011/0291606 A1 | 12/2011 | Lee |
| 2012/0235490 A1 | 9/2012 | Lee et al. |
| 2012/0323377 A1 | 12/2012 | Hoglund et al. |
| 2013/0158714 A1 | 6/2013 | Barton et al. |
| 2013/0158715 A1 | 6/2013 | Barton et al. |
| 2013/0158717 A1 | 6/2013 | Zywicki et al. |
| 2013/0158718 A1 | 6/2013 | Barton et al. |
| 2013/0158720 A1 | 6/2013 | Zywicki et al. |
| 2013/0213952 A1 | 8/2013 | Boutin et al. |
| 2013/0238142 A1 | 9/2013 | Nichols et al. |
| 2013/0245838 A1 | 9/2013 | Zywicki et al. |
| 2013/0261807 A1 | 10/2013 | Zywicki et al. |
| 2014/0062672 A1 | 3/2014 | Gudan et al. |
| 2014/0312131 A1 | 10/2014 | Tousignant et al. |
| 2014/0312696 A1 | 10/2014 | Tousignant et al. |
| 2014/0312697 A1 | 10/2014 | Landry et al. |
| 2015/0001929 A1 | 1/2015 | Juntunen et al. |
| 2015/0001930 A1 | 1/2015 | Juntunen et al. |
| 2015/0002165 A1 | 1/2015 | Juntunen et al. |
| 2015/0115045 A1 | 4/2015 | Tu et al. |
| 2015/0144706 A1 | 5/2015 | Robideau et al. |
| 2015/0145347 A1 | 5/2015 | Kim et al. |
| 2015/0370265 A1 | 12/2015 | Ren et al. |
| 2017/0192061 A1 | 7/2017 | Park |
| 2017/0235291 A1 | 8/2017 | Foslien et al. |

FOREIGN PATENT DOCUMENTS

| | | |
|---|---|---|
| EP | 0070414 A1 | 1/1983 |
| EP | 0434926 B1 | 8/1995 |
| EP | 0678204 B1 | 3/2000 |
| EP | 0985994 A1 | 3/2000 |
| EP | 1033641 A1 | 9/2000 |
| EP | 1143232 A1 | 10/2001 |
| EP | 1074009 B1 | 3/2002 |

(56) References Cited

FOREIGN PATENT DOCUMENTS

| | | | |
|---|---|---|---|
| EP | 2138919 A1 | 12/2009 | |
| FR | 2491692 A1 | 4/1982 | |
| FR | 2711230 A1 | 4/1995 | |
| WO | 9711448 A1 | 3/1997 | |
| WO | 9739392 A1 | 10/1997 | |
| WO | 0043870 A2 | 7/2000 | |
| WO | 0152515 A1 | 7/2001 | |
| WO | 0179952 A1 | 10/2001 | |
| WO | 0223744 A2 | 3/2002 | |
| WO | 2010021700 A1 | 2/2010 | |

OTHER PUBLICATIONS

METASYS, "HVAC PRO for Windows User's Manual," 308 pages, 1998.
Mounting Template for Ritetemp Thermostat 8082, 1 page, 2002.
OMRON Electronic Components, LLC, "Micro Tilt Sensor D6B," Cat. No. B02WAD1, 2 pages, Jun. 2002.
OMRON Electronic Components, LLC, "Micro Tilt Sensor D6B," Cat. No. JB301-E3-01, 6 pages, Mar. 2005.
Operation Manual for Ritetemp Touch Screen Thermostat 8082, 8 pages, 2002.
PG&E, "SmartAC Thermostat Programming Web Site Guide," 2 pages, prior to Sep. 7, 2011.
Proliphix, "Web Enabled IP Thermostats, Intelligent HVAC Control," Proliphix Inc., 2 pages, on or before Aug. 28, 2004.
Proliphix, "Web Enabled IP Thermostats, Ultimate in Energy Efficiency!," Proliphix Inc., 2 pages, on or before Aug. 28, 2004.
Proliphix, Inc., "NT10e & NT20e," 54 pages, on or before Aug. 30, 2005.
Quick Start Guide for Ritetemp Thermostat 8082, 1 page, 2002.
Remote Control Power Requirement for Ritetemp Thermostat 8082, 1 page, 2002.
Ritetemp Operation 8029, 3 pages, Jun. 19, 2002.
Ritetemp Operation 8050, 5 pages, Jun. 26, 2002.
Ritetemp Operation 8085, pp. 1-6, prior to Apr. 21, 2005.
Saravanan et al, "Reconfigurable Wireless Interface for Networking Sensors," IJCSNS International Journal of Computer Science and Network Security, vol. 8 No. 7, pp. 270-276. Revised Jul. 20, 2008.
Screenshot of http://lagotek.com/index.html?currentSection=TouchIt, Lagotek, 1 page, prior to Mar. 29, 2012.
Sealed Unit Parts Co., Inc., Supco & CTC Thermostats . . . loaded with features, designed for value!, 6 pages, prior to Apr. 21, 2005.
Sharp Corporation, "GP1S036HEZ Phototransistor Output, Transmissive Photointerrupter with Tilt Direction (4-Direction) Detecting," pp. 1-11, Oct. 3, 2005.
Totaline Model P474-1035 Owner's Manual Programmable 5-2 Day Digital Thermostat, pp. 1-21, Apr. 2003.
Totaline Star CPE230RF, Commercial Programmable Thermostat Wireless Transmitter, Owner's Manual, pp. 1-16, Oct. 1998.
Totaline Star P/N P474-0130 Non-Programmable Digital Thermostat Owner's Manual, pp. 1-22, prior to Apr. 21, 2005.
Totaline, "1 For All Programmable Digital Thermostat," Owner's Manual P/N P374-1100, 24 pages, Apr. 2001.
Totaline, "1 For All Programmable Digital Thermostat," Owner's Manual P/N P374-1100FM, 23 pages, Nov. 1998.
Totaline, "1 For All Programmable Digital Thermostat," Owner's Manual P/N P474-1050, 21 pages, Nov. 1998.
Totaline, 2001. "Intellistat Combination Temperature and Humidity Control," Owner's Manual P/N P374-1600, 25 pages, Jun. 2001.
Totaline, "P/N P374-0431 Thermostat Remote Control and Receiver," Owner's Manual, 11 pages, prior to Nov. 30, 2007.
Totaline, "P474-1100RF, P474-1100REC Wireless Thermostat," 1 page, prior to Nov. 30, 2007.
Totaline, "Programmable Thermostat Configurable for Advanced Heat Pump or Dual Fuel Operation," Owner's Manual P/N P374-1500, 24 pages, Jun. 1999.

Totaline, "Wireless Remote Sensor, Model P474-0401-1RF/REC," 2 pages, prior to Nov. 30, 2007.
Totaline, "Instructions P/N P474-1010", Manual, 2 pages, Dec. 1998.
Totaline, "Programmable Thermostat", Homeowner's Guide, 27 pages, Dec. 1998.
Totaline, "Wireless Programmable Digital Thermostat," Owner's Manual 474-1100RF, 22 pages, 2000.
Trane, "System Programming, Tracer Summit Version 14, BMTVV-SVP01D-EN," 623 pages, 2002.
Trane, "Wireless Zone Sensor. Where Will Wireless Technology Take You?," 4 pages, Feb. 2006.
Travis Industries, Remote Fireplace Thermostat, Part #99300651, 6 pages, printed Feb. 3, 2003.
Trouble Shooting Guide for Ritetemp Thermostat 8082, 1 page, 2002.
Visor Handheld User Guide, 280 pages, Copyright 1999-2000.
Warmly Yours, "Model TH111GFCI-P (120 VAC)," Manual, pp. 1-4, prior to Jul. 7, 2004.
White-Rodgers 1F80-224 Programmable Electronic Digital Thermostat, Installation and Operation Instructions, 8 pages, prior to Apr. 21, 2005.
White-Rodgers Comfort-Set III Thermostat, pp. 1-44, prior to Jul. 7, 2004.
White-Rodgers Installation Instructions for Heating & Air Conditioning IF78 5/2 Day Programmable Thermostat, 7 pages, prior to Jul. 7, 2004.
White-Rodgers Installation Instructions for Heating & Air Conditioning IF78 Non-Programmable Thermostat, 6 pages, prior to Apr. 21, 2005.
White-Rodgers, "Installation Instructions for Heating & Air Conditioning IF72 5/2 Day Programmable Heat Pump Thermostat," 8 pages, prior to Jul. 7, 2004.
White-Rodgers, "Comfort-Set 90 Series Thermostat," Manual, pp. 1-24, prior to Jul. 7, 2004.
White-Rodgers, 1F80-240 "(for Heating Only systems) Programmable Electronic Digital Thermostat," Installation and Operation Instructions, 8 pages, prior to Jul. 7, 2004.
White-Rodgers, 1F80-241 "Programmable Electronic Digital Thermostat," Installation and Operation Instructions, 6 pages, prior to Jul. 7, 2004.
White-Rodgers, 1F80-261 "Programmable Electronic Digital Thermostat," Installation and Operation Instructions, 8 pages, prior to Jul. 7, 2004.
White-Rodgers, 1F81-261 "Programmable Electronic Digital Multi-Stage Thermostat," Installation and Operation Instructions, 8 pages, prior to Jul. 7, 2004.
White-Rodgers, 1F82-261 "Programmable Electronic Digital Heat Pump Thermostat," Installation and Operation Instructions, 8 pages, prior to Jul. 7, 2004.
"RCS X10 Thermostat Plug-in for HomeSeer Beta Version 2.0. 105," 25 pages, prior to Sep. 7, 2011.
"CorAccess Systems/In Home," http://web.archive.org/web20011212084427/www.coraccess.com/home.html, 1 page, copyright 2001, printed Aug. 19, 2004.
"HAI Company Background," http://www.homeauto.com/AboutHAI/abouthai_main.htm, 2 pages, printed Aug. 19, 2004.
"High-tech options take hold in new homes—200-08-28—Dallas Business Journal," http://bizjournals.com/dallas/stories/2000/08/28/focus4, 3 pages, dated Aug. 28, 2000, printed Aug. 19, 2004.
"Home Toys Review—Touch Linc", http://www.hometoys.com/htinews/aug99/reviews/touchlinc/touchlinc.htm, 3 pages, dated Aug. 1999, printed Aug. 20, 2004.
"HTI News Release," http://www.hometoys.com/htinews/apr99/releases/ha101.htm, 3 pages, Apr. 1999.
"Mark of Excellence Award Finalist Announced," http://64.233.167.104/search?Q=cache:ciOA2YtYaBIJ:www.hometoys.com/releases/mar . . . , 6 pages, Leopard Touchscreen on p. 2, dated prior to Mar. 4, 2000, printed Aug. 20, 2004.
"Product Review—Philips Pronto Remote Control," http://hometheaterhifi.com/volume_6_2/philipsprontoremotecontrol.html, 5 pages, dated May 1999, printed Aug. 20, 2004.

(56) References Cited

OTHER PUBLICATIONS

"RC X10 Automation Forum: Control your Heating and Cooling System with Pronto(1/1)," http://www.remotecentral.com/cgi-bin/mboard/rc-x10/thread.cgi?12, 2 pages, dated Apr. 23, 1999, printed Aug. 20, 2004.
"Spotlight on integrated systems," Custom Builder, vol. 8, No. 2, p. 66(6), Mar.-Apr. 1993.
"Vantage Expands Controls for Audio/Video, HVAC and Security," http://www.hometoys.com/htinews/aug99/releases/vantage03.htm, 2 pages, dated Aug. 3, 1999, printed Aug. 20, 2004.
ADI, "Leopard User Manual," 93 pages, 2001.
Adicon 2500, "The Automator," 4 pages, Oct.-Dec. 2000.
ADT Security Services, "iCenter Advanced User Interface 8142ADT," Installation and Setup Guide, 4 pages, May 2001; First Sale Feb. 2001.
AED Electronics, Inc., "Presenting Climatouch the Most Innovative Thermostat in the World!," 2 pages, prior to Nov. 30, 2007.
Andrews et al., "Clicky: User-Centric Input for Active Spaces," 17 pages, Aug. 2004.
Aprilaire Electronic Thermostats Models 8344, 8346, 8348, 8363, 8365, 8366 Operating Instructions, 8 pages, 2003.
Aube Technologies, Electronic Thermostat for Heating System Model TH135-01, 5 pages, Aug. 14, 2001.
Aube Technologies, TH140-28 Electronic Programmable Thermostat, Installation Instructions and User Guide, pp. 1-4, Jan. 22, 2004.
AutomatedBuildings.com Article—"Thin Client" Solutions, "Pressure, Air Flow, Temperature, Humidity & Valves," Dwyer Instruments, Inc., 5 pages, printed Sep. 20, 2004.
Blake et al., "Seng 310 Final Project Demo Program" Illustration, 3 pages, Apr. 6, 2001.
Blake et al., "Seng 310 Final Project" Report, dated Apr. 6, 2001.
Blister Pack Insert from a Ritetemp 8082 Touch Screen Thermostat Product, 2 pages, 2002.
Braeburn Model 3000 Owner's Manual, pp. 1-13, 2001.
Braeburn Model 5000 Owner's Manual, pp. 1-17, 2001.
BRK Electronics Maximum Protection Plus Ultimate Convenience Smoke Alarm, 24 pages, Sep. 2000.
BRK First Alert, User's Manual, Smoke and Fire Alarms, pp. 1-7, Nov. 2002.
Business Wire, "MicroTouch Specialty Products Group to Capitalize on Growing Market for Low-Cost Digital Matrix Touchscreens," p. 1174 (2 pages), Jan. 6, 1999.
Cardio Manual, available at http://www.secant.ca/En/Documentation/Cardio2é-Manual.pdf, Cardio Home Automation Inc., 55 pages, printed Sep. 28, 2004.
Cardio, by Secant; http://www.hometoys.com/htinews/apr98/reviews/cardio.htm, "HTINews Review," Feb. 1998, 5 pages, printed Sep. 14, 2004.
Carrier Microelectronic Programmable Thermostat Owner's Manual, pp. 1-24, May 1994.
Carrier TSTATCCRF01 Programmable Digital Thermostat, pp. 1-21, prior to Apr. 21, 2005.
Carrier, "Edge Performance Programmable Owner's Manual," 64 pages, 2007.
carrier, "Programmable Dual Fuel Thermostats," Installation, Start-Up & Operating Instructions, pp. 1-12, Oct. 1998.
Carrier, "Programmable Thermostats," Installation, Start-Up & Operating Instructions, pp. 1-16, Sep. 1998.
Carrier, "Standard Programmable Thermostat," Homeowner's Manual, pp. 1-8 pages, 1998.
Carrier, "Thermidistat Control," Installation, Start-Up, and Operating Instructions, pp. 1-12, Aug. 1999.
Carrier, "Comfort Programmable Owner's Manual," Carrier Touch-N-Go, Catalog No: 0M-TCPHP-4CA 60 pages, 2010.
Climatouch, User Manual, Climatouch CT03TSB Thermostat, Climatouch CT03TSHB Thermostat with Humidity Control, Outdoor UHF Temperature Transmitter 217S31, 19 pages, Printed Sep. 15, 2004.
CorAccess, "Companion 6," User Guide, pp. 1-20, Jun. 17, 2002.

Danfoss RT51/51RF & RT52/52RF User Instructions, 2 pages, Jun. 2004.
DeKoven et al., "Designing Collaboration in Consumer Products," 2 pages, 2001.
DeKoven et al., "Measuring Task Models in Designing Intelligent Products," 2 pages, Jan. 13-16, 2002.
DESA Heating Products, "Wireless Hand-Held Remote Control Sets Models (C) GHRCB and (C)GHRCTB, Operating Instructions," 4 pages, May 2003.
Domotique Secant Home Automation—Web Page, available at http://www.secant.ca/En/Company/Default.asp, 1 page, printed Sep. 28, 2004.
Emme Core User Guide, Version 1.1, 47 pages, Jan. 2011.
Firex Smoke Alarm, Ionization Models AD, ADC Photoelectric Model Pad, 4 pages, prior to Apr. 21, 2005.
Fluke, "561 HVAC Pro" Infrared Thermometer User's Manual, 22 pages, Downloaded May 24, 2012.
Freudenthal et al., "Communicating Extensive Smart Home Functionality to Users of All Ages: the Design of a Mixed-Initiative Multimodal Thermostat-Interface," pp. 34-39, Mar. 12-13, 2001.
Gentex Corporation, HD135, 135° Fixed Temperature Heat Detector AC Pwered, 120V, 60Hz With Battery Backup, Installation Instructions—Owner's Information, pp. 1-5, Jun. 1, 1998.
International Search Report for Corresponding Application No. PCT/US2014/044229, dated Oct. 13, 2014.
Centex Corporation, 9000 Series, Photoelectric Type Single Station/Multi-Station Smoke Alarms AC Powered With Battery Backup, Installation Instructions—Owner's Information, pp. 9-1 to 9-6, Jan. 1, 1993.
Harris et al., "Optimizing Memory Transactions," Microsoft Research Havard University, 12 pages, May 25, 2012.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.
Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell News Release, "Honeywell's New Sysnet Facilities Integration System For Boiler Plant and Combustion Safety Processes," 4 pages, Dec. 15, 1995.
Honeywell T8002 Programmable Thermostat, Installation Instructions, pp. 1-8, 2002.
Honeywell 1995. T8602A,B,C,D and TS8602A,C Chronotherm III Fuel Saver Thermostats, Installation Instructions, pp. 1-12.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, "Excel Building Supervisor-Integrated R7044 and FS90 Ver. 2.0," Operator Manual, 70 pages, Apr. 1995.
Honeywell, "Installation Guide: Wireless Entry/Exit Remote," 12 pages, 2011.
Honeywell, "Introduction of the S7350A Honeywell WebPAD Information Appliance," Home and Building Control Bulletin, 2 pages, Aug. 29, 2000; Picture of WebPad Device with touch screen, 1 Page; and screen shots of WebPad Device, 4 pages.
Honeywell, "RedLINK™ Wireless Comfort Systems," RedLINK Wireless Technology, 8 pages, Aug. 2011.
Honeywell, "Total Connect Online Help Guide," Revision A, 800-02577-TC, Mar. 2010.
Honeywell, "Total Connect User Guide," Revision B, 34 pages, May 15, 2012.
Honeywell, "VisionPRO® 8000 Thermostats," downloaded from http://yourhome.honeywell.com, 2 pages, May 24, 2012.
Honeywell, "W7006A Home Controller Gateway User Guide," 31 pages, Jul. 2001.
Honeywell, MagicStat® CT3200 Programmable Thermostat, Installation and Programming Instructions, pp. 1-24, 2001.

(56) References Cited

OTHER PUBLICATIONS

Honeywell, Wireless Entry/Exit Remote, Operating Manual, 9 pages, 2011.
http://hunter-thermostats.com/hunter_programmable_thermostats. html, Hunter Thermostat 44668 Specifications, and 14758 Specifications, 2 pages, Printed Jul. 13, 2011.
http://www.cc.gatech.edu/computing/classes/cs6751_94_fall/group/climate-2/node1.html, "Contents," 53 pages, printed Sep. 20, 2004.
http://www.ritetemp.info/rtMenu_13.html, Rite Temp 8082, 6 pages, printed Jun. 20, 2003.
http://www.thermostatsales.com, Robertshaw, "9610 Digital Programmable Thermostat," 3 pages, printed Jun. 17, 2004.
http://www.thermostatsales.com, Robertshaw, "9700 Deluxe Programmable Thermostat" 3 pages, printed Jun. 17, 2004.
http://www.thermostatsales.com, Robertshaw, "9710 Deluxe Programmable Thermostat," 3 pages, printed Jun. 17, 2004.
http://www.thermostatsales.com, Robertshaw, "9720 Deluxe Programmable Thermostat," 3 pages, printed Jun. 17, 2004.
Hunter, "44200/44250," Owner's Manual, 32 pages, prior to Jul. 7, 2004.
Hunter, "44300/44350," Owner's Manual, 35 pages, prior to Jul. 7, 2004.
Hunter, "Auto Saver 550", Owner's Manual Model 44550, 44 pages, prior to Jul. 7, 2004.
Hunter, "Model 44758 Remote Sensor," Owner's Manual, 2 pages, Revision Sep. 4, 2008.
Install Guide for Ritetemp Thermostat 8082, 6 pages, 2002.
Invensys™, "9700i 9701i 9715i 9720i Deluxe Programmable Thermostats," User's Manual, pp. 1-28, prior to Jul. 7, 2004.
Inventek, "Inventek Systems, ISM4319-M3X-L44-X Embedded Serial-to-Wi-Fi Module eS-WiFi 802.11 b/g/n Data Sheet",
Inventek, "Inventek Systems, I5M4319-M3X-L44-X Embedded Serial-to-Wi-Fi Module eS-WiFi 802.11 b/g/n Data Sheet", accessed from http://www.inventeksys.com/wp-content/uplo . . . Feb. 6, 2012.
Larsson, "Battery Supervision in Telephone Exchanges," Ericsson Components AB Sweden, 5 pages, Downloaded May 5, 2012.
Lennox, "Network Control Panel (NCP)," User's Manual, 18 pages, Nov. 1999.
Lennox, "Prodigy Control System," Lennox Industries, 4 pages, May 25, 2012.
Logitech, "Harmony 880 Remote User Manual," v. 1, pp. 1-15, prior to Nov. 30, 2007.
Lux ELV1 Programmable Line Voltage Thermostat, Installation Instructions, 3 pages, prior to Jul. 7, 2004.
Lux TX500 Series Smart Temp Electronic Thermostat, 3 pages, prior to Jul. 7, 2004.
Lux TX9000 Installation, 3 pages, prior to Apr. 21, 2005.
Lux, "9000RF Remote Instructions," 2 pages, prior to Nov. 30, 2007.
Lux, "511 Series Smart Temp Electronic Thermostat," Owner's Manual, 3 pages, prior to Jul. 7, 2004.
Lux, "600 Series Smart Temp Electronic Thermostat," Owner's Manual, 3 pages, prior to Jul. 7, 2004.
Lux, "602 Series Multi-Stage Programmable Thermostat," Owner's Manual, 2 pages, prior to Jul. 7, 2004.
Lux, "605/2110 Series Programmable Heat Pump Thermostat," Owner's Manual, 3 pages, prior to Jul. 7, 2004.
Lux, "700/9000 Series Smart Temp Electronic Thermostat," Owner's Manual, 3 pages, prior to Jul. 7, 2004.
Lux, "PSPH521 Series Programmable Heat Pump Thermostat," Owner's Manual, 3 pages, prior to Jul. 7, 2004.
White-Rodgers, Comfort-Set 90 Series Premium, 4 pages, prior to Apr. 21, 2005.
www.icmcontrols.com, Simplecomfort, SC3000 Single Stage Heat/Single Stage Cool or Single Stage Heat Pump/Manual Changeover, 1 page, prior to Jul. 7, 2004.
www.icmcontrols.com, Simplecomfort, SC3001 Single Stage Heat/Single Stage Cool or Single Stage Heat Pump/Manual Changeover, 1 page, prior to Jul. 7, 2004.
www.icmcontrols.com, Simplecomfort, SC3006 Single Stage Heat/Single Stage Cool or Single Stage Heat Pump/Manual Changeover, 1 page, prior to Jul. 7, 2004.
www.icmcontrols.com, Simplecomfort, SC3201 2 Stage Heat Pump Manual Changeover, 1 page, prior to Jul. 7, 2004.
www.icmcontrols.com, Simplecomfort, SC3801 2 Stage Heat/2 Stage Cool 2 Stage Heat Pump/Audio Changeover, 1 page, prior to Jul. 7, 2004.
Cirrus Logic, Inc., "CS1501 Digital Power Factor Correction Control IC," 16 pages, 2012.
U.S. Appl. No. 14/300,232, filed Jun. 9, 2014.
U.S. Appl. No. 14/309,431, filed Jun. 19, 2014.
U.S. Appl. No. 14/309,553, filed Jun. 19, 2014.
U.S. Appl. No. 14/329,357, filed Jul. 11, 2014.
Hendon Semiconductors, "OM1894 Dual Sensing Precision Triac Control," Product Specification, Rev. 2.0, 21 pages, Apr. 19, 2007.
Honeywell, "System Installation Guide: Important Instructions," Honeywell International Inc., 25 pages, 2011.
http://www.dinwlex.com/en/home_heating/linear_convector_baseboards/products/lpc_series/linear_proportional_convector, Dimplex Coporation, "Linear Convector LPC Series," 2 pages, May 2011.
http://www.enernetcorp.com/, Enernet Corporation, "Wireless Temperature Control" 1 page, 2011.
http://www.enernetcorp.com/t9000-wireless-thermostat.html, Enernet Corporation, "T9000 Series Wireless Fan Coil Thermostat," Product Brochure, 2 pages, 2011.
http://www.enocean-alliance.org/en/products/regulvar_rw-ssr347-15a/, Regulvar Corporation, "RW-SSR347-15A, Relais sans fil à semi-conducteurs" 3 pages, Aug. 8, 2009.
http://www.enocean-alliance.org/en/products/regulvar_rw-tp01/, Regulvar Corporation, "RW-TP01, Capteur de température sans fil" 3 pages, Aug. 9, 2009.
http://www.forwardthinking.honeywell.com/products/wireless/focus_pro/focus_pro_feature.html, Honeywell Corporation, "Wireless FocusPRO® pages", 2 pages, 2011.
Signetics Linear Products, "TDA1024 Zero Crossing Triac Trigger," Product Specification, 14 pages, Sep. 1985.
Office Action for Canadian Application No. 2,774,907, dated Nov. 3, 2017.

\* cited by examiner

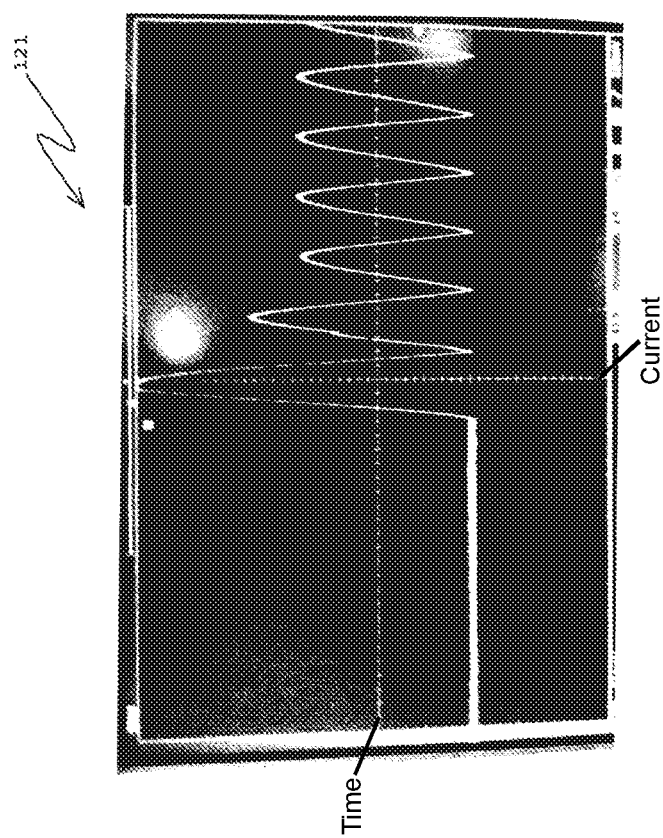

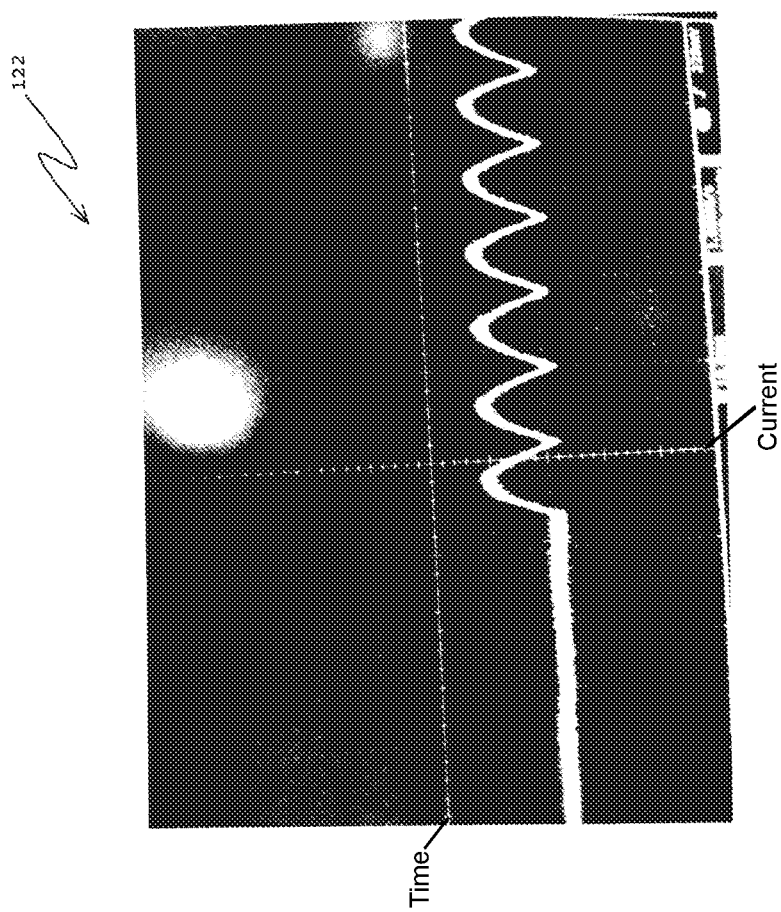

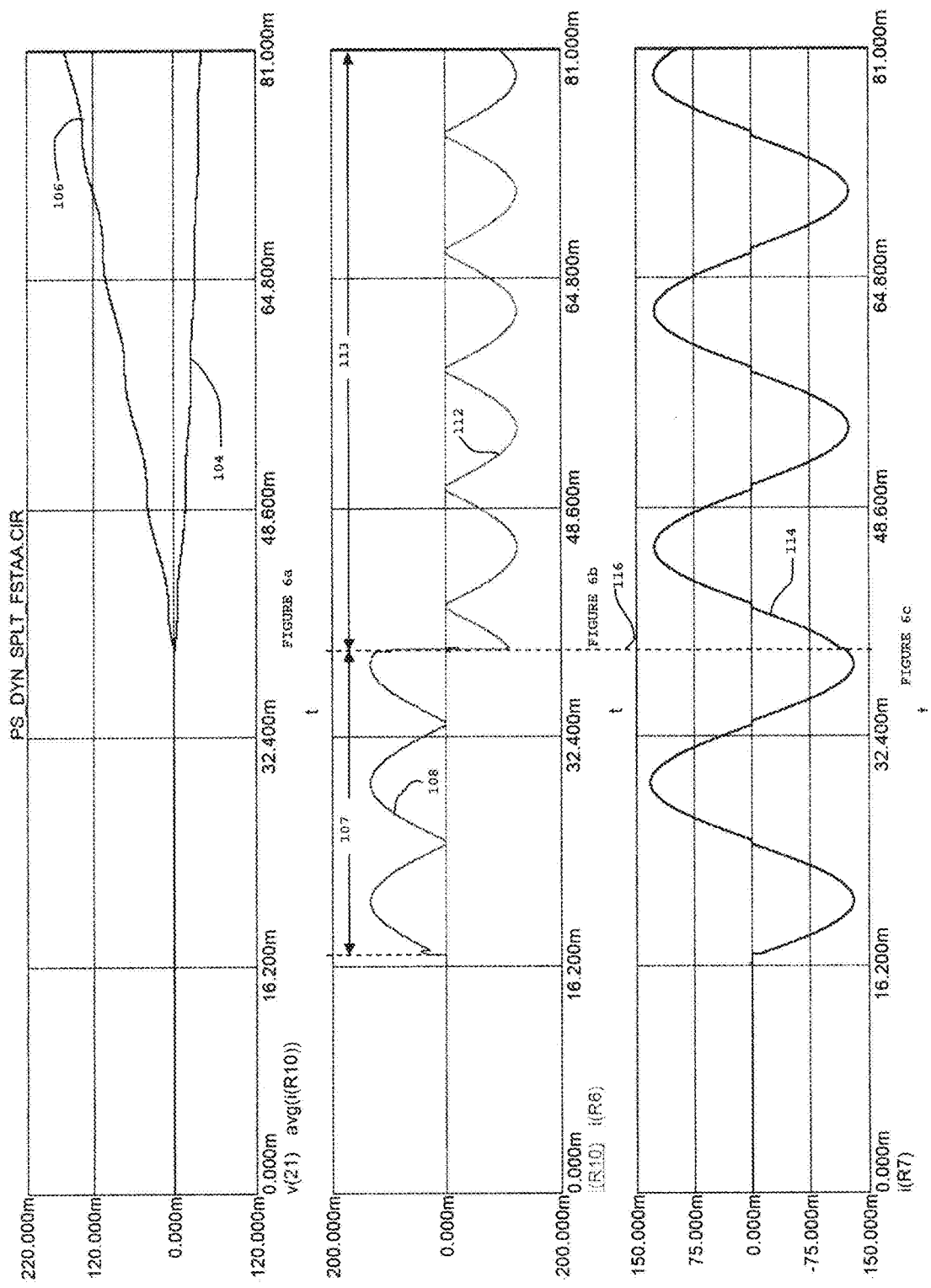

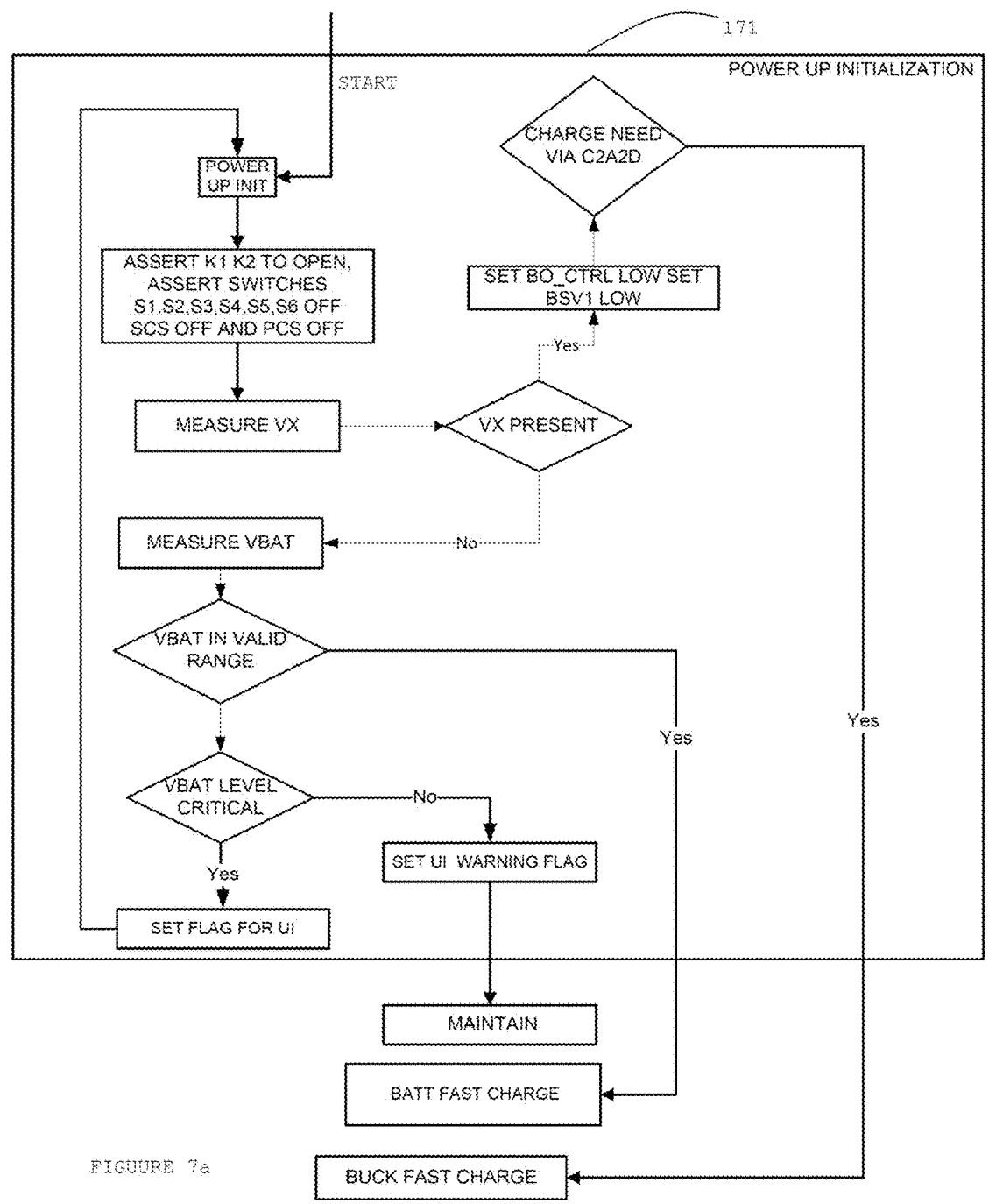
FIGUURE 7a

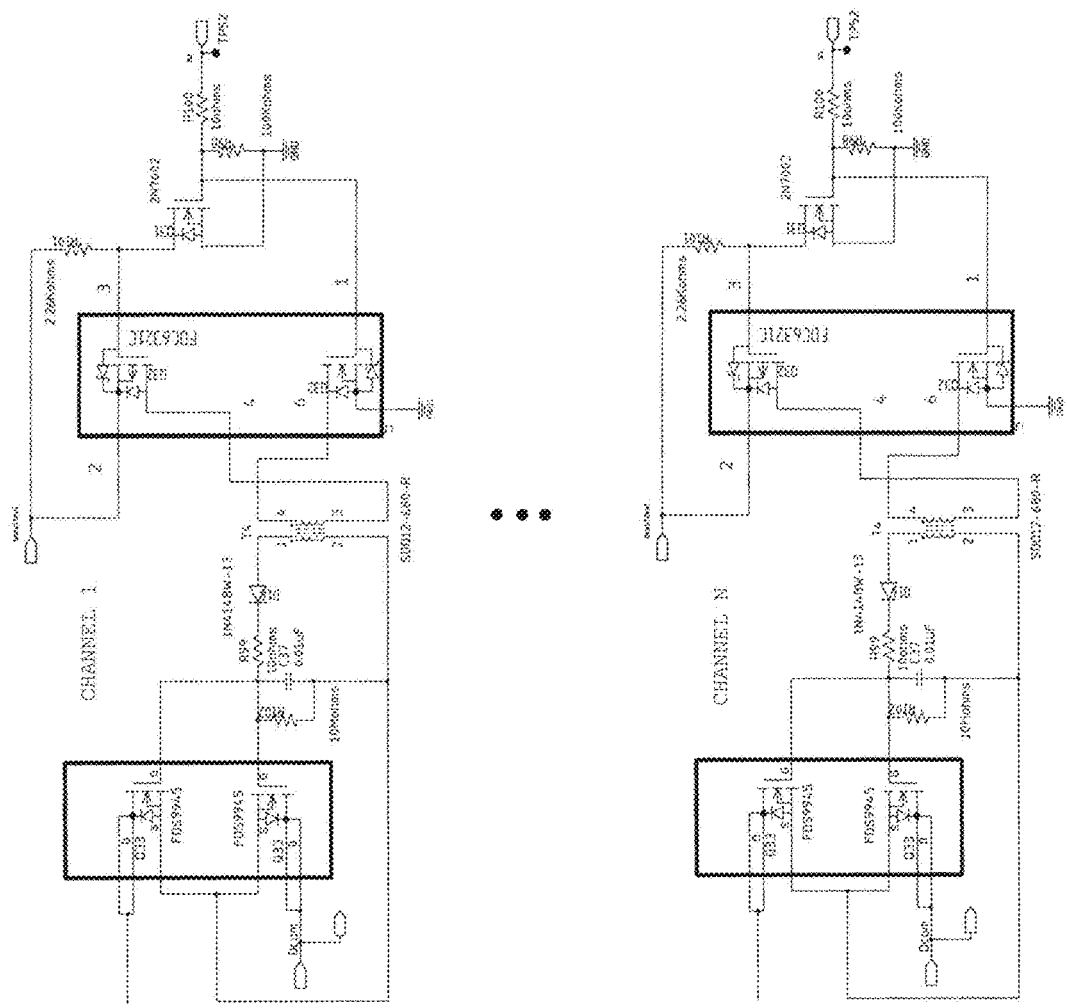

TABLE

| Capacity | Source | Vdd1 | Vdd2 | |
|---|---|---|---|---|
| 0 | B | BATTERY | BATTERY | LOW |
| 1 | B | BOOST1 | BOOST1 | HIGH |
| 2 | B | BATTERY / PT or BATT | BOOST1 | HIGHEST |
| 0 | C | BUCK | BUCK | MORE ↓ |
| 1 | C | BOOST1 | BOOST1 | |
| 2 | C | BUCK | BOOST1 | |

B - BATTERY
C - C WIRE

BSU1
BSU0
Control
Points

FIGURE 13

POWER TRANSFORMATION SYSTEM WITH CHARACTERIZATION

This U.S. application Ser. No. 14/301,175, filed Jun. 10, 2014, claims the benefit of U.S. Provisional Application Ser. No. 61/841,191, filed Jun. 28, 2013.

This application is a continuation-in-part of U.S. application Ser. No. 14/300,232, filed in Jun. 9, 2014, and entitled "A Power Transformation System with Characterization", which claims the benefit of U.S. Provisional Application Ser. No. 61/841,191, filed Jun. 28, 2013, and entitled "A Power Transformation System". U.S. application Ser. No. 14/300,232, filed in Jun. 9, 2014, is hereby incorporated by reference. U.S. Provisional Application Ser. No. 61/841,191, filed Jun. 28, 2013, is hereby incorporated by reference.

This application is a continuation-in-part of U.S. application Ser. No. 14/300,228, filed in Jun. 9, 2014, and entitled "A Power Transformation System", which claims the claims the benefit of U.S. Provisional Application Ser. No. 61/841, 191, filed Jun. 28, 2013, and entitled "A Power Transformation System". U.S. application Ser. No. 14/300,228, filed in Jun. 9, 2014, is hereby incorporated by reference. U.S. Provisional Application Ser. No. 61/841,191, filed Jun. 28, 2013, is hereby incorporated by reference.

This application claims the benefit of U.S. Provisional Application 61/899,427, filed Nov. 4, 2013, and entitled "Methods and Systems for Providing Improved Service for Building Control Systems". U.S. Provisional Application Ser. No. 61/899,427, filed Nov. 4, 2013, is hereby incorporated by reference.

RELATED APPLICATION

U.S. application Ser. No. 13/227,395, filed Sep. 7, 2011, and entitled "HVAC Controller including User Interaction Log", is hereby incorporated by reference.

BACKGROUND

The present disclosure pertains to power supplies for devices and particularly to taking power from the supplies for other devices. The disclosure also pertains to characterization of loads.

SUMMARY

The disclosure reveals a power transformation system having a power stealing mode for powering a device indirectly through an electrical load connected to a power source and also has a characterization mode. The transfer of energy from the power source via the load may go undetected. The system may store energy from the load in an ultra or super capacitor. This energy may be used to power Wi-Fi and various thermostat applications, among other things, associated with HVAC and building automation and management systems. Energy from the load may be supplemented or substituted with energy from a battery and/or a buck converter. In the characterization mode, the system may obtain data relative to power usage of a load and determine a profile to identify one or more components and their operating conditions.

BRIEF DESCRIPTION OF THE DRAWING

FIG. 2 is a diagram of a waveform indicating an inductive load;
FIG. 3 is a diagram of a waveform indicating a resistive load;
FIGS. 6a, 6b and 6c are diagrams of waveforms of various aspects of the power transformation circuit;
and
FIGS. 7a, 7b, 7c, 7d, 7e, 7f and 7g are diagrams of activities of certain portions of the power transformation circuits in FIGS. 1a-1c;
and
FIGS. 8a, 8b, 9a-9c, 10a-10c, 11a-11c and 12a-12b are schematics of an illustrative example of the present power transformation circuit
FIG. 13 is a diagram of combinations of capacities and sources;
FIG. 18 is a diagram of a graph where a fixture's process when it is in an off state, when the thermostat call for heat, and when the flame sense is not turned on.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

A powering of devices not connected directly to a power source return except through electrical loads may be regarded as a power transformation (PT) system. The present power transformation system may have advantages over systems having ordinary or related-art power techniques. For instance, the system may have a particular use in thermostat applications over relatively large dynamic load currents ranging from 100 uA to 1 A with a low AC voltage applied. Thermostats utilizing power obtained in the present manner may be a part of a heating, ventilation and air conditioning (HVAC) mechanism and/or a building automation system. Power transformation may be utilized in other components of the building automation system.

Figure 1A:
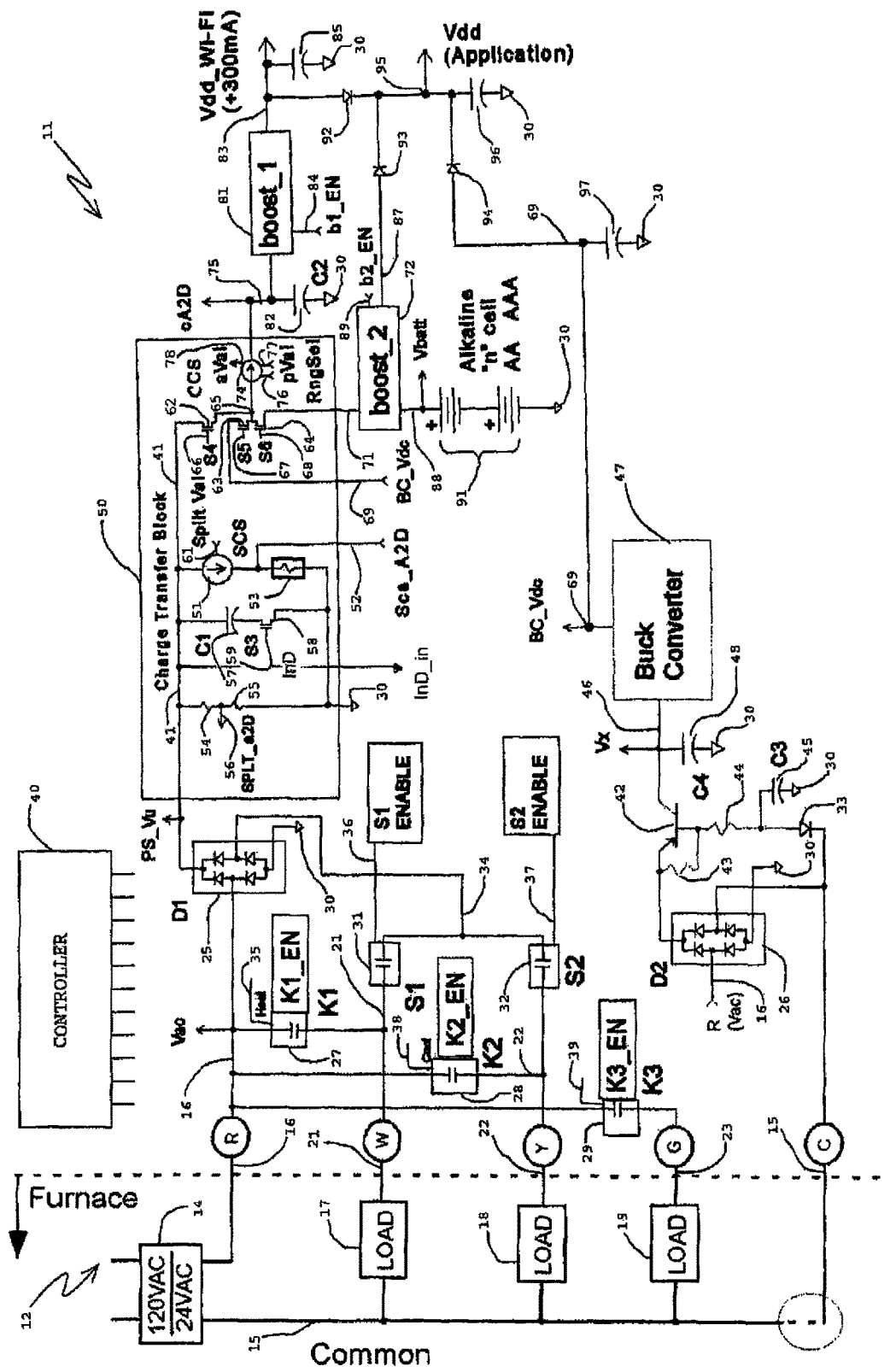
FIG. 1a is a diagram of a power transformation circuit.

FIG. 1a is a diagram of a power transformation circuit 11. Circuit 11 may provide a way to charge an internal energy storage device, for instance, a capacitor 82, in a continuous, pulsed or pseudo continuous manner. This behavior may occur in functional states of a load (17 or 18) having an "off" condition or an "on" condition. Energy may be delivered to a pre-storage device in a continuous manner relative to the impressed AC voltage. Related art systems may interrupt the load current to charge, i.e., to redirect the current into storage elements.

Since the present energy transfer approach, mechanism or block 50 may be continuous, no frequency or time dependency will necessarily exist as to when to divert the load current. Because the energy transfer is continuous, the overall currents may be much smaller than related-art power techniques. For example, a 16 mA pulse current for 1 m sec may essentially be the same as 1 mA taking over one entire line cycle at 60 Hz. The present approach may dramatically lower the probability of falsely tripping loads from an "off" state to an "on" state.

Power transformation topology of circuit 11 may allow energy to be drawn from two or more loads (e.g., loads 17 and 18) in a simultaneous fashion while the loads are in an "off" or "on" state. This may allow for a higher degree of load current to be transformed into a charging current of a harvesting system.

Power transformation may precisely calculate the load impedance as a function independent of applied power frequency. Therefore, a calculation may allow inductive or capacitive loads to be correctly categorized. Power transformation circuit 11 may be particularly interesting when one understands the capability that the transformation circuit 11 topology offers relative to the amount of energy that the circuit can transform into useable charging current. The topology may engage the load over a wide dynamic range (per application), transfer control of the AC load current to a programmable current source 51 while determining the load current directly. Subsequently, the system may transfer virtually all or portions of that current to a storage device 82 via a secondary charging current source (CCS) 74.

A secondary charging element may be chosen for a level arbitrarily or specifically. Charging currents are not necessarily inherently bound with the present topology. For instance, a value of 200 mA may allow for a satisfactory user experience.

The approach to balance the two programmable current sources 51 and 74 may also have a desired effect in that the current through the load is not necessarily altered other than having a minor loss of current due to an insertion of an applied voltage drop of power transformation circuit 11.

The present system may be in a particular class of power devices since charging currents at different levels up to 200 mA can be realized. Charging rates may be controlled by the system. A design of a secondary charging element may be artificially bound to a maximal level to protect the storage element.

As power transformation circuit 11 passes the entire load current from an internal activation switch to a saturated current source 51, power transformation device or charge transfer block 50 may need only to measure the current through current source 51, and calculate the effective impedance of the load via Ohm's law. A direct measurement may allow the device to set an "off" load condition that will not necessarily cause false load tripping. A direct determination may eliminate "trial" test current approaches or fixed approaches as known with related art systems. Current through source 51 may be determined by measuring the voltage drop across a 2.1 ohm resistor 53. Resistor 53 may be of another value. Resistor 53 may have a different value or an amplifier on line 52 for a gain change.

Inductive relay loads may be known to exhibit a high degree of inrush current when they are activated. The inrush may occur during times when a physical armature in a load 17 or 18 is moving or is about to move. Over a life and application usage, the inrush component may increase. The effect may be dramatic when debris has become lodged in the device. It is not necessarily wise to limit such current in any manner since the device will not necessarily reach a satisfactory "on" state, or the device may chatter and ultimately lead to having contact failure or equipment stress. For this reason, the power transformation topology may use a parallel switch structure (i.e., switches 27 and 31 for load 17 and switches 28 and 32 for load 18) which is firstly engaged to power the loads.

The power transformation topology may determine whether the system is connected to an inductive load (e.g., with a moveable armature) with several approaches. A determination may be important for setting the optimal value for an "off" state energy transformation. Independent of the inrush, the steady state AC current of a contactor relay load may be different when activated or not activated. The power transformation topology may have several mechanisms to deal with the discrepancy in order to increase the fidelity of charge rates. A measure of inductive impedance may be used to provide a steady state compensation value against for an off cycle approach.

One mechanism is that a direct impedance calculation may be made when the relay is in an "on" state. When a device sets the "off" mode power transformation level, the device may test the desired voltage drop which actually occurred across the load. If the resultant drop is more than expected, then this means that an inductive load with an armature may certainly be present provided that the VAC is monitored and compensated for. The present power transformation system may easily compensate for the impedance difference.

Another mechanism may be able to derive that the armature has moved, by detection of a sudden impedance change through plausibility testing or "direct observation" via characterization. Either of these techniques may be invoked after determining if the split current source (SCS) has enough dynamic range to overcome the inrush of the contactor; otherwise, reliability of the system may be compromised.

As to a first option, it may be possible to increment the first current source while observing the resultant current value. When one of the increments results in a slope inflection outside of what was previous predicted by past incremental changes, there may be an implication that an armature has been moved by a sudden impedance change. Otherwise, there may be a linear response depending on step size.

As to a second option, it may also be possible to apply the first current source at a maximal current level (saturated) and perform a fast A2D process on that resultant current wave form, allowing the capture of step changes that may have occurred in its response, as caused by an armature moving, which may be a form of load characterization. FIGS. 2 and 3 are waveform diagrams that may illustrate the current waveform at an SCS_a2d (i.e., a connection between SCS 51 and resistor 53). The waveform diagram 121 of FIG. 2 may illustrate a case for an inductive load with armature movement shown. The waveform diagram 122 of FIG. 3 may demonstrate a case of a resistive load.

The waveforms of FIGS. 2 and 3 may illustrate that increasing the amount of charging current that a relay load can manage prior to pull in may be optimally achieved with the load in an "off" state, since a primary technique of a direct impedance calculation at running load may result in an impedance lower than what exists in the "off" state of the load. The measurement obtained with the direct impedance calculation may be safe from the perspective on being conservative so as not to cause false activation of loads.

An internal parasitic nature capacitance loading may cause losses in what can be transformed to energy storage. A loss may occur when a rectified voltage is impressed across a capacitor (for instance, capacitor 57). (FIG. 1c.) An example value of capacitor 57 may be 47 microfarads. The charging ripple current may be wasted back to a load as it cannot necessarily be converted to a charging current. One the other hand, the capacitance may help to balance the current though the secondary current source which aids an "on" cycle mode. Power transformation circuit 11 may utilize a FET 58 with a gate 59 control to introduce bulk capacitance when it is beneficial and eliminate the bulk capacitance when it is detrimental.

An approach may be utilized to determine load impedance. Impedance information may be used in a following manner. One may select a continuous (or pulsed) off cycle power level per terminal. That level should not exceed levels of a typical electronic interface logic circuit consistent with TTL, CMOS, or other logic.

Split dynamic power transformation may allow energy to be harvested off a power line 16 when a load 17 or 18 is energized by the power line. A load of interest may be firstly selected by activating switch 31 or 32 (S1 or S2). Power transformation circuit 11 may then capture an A2D value on a Split_A2D at a connection point 56 of series connected resistors 54 and 55 forming a voltage divider between a rectifier output voltage line 41 and output reference line 30. The readings may have important information relative to the power transformation device.

One may determine if a load is connected to terminal 56 for Split_A2D, and provide directional information about the magnitude of the applied voltage, VAC, as indicated by voltage divider point 56 between resistors 54 and 55 and a load 17 and/or 18, except for some diode voltage drop in full-wave rectifier 25 (D1). The internal voltage divider impedance may be chosen to be at least two orders of magnitude higher than useful load values. The internal impedance values may be, for instance, 205K ohms and 14.7K ohms, as compared to loads in which useful energy can be derived may be from 10 to 2K ohms at 60 Hertz. One may see from an inspection that the load impedance does not necessarily significantly alter a present view point of VAC based on an authority of an external network. The diode network influence of rectifier 25 may provide or need some compensation as the current through the network is bound and dominated by an internal resistor network. System 11 may indicate a power transformation error if the value returned indicates that the load is too high or the VAC is too low.

A load of interest may be completely energized by a parallel load control device 27 and/or 28 (K1 and/or K2). SCS 51 may be configured to a saturated condition with respect to its drop introduced against load 17 and/or 18. It can be noted that switch 27 and/or 28 (K(n)) may then be deselected and the load current may be transferred to internal SCS 51 in its entirety. All load current may come in and control of it is taken. The value of the current may be determined by a direct reading of SCS_a2d at the connection point of SCS 51 and resistor 53. With this reading (and VAC bound from the reading determined above), for mechanism 131 (FIG. 1c), the impedance of load 17 and/or 18 may be closely estimated using Ohm's law. That may be indicated by the voltage of line 41 as determined by divider combination of resistors 54 and 55 divided or bound above by mechanism 131, by the current indicated by the voltage across resistor 53. That value may be used for an "off" cycle power transformation and the VAC may be recorded and tracked on a periodic basis.

Power transformation may incorporate a special network to speed up the process to transition from the fully saturated condition to a level where the split current source (SCS) 51 comes out of saturation. The behavior of a new circuit, InD, may allow SCS 51 to find the point at which perturbation in a load 17 and/or 18 connected line can occur because of a present configuration relative to a rectified and non-filtered voltage being applied to a current source working with a dc biased op-amp. Op-amp overshoot during the valleys associated with the applied VAC may cause current injection which in-turn can cause line perturbation which directly indicates that the SCS 51 is coming out of saturation. Once this point is determined, the pulse width modulation (PWM) signal to an input 61 of SCS 51 may be increased slightly to stop the firing of the InD and a bulk capacitor may be activated to smooth out the applied voltage presented to SCS 51. SCS 51 may be further eased out of saturation as part of the next step.

The InD circuit may eliminate a need to perform an a2d conversation with stabilization times involved after each incremental value.

A CCS 74 may reside in parallel with the SCS 51. An initial value may be programmed in CCS 74. The SCS 51 circuit may be connected across CCS 74 by activating FET 62 (S4) in a high bias (voltage) mode.

The PWM value to line 61 of SCS 51 may be lowered until SCS 51 comes out of saturation and a value of about a 3.0 VDC drop is achieved across SCS 51 and in turn CCS 74. Therefore, the current through the split current source 51 may be transferred to charging current via CCS 74. Depending on the load, SCS 51 may go to zero or remain active such that the current through load 17 and/or 18 is not necessarily affected other than by an introduction of a drop across the internal network of block 50. The drop may incorporate rectifier (D1) 25. Rectifier 25 may utilize Schottky diodes which result in fewer effects than ordinary non-Schottky diodes. The drop of switch (S4) 62 may be calibrated out. This is via feedback on aVal 78.

FIG. 1c is a diagram of circuit 125 that may be similar to circuit 11 of FIG. 1a. The single S1 switch 31 (FIG. 1a) may be substituted with a two S1' switches 126 and 127 connected by lines 128 and 129, respectively, to an S1' enable. One may note FIG. 12a for an implementation of the other version having one rectifier with many switches, that is, one switch per channel.

At the voltage divider of resistors 54 and 55 with a line 56 at the junction of resistors 54 and 55, a comparator 131 may have a non-inverting input connected to line 56, and an inverting input connected to a voltage reference. An output 132 of comparator 131 may indicate with a binary signal PT_EN (start) whether the voltage at line 56 is below, meets or exceeds the voltage reference. Resistors 54 and 55 may have high resistance with the comparator 131 and thus be quite a low current drain on line 41 of the charge transfer block 50.

Another voltage divider having resistor 133 connected to line 5 and resistor 134 connected to ground 30, with a line 135 connected to a junction of resistors 133 and 134. Line 135 may be connected to a comparator like the arrangement of comparator 131.

Battery 91 may be a single battery or a multitude of them. The battery may be a non-rechargeable or a rechargeable one with appropriate charging circuitry.

Diodes 92, 93 and 94 in circuit 11 may be replaced with FET switches 137, 138 and 139, respectively, in circuit 125. The drain of FET 137 may be connected to line 83, the source may be connected to line 95 of the Vdd output. A control signal may go to an input via a 634 ohm resistor 141 to the gate of FET 137. The gate may be connected to ground 30 via a one meg-ohm resistor 142. The gate may also be connected to a line 69 of an output of buck converter 47, via a 150 kilo-ohm resistor 143, lines 155 and 145 and a zener diode 144. The anode of diode 144 may be connected to line 69.

Values of noted components noted herein are examples but could be other values.

A control signal may go to an input 146 via a 634 ohm resistor to the gate of FET 138. The gate may be connected to line 145 via a 150 kilo-ohm resistor 148. The gate of FET 138 may be connected to a ground 30 via a one-meg-ohm resistor 147. The source may be connected to line 95. The drain may be connected to line 87.

A control signal may go to an input 149 via a resistor 151 to FET 139. The gate may be connected to ground 30 via a resistor 152. The drain may be connected to line 69 and the source may be connected to line 95.

The power transformation approach may incorporate a FET logic control to improve the various modes needed by the application in order to power at least two power rails; VDD and VDD2.

BSV1, BSV0, BO_Ctrl may be configured to be connected to pins of micro controller that are Hi Z at power up B2_en may have an integral pull up such as high (active) any time a battery is installed.

Function split_A2D may be run with a discrete go no-go circuit; in this case, the micro controller pin may read it as a general IO instead of an A2d process.

Figure 1B:
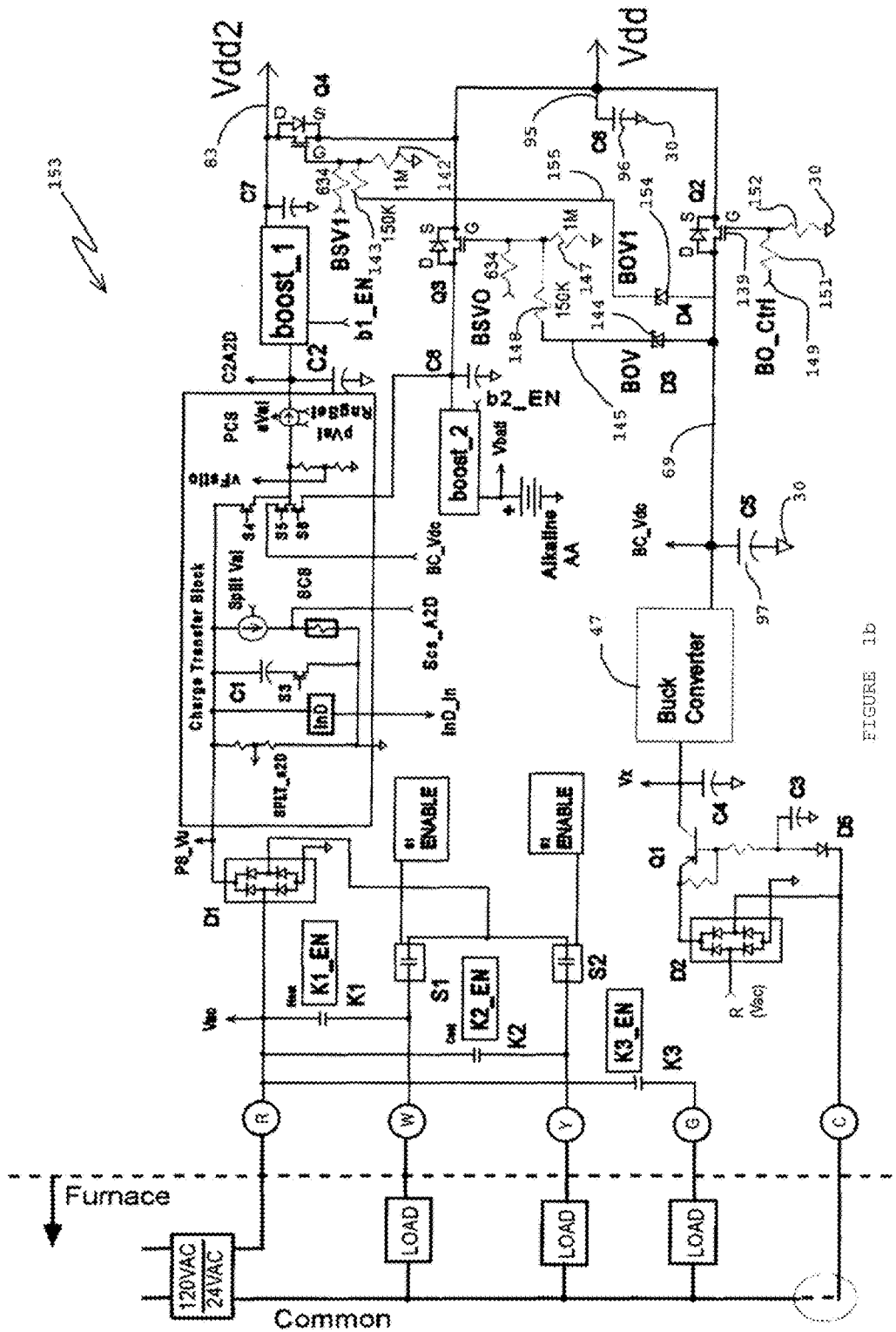
FIG. 1b is a diagram of the power transformation circuit having a different buck converter and battery connection.
Figure 1C:
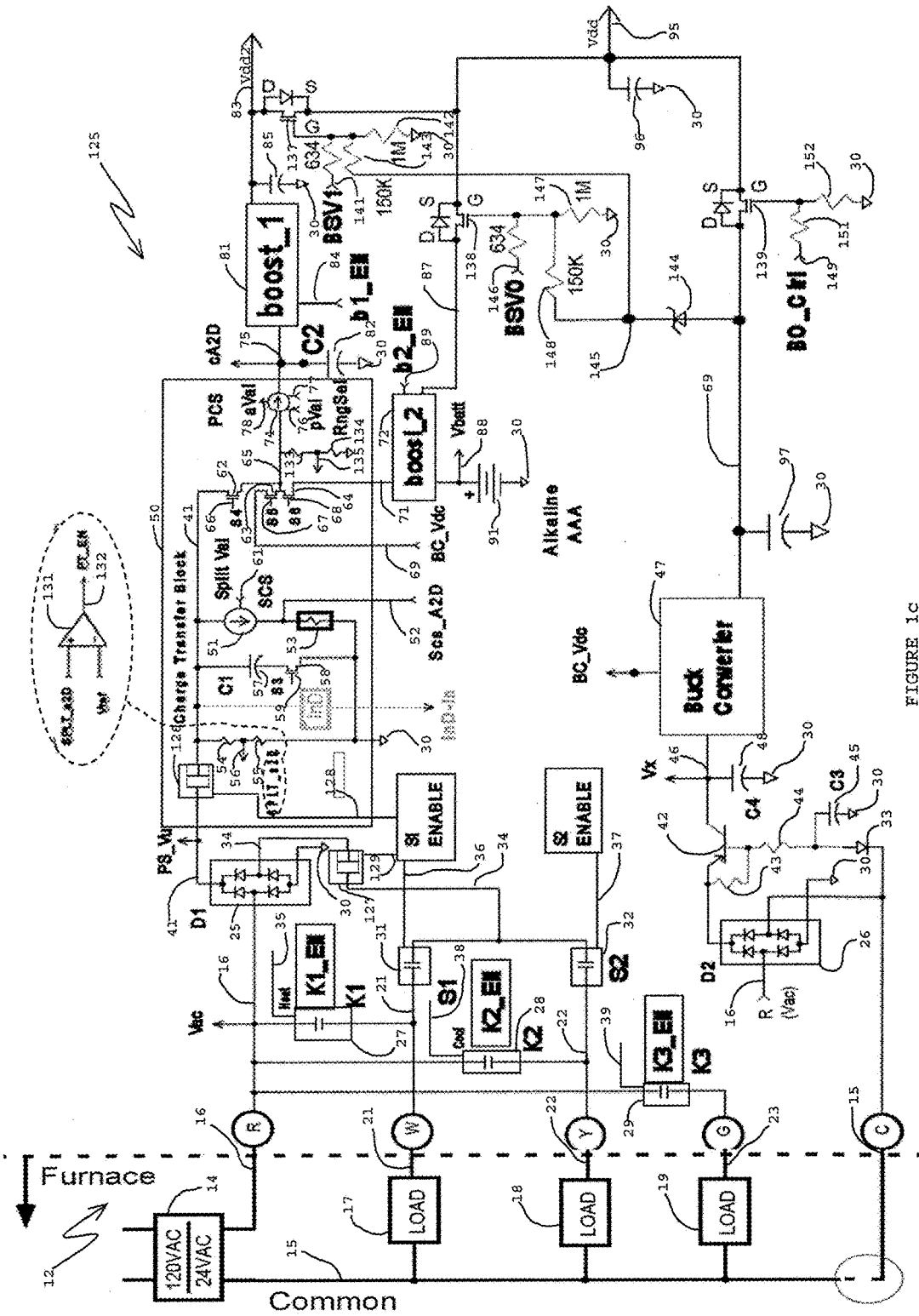
FIG. 1c is a diagram of another version of the power transformation circuit showing a single channel.

FIG. 1*b* is a diagram of a circuit 153 which may be similar to circuit 125 of FIG. 1*c*. Line 155 may be disconnected from line 145 and connected to a cathode of a zener diode 154. An anode of zener diode 154 may be connected to line 69. Many of the unnumbered components of circuit 153 may have the same numerical designations as those components of circuit 125 in FIG. 1*c*. Activation of these signals may be as inputs and/or output and these allow the power modes that are possible.

Figure 1D:
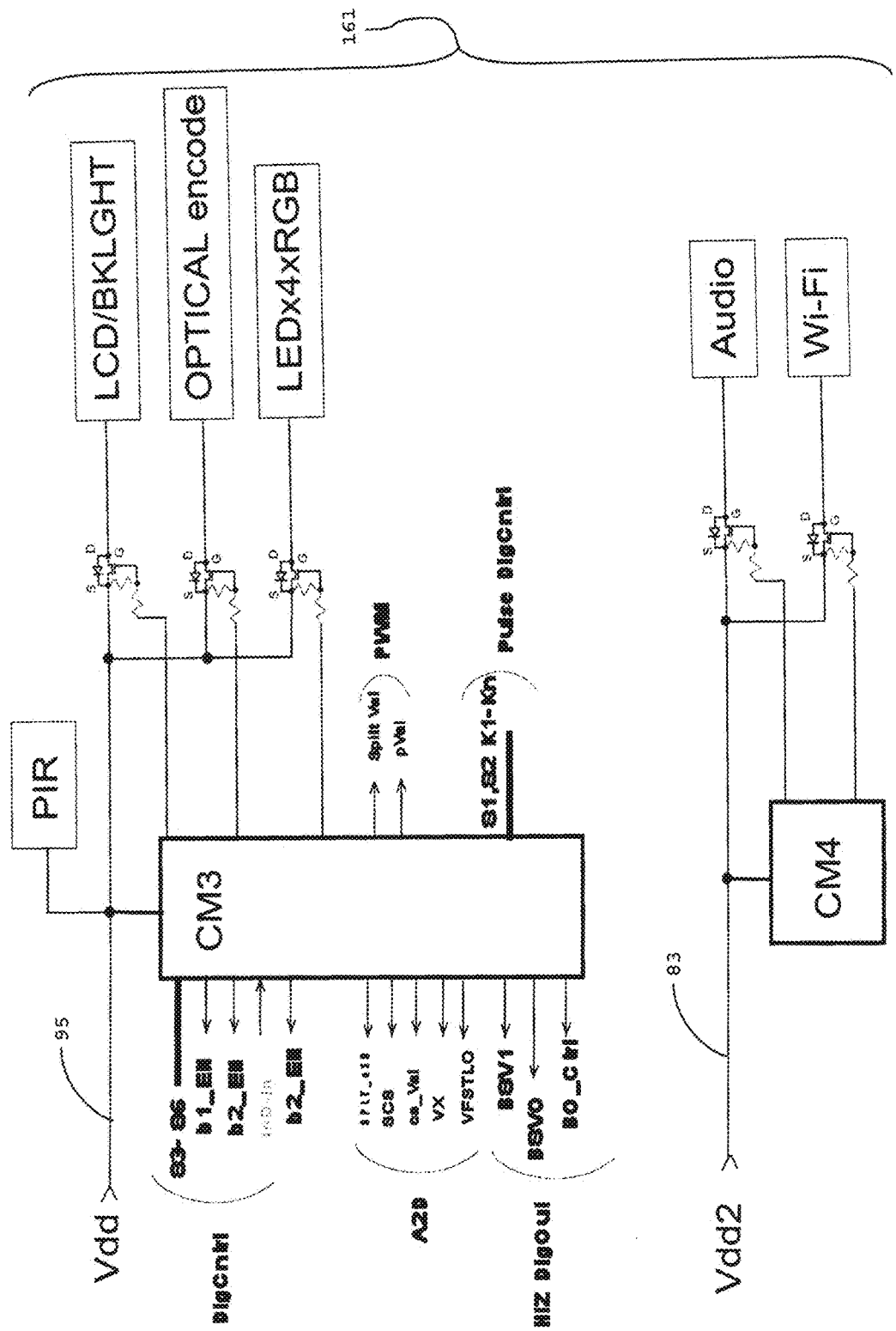
FIG. 1d is a diagram of example loads connected to outputs of the power transformation circuit.

FIG. 1*d* is a diagram of loads 161 that may be connected to output lines 83 and 95 of circuits 11, 153 and 125 in FIGS. 1*a*, 1*b* and 1*c*, respectively. Loads 161 may incorporate some processor control relative to the power transformation circuits 11, 153 and 125.

Figure 4:
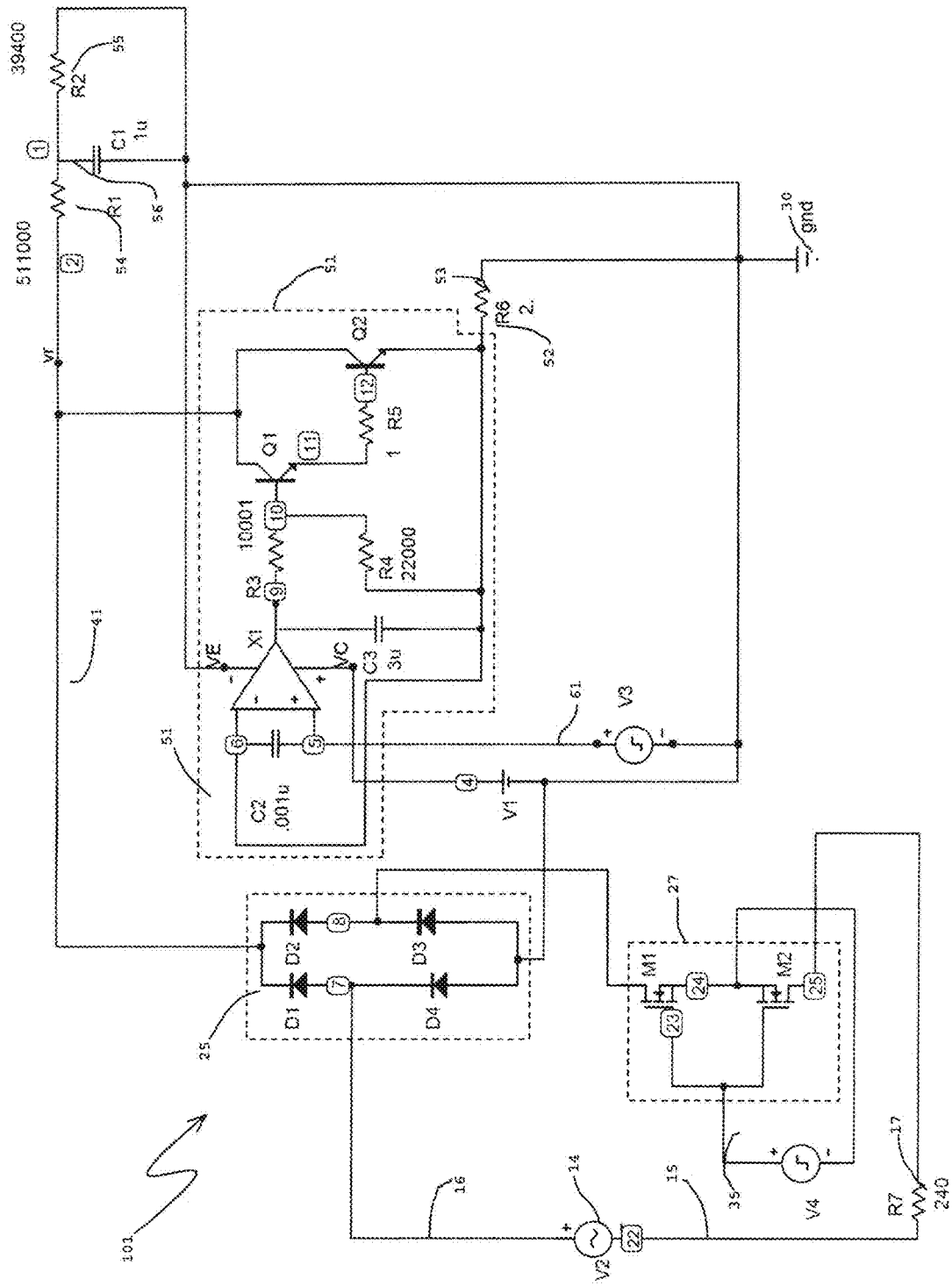
FIGS. 4 and 5 are schematic diagrams of current sources.
Figure 5:
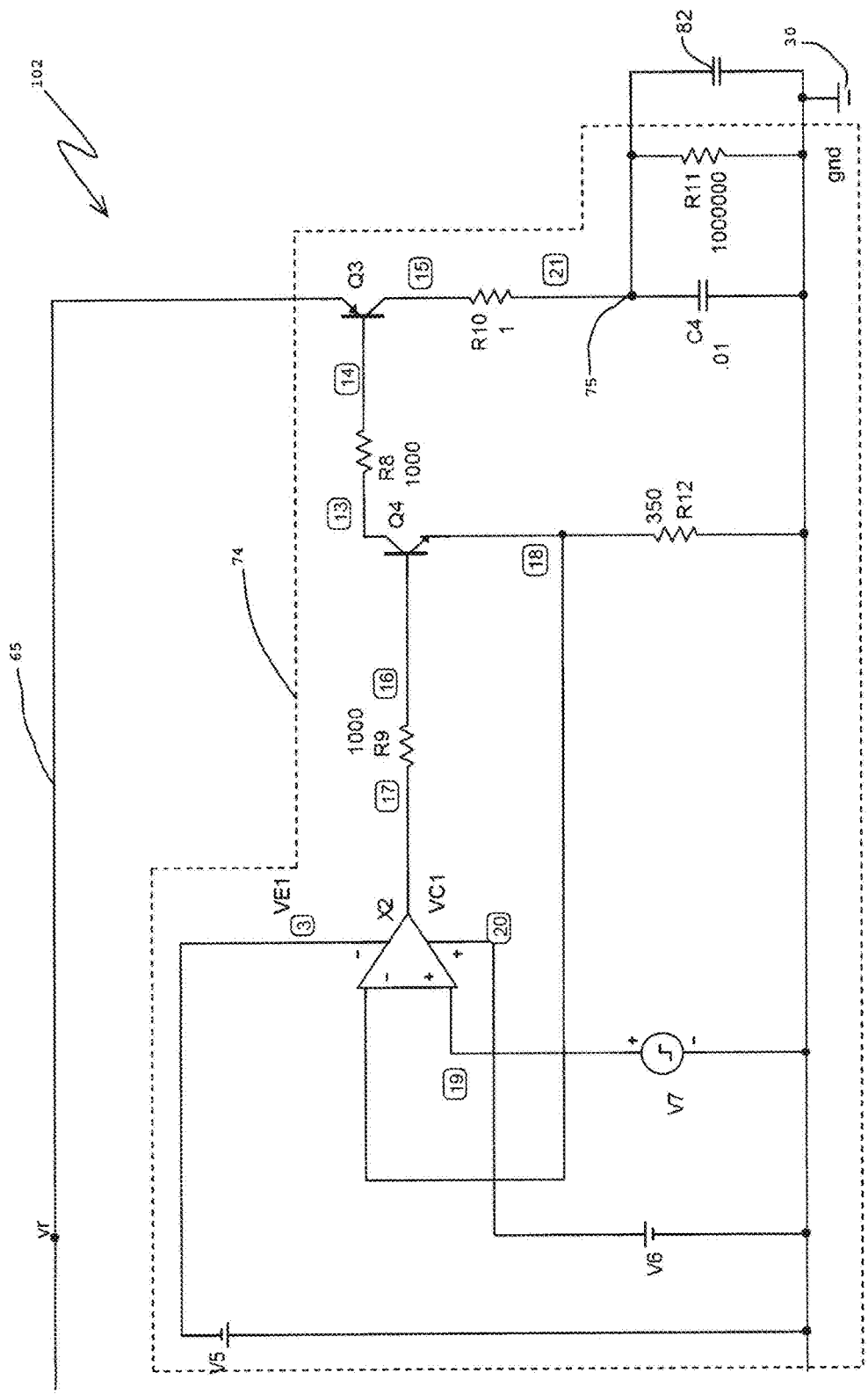

FIGS. 4 and 5 are example schematic diagrams 101 and 102 of current sources 51 and 74, respectively.

FIGS. 6*a*, 6*b* and 6*c* are diagrams of simulated waveforms. A graphical simulation may illustrate the charging current 104 on line 75 of FIGS. 1*a*-1*c* and 5 as shown in the waveform of FIG. 6*a*. Waveform 106 is the voltage on line 75 for charging current. A current transformation of current 104 is shown in a diagram of FIG. 6*b*. SCS 51 may have control of the load current as measured voltage drops 108 across resistor 53 at a first part of the waveform. Line 112 may represent the current to CCS 74. Waveforms 108 and 112 may represent a range current. The 112 waveform of currents may be measured at line 75 of FIGS. 1*a*-1*c* and 5.

Virtually all of the available current may be transferred to CCS 74 at line cycles 113 after a few line cycles 107. A diagram of FIG. 6*c* shows waveform 114 of voltage across load 17 which may indicate load 17 current for a range of charging current. A summed load current does not necessarily change in any manner during a transition 116 from line cycles 107 to line cycles 113. Thus, with load activation by switch 27 or (K1 or K2), the current through load 17 or 18, respectively, at point 56 may be proportional to the applied VAC.

At this stage, VAC changes may be monitored at point 56 and values of SCS 51 and CCS 74 altered. Typically, there may be more interest in a loss of AC or brown out conditions where system operation could be terminated. The charging process may be modulated by tuning the increasing of the value of SCS 51 and/or reducing the value of a CCS 74, or typically doing both. The charging process may be completely terminated by reselecting switch 27 or 28 (K(n)), respectively, to return the load 17 or 18 to an un-fettered state.

Charge transfer block 50 may have other features. Load currents may be high as compared to what could exist on line 83 when Wi-Fi and high powered engines involving voice or displays are present. Related-art systems may typically make the user wait while charging the internal storage device to the point where it can support local processes. The present power transformation system 11 may incorporate an approach to "fast" charge the system from a replaceable energy storage device 91 such as an alkaline or lithium battery. An "n" farad ultra capacitor 82 (C2), or supercapacitor, may gain enough charge to support the Wi-Fi access point and let one run a display system, in a matter of, for instance, one to ten seconds rather than, for instance, 20 to 40 minutes. "n" may indicate a number of farads for capacitor 82. However, increasing storage capacity may generally allow longer display intervals as do lower power displays.

An ultra capacitor may be regarded as, for example, a super capacitor, electrochemical capacitor, or an electric double layer capacitor. The ultra capacitor may be made from, for instance, carbon aerogel, carbon nanotubes, or highly porous electrode materials, or other materials that can result in extremely high capacitance within a small package. Such capacitance may range from one-half farad to 200 farads or more. Depending on the power output requirements of system 11 from capacitive storage, the capacitance of the capacitor 82 might be less than one-half farad in certain designs.

Capacitor 82 may be a single capacitor or a multitude of capacitors connected in a parallel and/or a series configuration. Generally, the number of farads of capacitor 82 may be one or greater than one. In the present instance, the number of farads of capacitor 82 may be five.

Replaceable battery 91 may be tapped at other times when power transformation techniques are not necessarily deriving enough energy dependent on intermittent usage, such as may occur with voice or code down load periods.

A last element of charge transfer block 50 may be an approach to allow a common connected device to utilize the charging system or at least inform the power transformation that its features may be needed.

The topology of FIG. 1*a* may allow a buck converter 47 to have less dynamic range as it merely would need to support fast charge rates and not necessarily need to be rated up to 300 mA (or more) as what might be needed for voice, display and Wi-Fi systems.

Other ancillary functions may be incorporated. It may be advantageous to incorporate a CCS 74 rate monitor sub-circuit to eliminate calibration issues associated with the current source over its input voltage compliance range. This may be particularly useful when the CCS 74 is used in the high voltage mode associated with an "Off" load power transformation.

System 11 may have a sub-circuit to monitor changes in applied VAC. The sub-circuit may improve the fidelity of the system and eliminate extensive tolerance analysis. For instance, CCS may be a pseudo current source for calibration, detection in applied VAC.

FIG. 1*a* is a diagram of a power transformation system 11. A furnace system 12 showing a step-down 120/24 VAC transformer 14 may have a common line 15 and a 24 VAC hot line 16. Common line 15 may be regarded as a ground or reference voltage for furnace system 12. Also, common line 15 may be connected to one side of loads 17, 18 and 19. Loads 17, 18 and 19 may have another side connected to lines 21, 22 and 23, respectively. Loads 17, 18 and 19 may relate to heating, air conditioning, and ventilation, respectively. The loads may instead relate to other kinds of components. Terminals connecting lines 16, 21, 22, 23 and 15 between furnace 12 and power transformation system 11 may be labeled "R", "W", "Y", "G" and "C", respectively.

Line 16 may be connected to a first terminal of a full wave rectifier 25, a first terminal of a full-wave rectifier 26, a first terminal of a relay 27, a first terminal of a relay 28 and a first terminal of a relay 29.

Line 21 may be connected to a second terminal of relay 27 and a first terminal of a relay 31. Line 22 may be connected to a second terminal of relay 28 and a first terminal of a relay 32. Line 23 may be connected to a second terminal of relay 29. Line 15 may be connected to a second terminal of full-wave rectifier 26 and to a cathode of a diode 33. A second terminal of full-wave rectifier 25 may be connected to a second terminal of relay 31 and a second terminal of relay 32 via a line 34.

Relay 27 may be controlled by a signal from a controller 40 via a line 35. Relay 31 may be controlled by a signal from controller 40 via a line 36. Relay 32 may be controlled by a signal from controller 40 via a line 37. Relay 28 may be controlled by a signal from controller 40 via a line 38. Relay 29 may be controlled by a signal from controller 40 via a line 39.

Figure 12B:
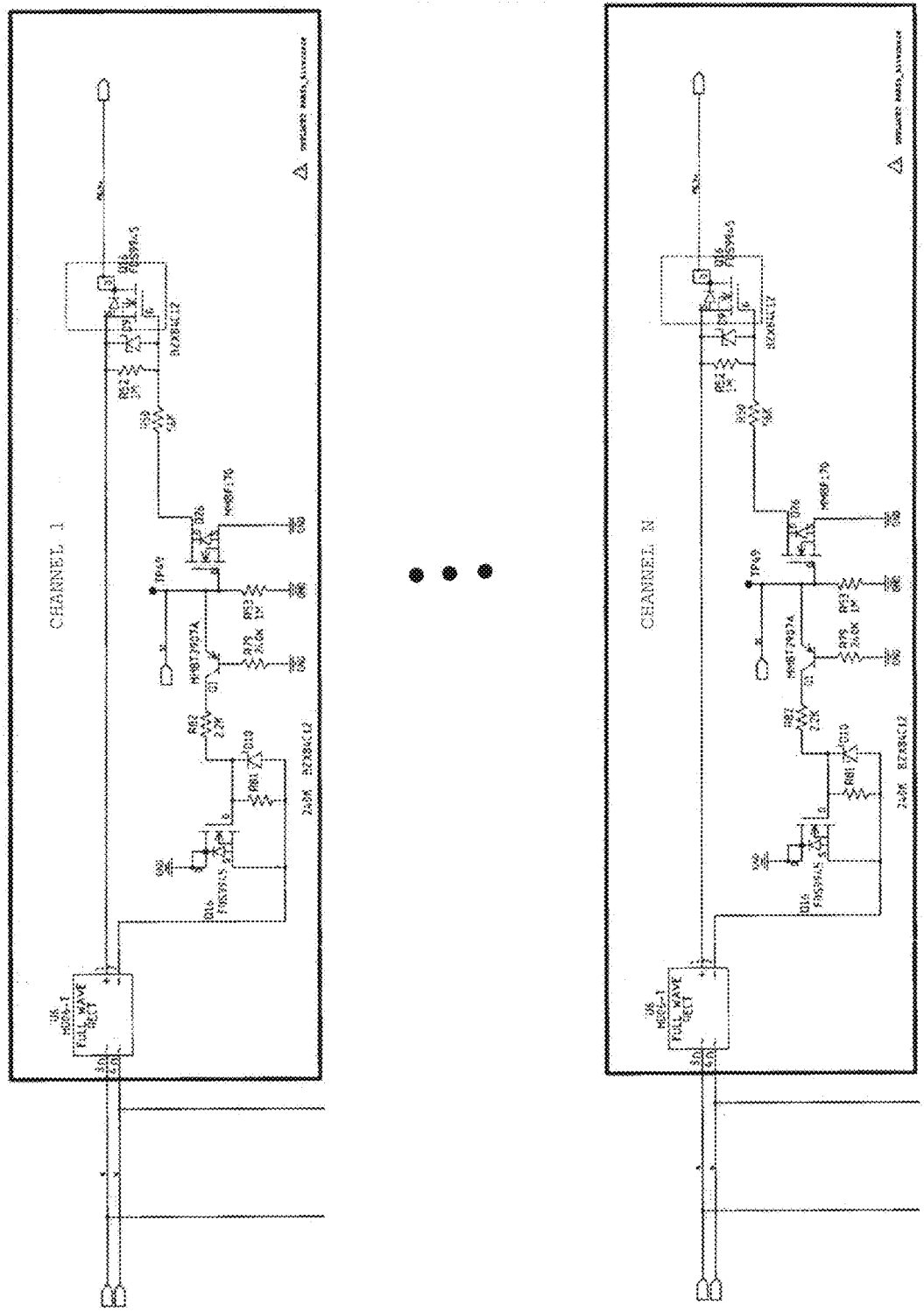

Rectifier or rectifiers 25 may be configured with various layouts to allow multiple sources of power. There may be additional S1, S2, Sn functions with a single rectifier 25 (FIG. 12*a*) or multiple rectifiers 25 with S1's (FIG. 12*b*). An example circuit for the rectifiers may incorporate also third and fourth terminals. A first diode and a second diode may have cathodes connected to the third terminal. The first diode may have an anode connected to the first terminal and the second diode may have an anode connected to the second terminal. A third diode and a fourth diode may have cathodes connected to the fourth terminal. The third diode may have an anode connected to the first terminal. The fourth diode may have an anode connected to the second terminal.

The third terminals of rectifiers 25 and 26 may be connected to a common ground or reference voltage terminal 30 of power transformation system 11. The fourth terminal of rectifier 25 may be connected to a line 41 to a charge transfer block 50. The fourth terminal of rectifier 26 may be connected to an emitter of a PNP transistor 42.

Figure 11A:
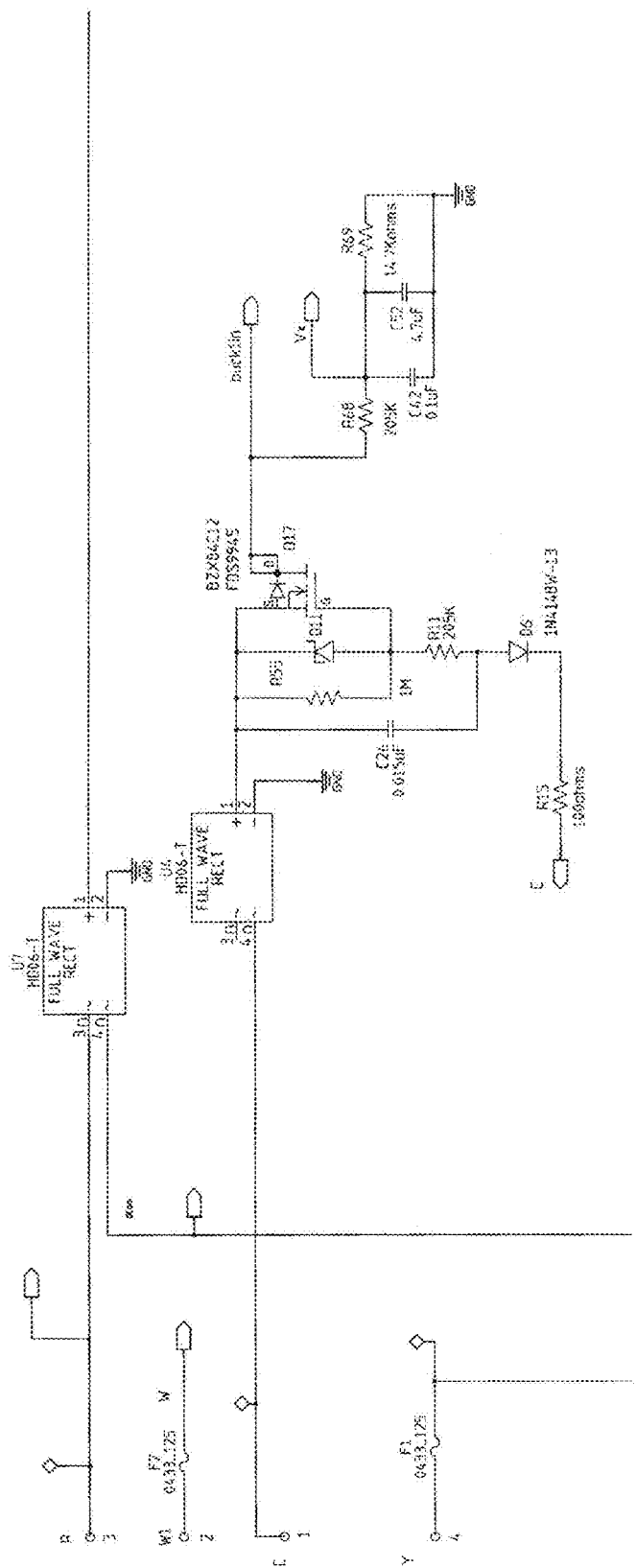
Figure 11B:
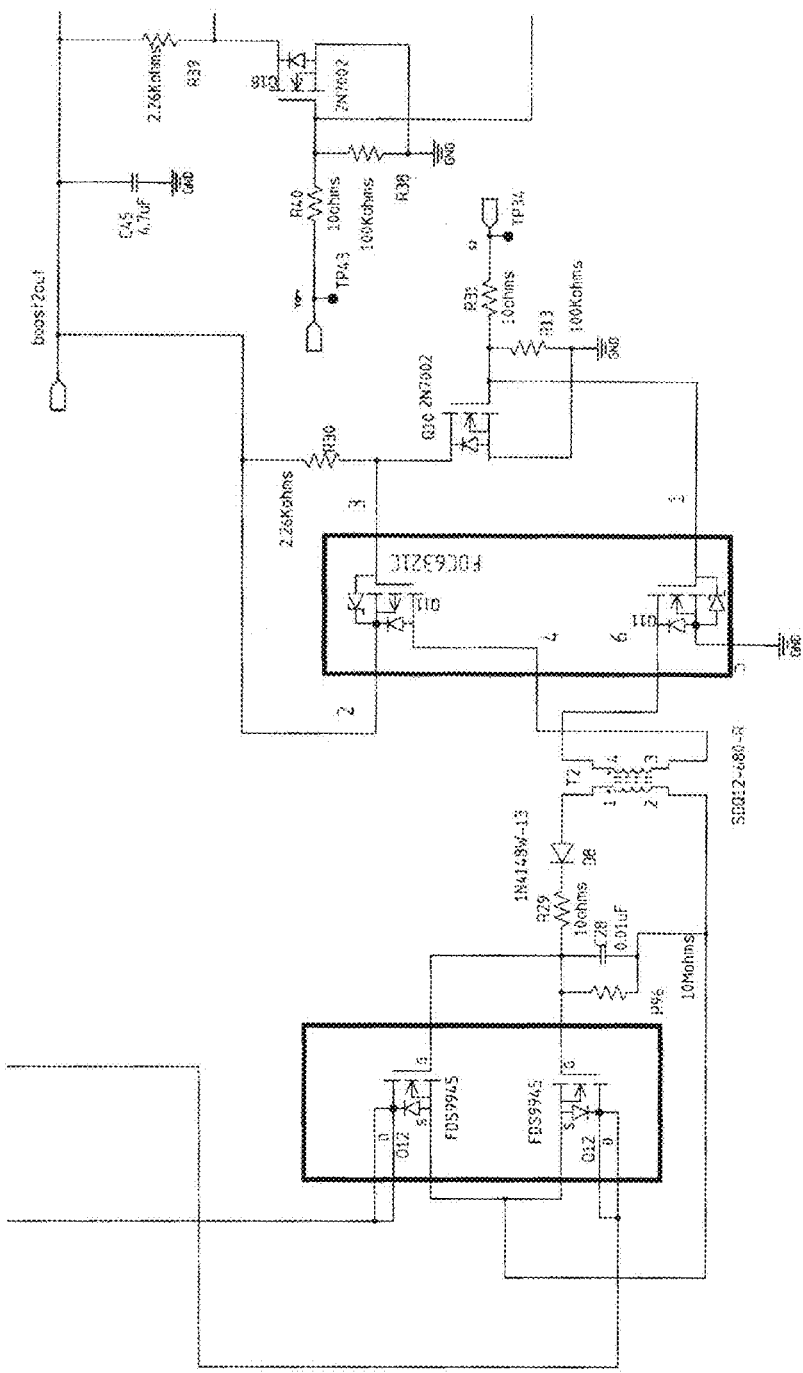
Figure 11C:
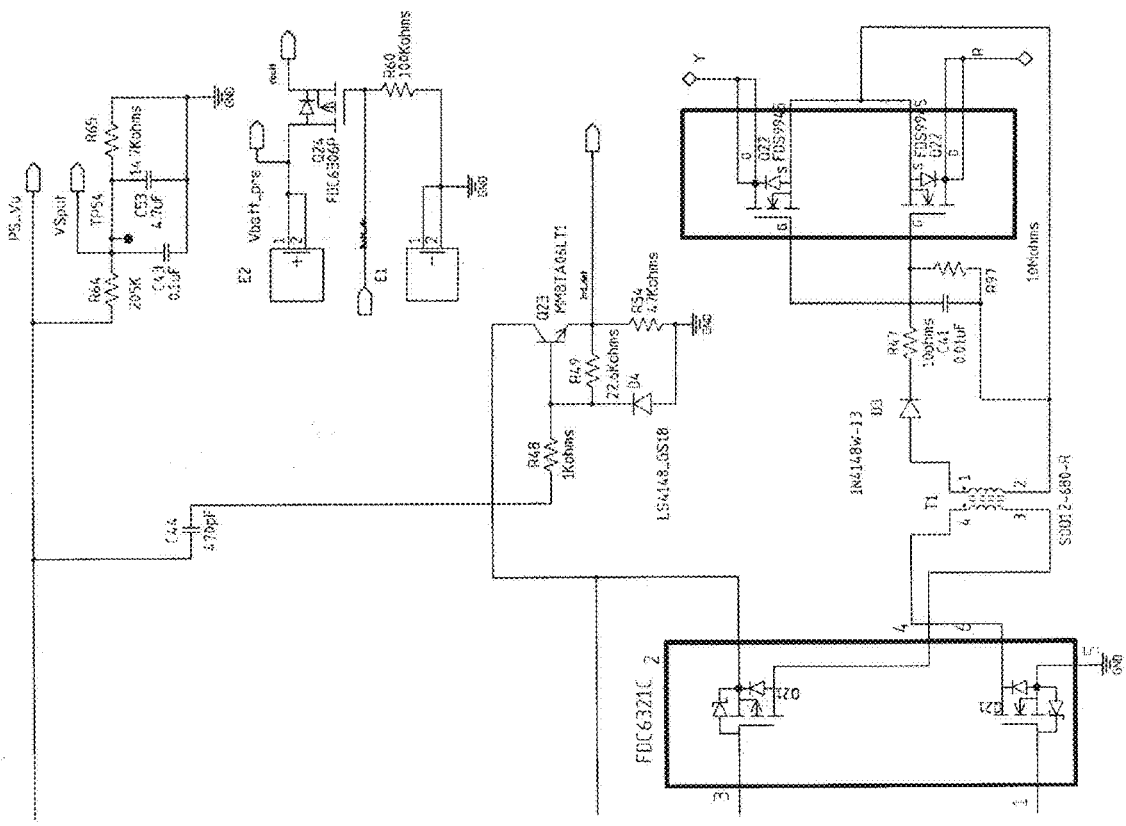

A resistor 43 may have a first end connected to the emitter of transistor 42 and a second end connected to a base of transistor 42. A resistor 44 may have a first end connected to the base of transistor 42 and a second end connected an anode of diode 33. A capacitor 45 may have a first terminal connected to the anode of diode 33 and a second terminal connected to ground 30. A collector of transistor 42 may be connected to a line 46 to an input of a buck converter 47. A capacitor 48 may have a first terminal connected to the collector of transistor 42 and a second terminal connected to ground 30. This may be a C wire selector/monitor reading Vx, and BC_Vdc (FIG. 11*a*—hardware based).

Charge transfer block 50 may incorporate a split current source 51 having a first terminal connected to line 41 and a second terminal connected to a line 52. Line 52 may be connected to first end of a low ohm (2.5Ω) resistor 53. A second end of resistor 53 may be connected to ground 30. An input for a value to current source 51 may be provided on line 61 to source 51.

Block 50 may incorporate a voltage divider having a resistor 54 and a resistor 55. Resistor 54 may have a first end connected to line 41 and a second end connected to a line 56 and to a first end of resistor 55. Resistor 55 may have a second end connected to ground 30.

Block 50 may incorporate a capacitor 57 having a first terminal connected to line 41. Capacitor 57 may have a second terminal connected to a first terminal of a FET or switch 58. A second terminal of switch 58 may be connected to ground 30. Switch 58 may be controlled by a signal from controller 40 via a line 59 to its gate or control terminal of FET or switch 58.

A FET or switch 62 may have a first terminal connected to line 41 and a second terminal connected to a line 65. FET or switch 62 may have a gate or third terminal connected to a line 66 for receiving a signal to control FET or switch 62. A FET or switch 63 may have a first terminal connected to a line 69 which is connected to an output of buck converter 47. Switch 63 may have a second terminal connected to line 65. A gate of third terminal of FET or switch 63 may be connected to a line 67 for receiving a signal to control switch 63. A FET or switch 64 may have a first terminal connected to line 65 and have a second terminal connected to a line 71. Line 71 may be connected to a first terminal of a boost circuit 72. A gate or third terminal of FET or switch 64 may be connected to a line 68 for receiving a signal to control switch 64.

A programmable current source 74 may have a first terminal connected to line 65. Source 74 may have a second terminal connected to a line 75. A third terminal and a fourth terminal may be connected to a line 76 and a line 77, respectively for inputs to source 74 for setting a range. A fifth terminal may be connected to a line 78 for providing an output indication from source 74.

A capacitor 82 may have a first terminal connected to line 75 and a second terminal connected to ground 30. A boost circuit 81 may have a first terminal connected to line 75. A second terminal of boost circuit 81 may be connected to an output line 83. A third terminal of boost circuit 81 may be connected to a line 84 which can provide a signal for controlling circuit 81.

A capacitor 85 may have a first terminal connected to line 83 and a second terminal connected to ground 30.

Boost circuit 72 may have a second terminal connected to a line 88. A third terminal of boost circuit 72 may be connected to an output line 87. A fourth terminal of boost circuit 72 may be connected to a line 89 which can provide a signal for controlling circuit 72. A battery assembly 91 may have a positive terminal connected to line 88 and a negative terminal connected to ground 30.

Output line 83 may be connected to an anode of a diode 92. Output line 87 may be connected to an anode of a diode 93. Line 69 from an output of converter 47 may be connected to an anode of a diode 94. Cathodes of diodes 92, 93 and 94 may connected to an output line 95. A capacitor 96 may have a first terminal connected to line 95 and a second terminal connected to ground 30. A capacitor 97 may have a first terminal connected to line 69 and a second terminal connected to ground 30.

Figure 7B:
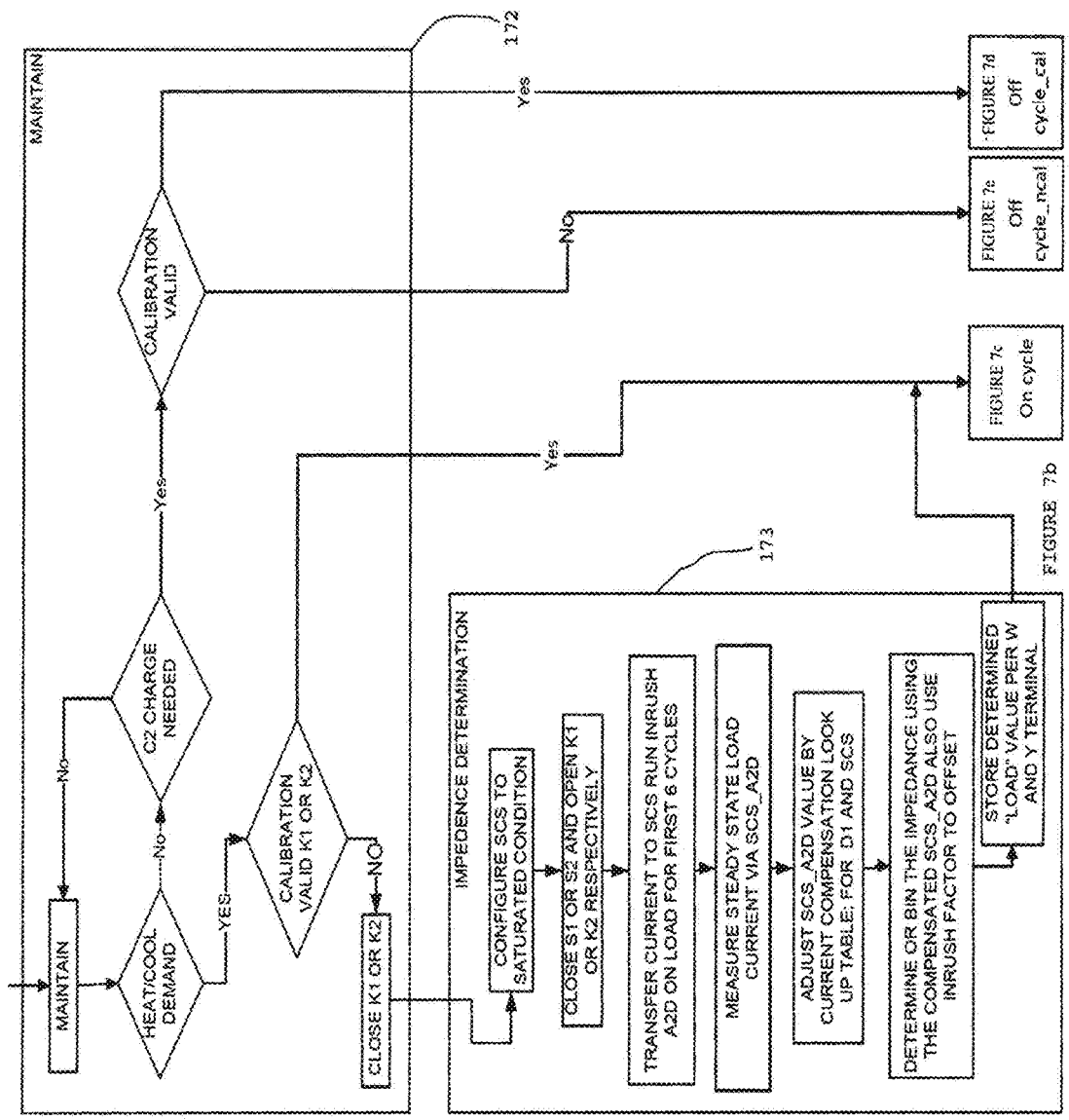
Figure 7C:
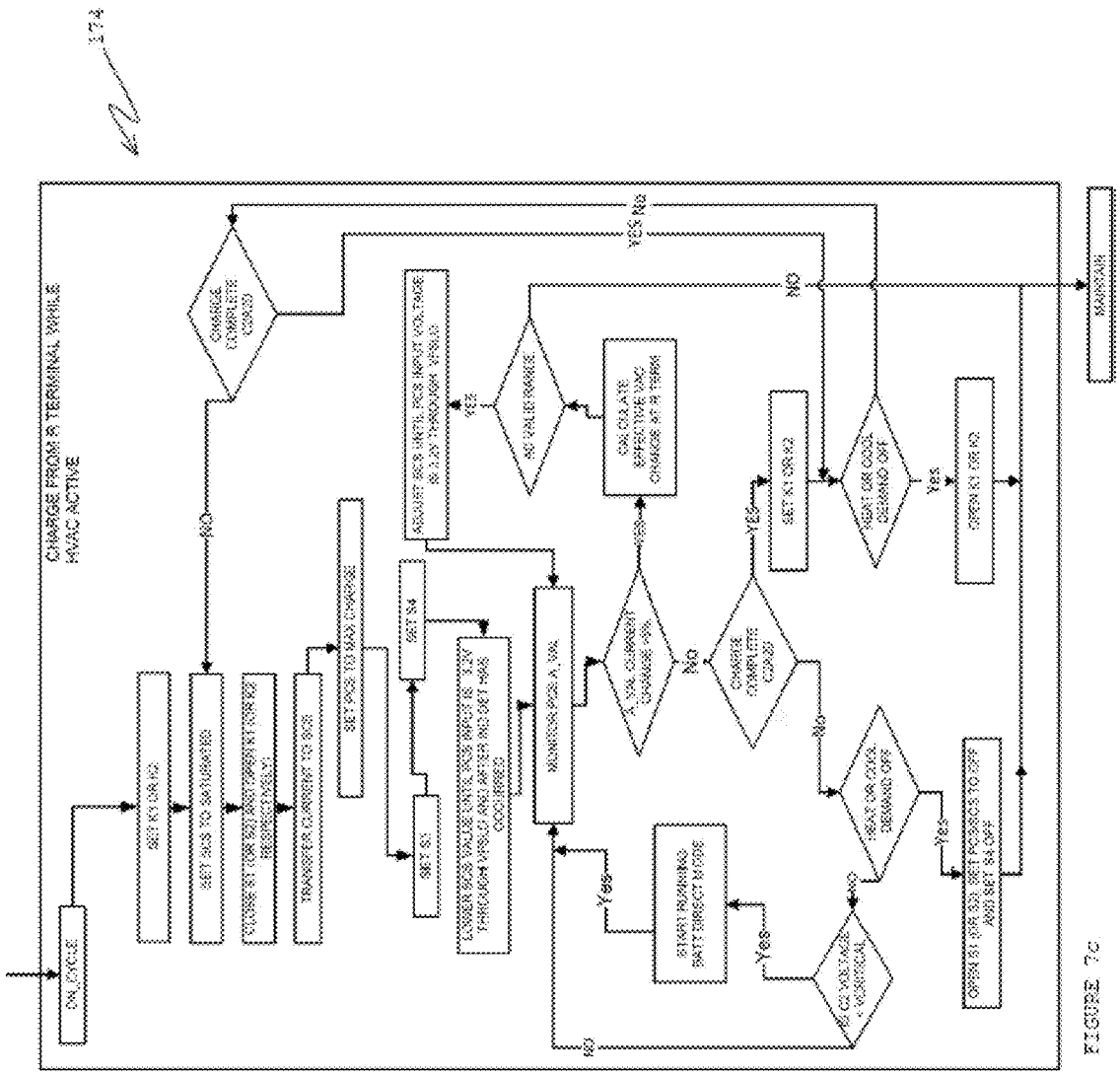
Figure 7D:
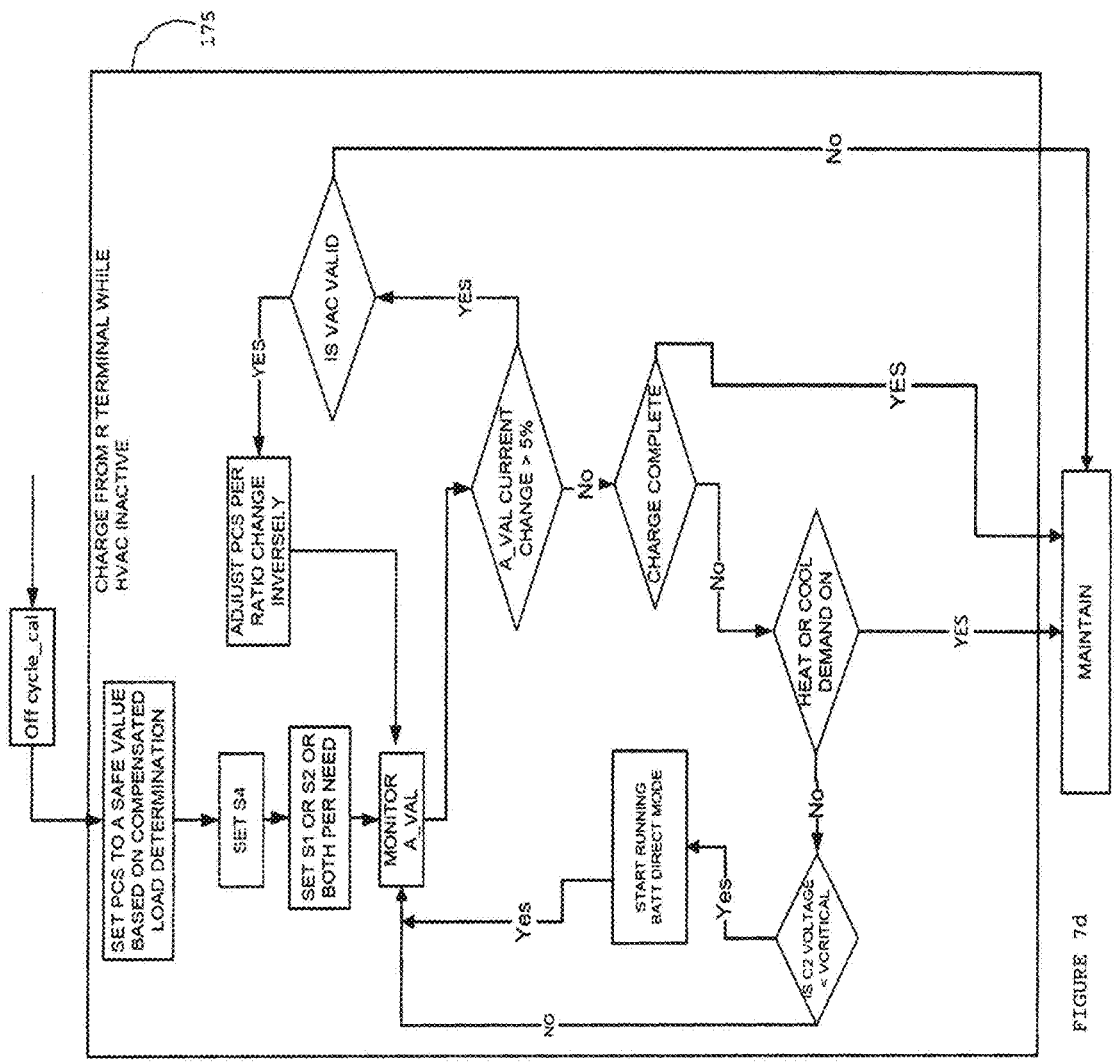
Figure 7E:
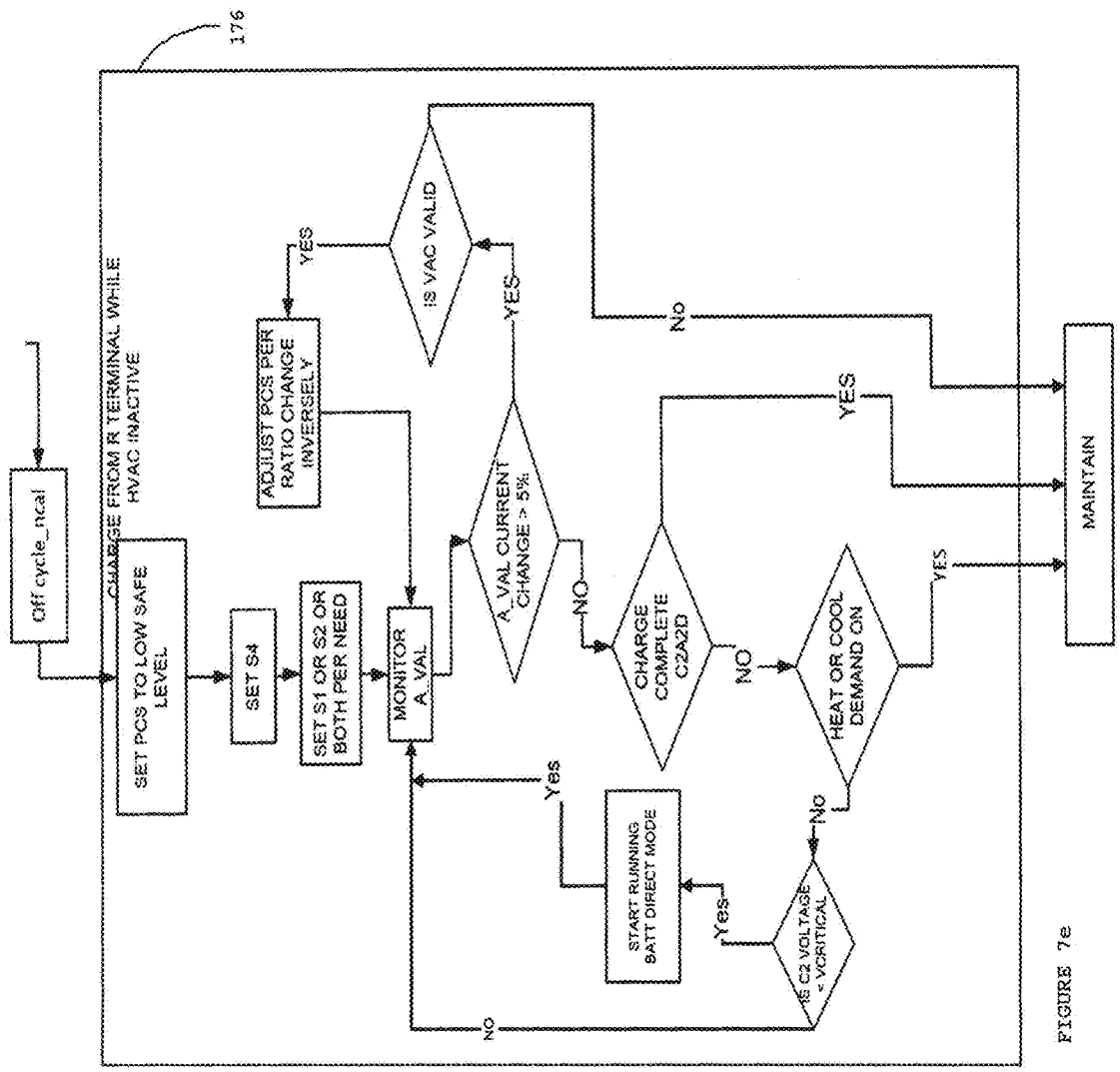
Figure 7F:
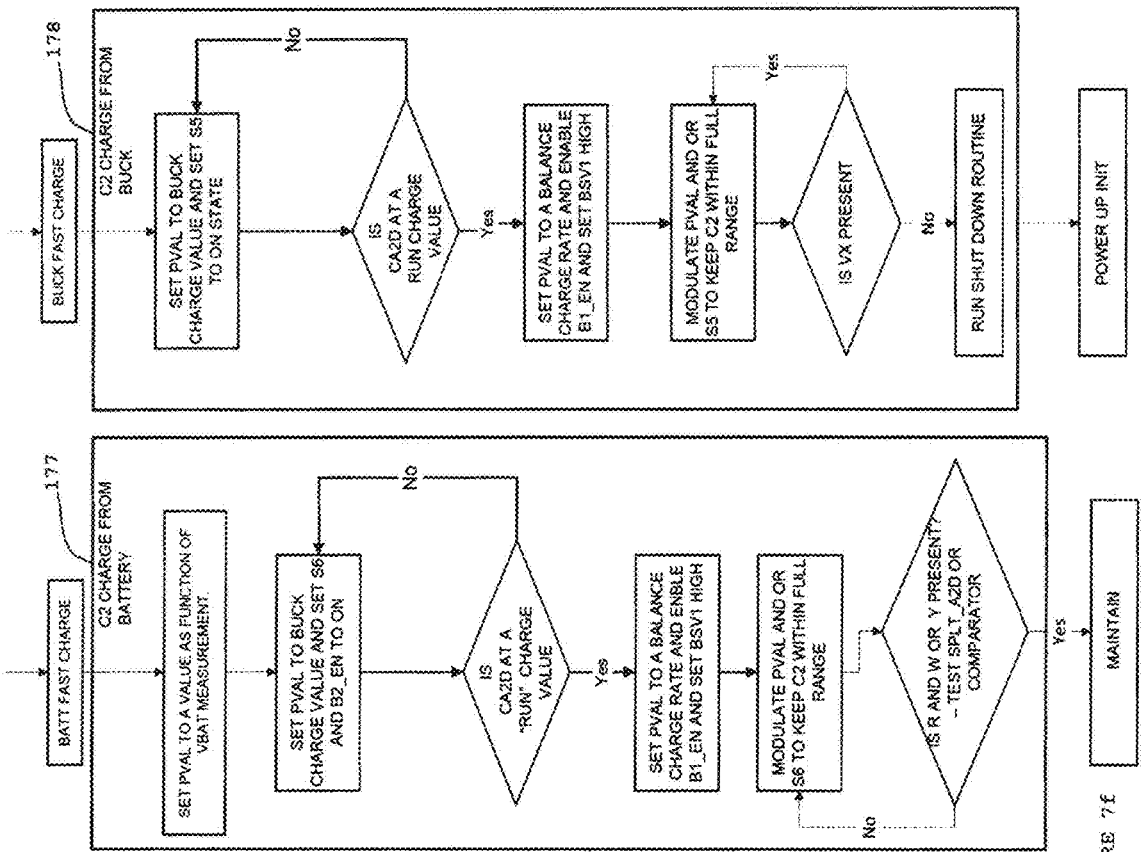
Figure 7G:
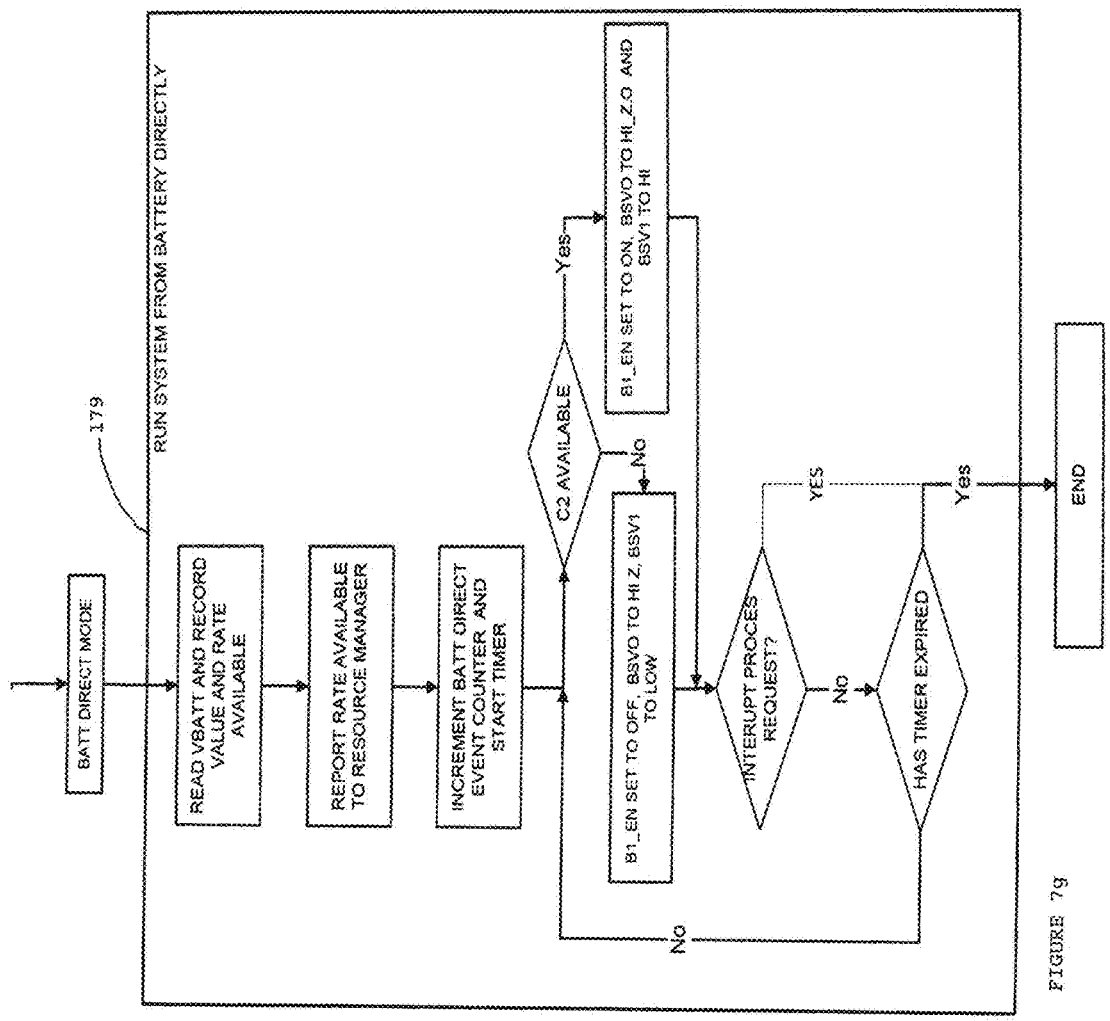
Figure 8A:
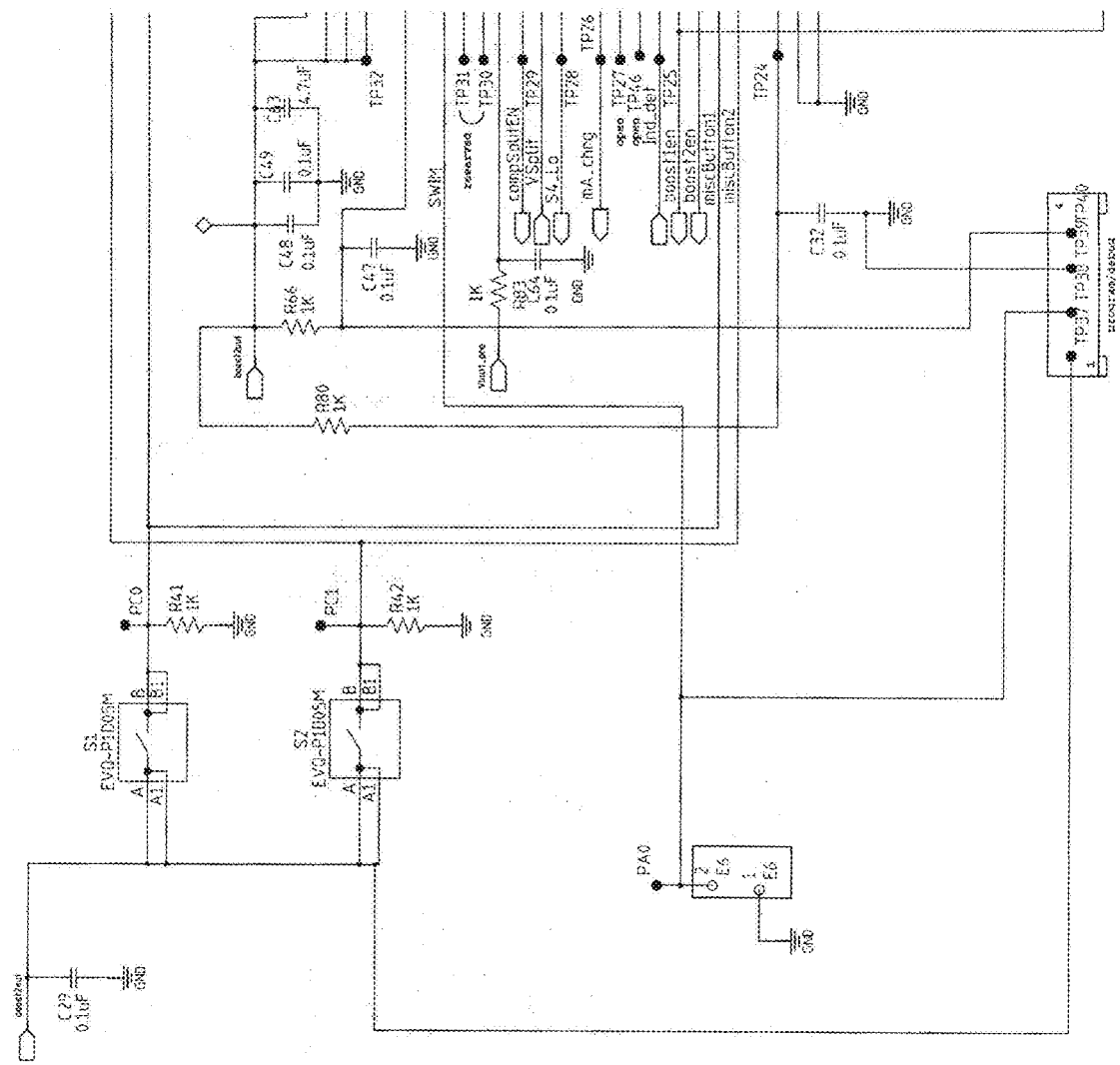
Figure 8B:
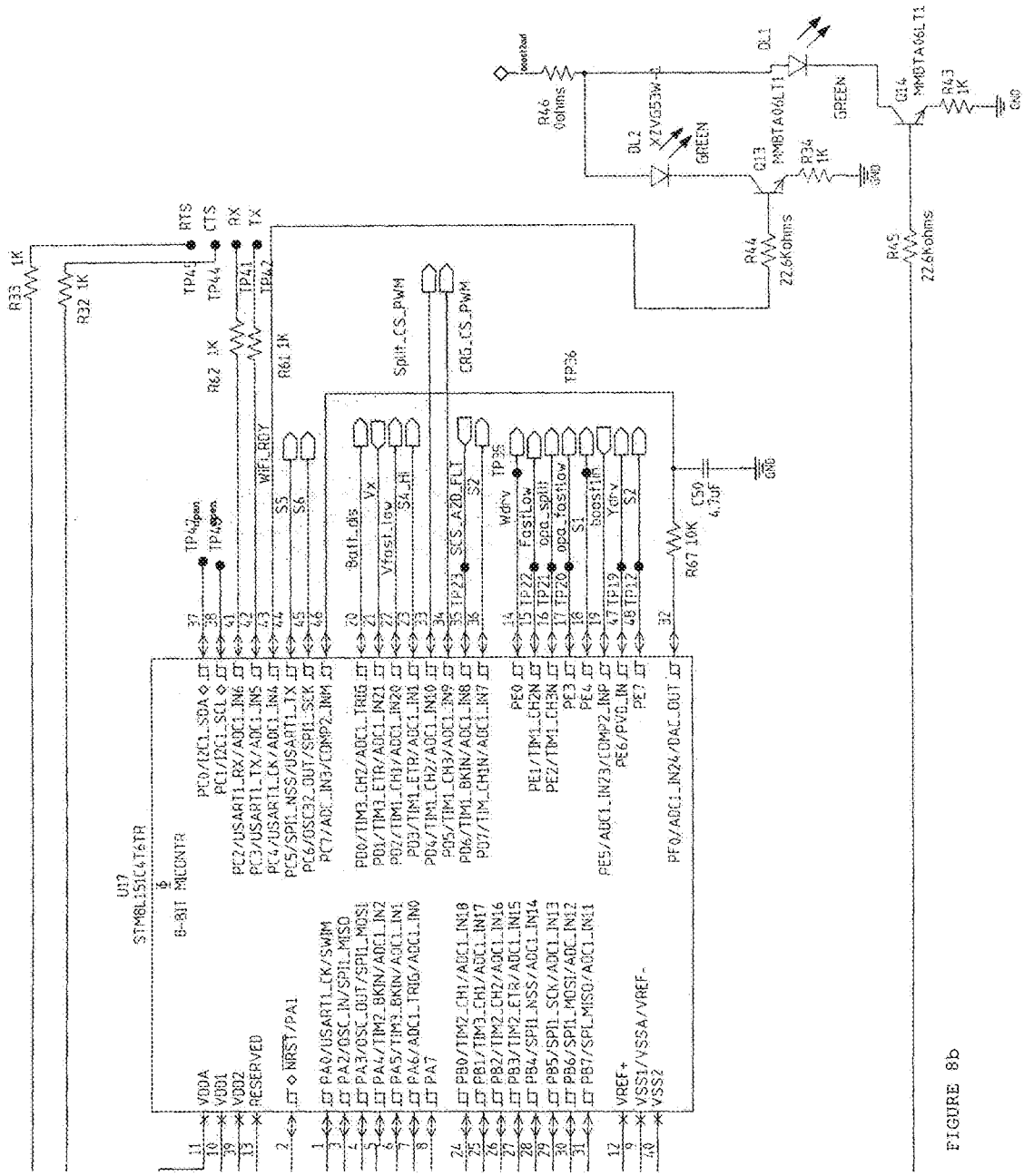

FIGS. 7*a*, 7*b*, 7*c*, 7*d*, 7*e*, 7*f* and 7*g* are diagrams of activities of certain portions of the power transformation circuits in FIGS. 1*a*-1*c*. Referral to letter, alphanumeric or numeric designations in FIGS. 1*a*-1*d* may be made in FIGS. 7*a*-7*g*. FIG. 7*a* is a diagram revealing an approach 171 for a power up initialization. FIG. 7*b* is a diagram for an approach 172 to maintain and an approach 173 for an impedance determination. FIG. 7*c* is a diagram for an approach 174 for a charge from R terminal while an HVAC is active. FIG. 7*d* is a diagram for an approach 175 for a charge from R terminal while the HVAC is inactive. FIG. 7*e* is a diagram for another approach 176 for a charge from R terminal while the HVAC is inactive. FIG. 7*f* is a diagram of an approach 177 for a C2 charge from a battery and an approach 178 for a C2 charge from a buck converter.

FIGS. 8*a*, 8*b*, 9*a*-9*c*, 10*a*-10*c*, and 11*a*-11*c* are schematics of an illustrative example of the present power transformation circuit. The schematics may be useful for constructing an example of the circuit.

Figure 9A:
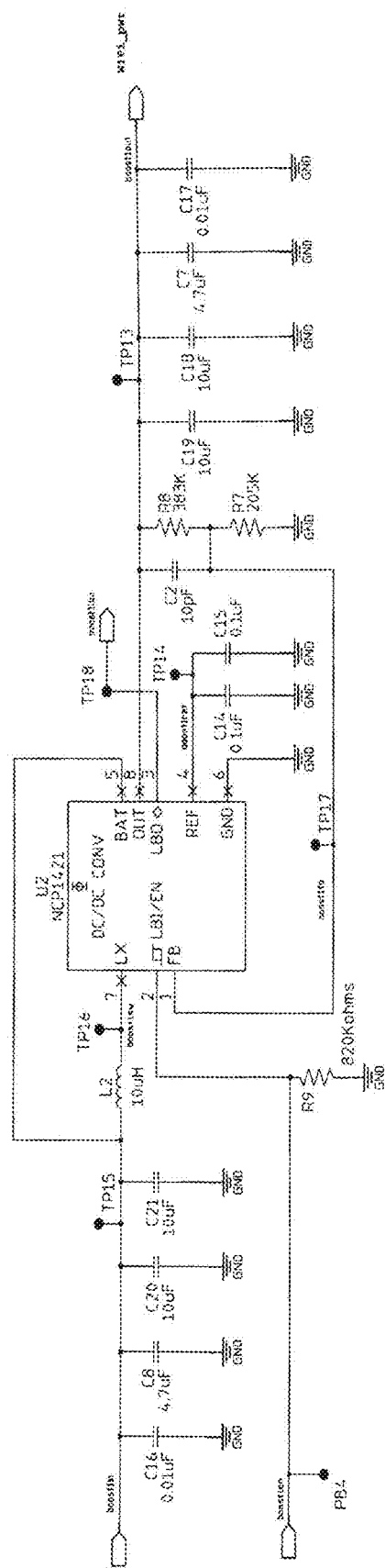
Figure 9B:
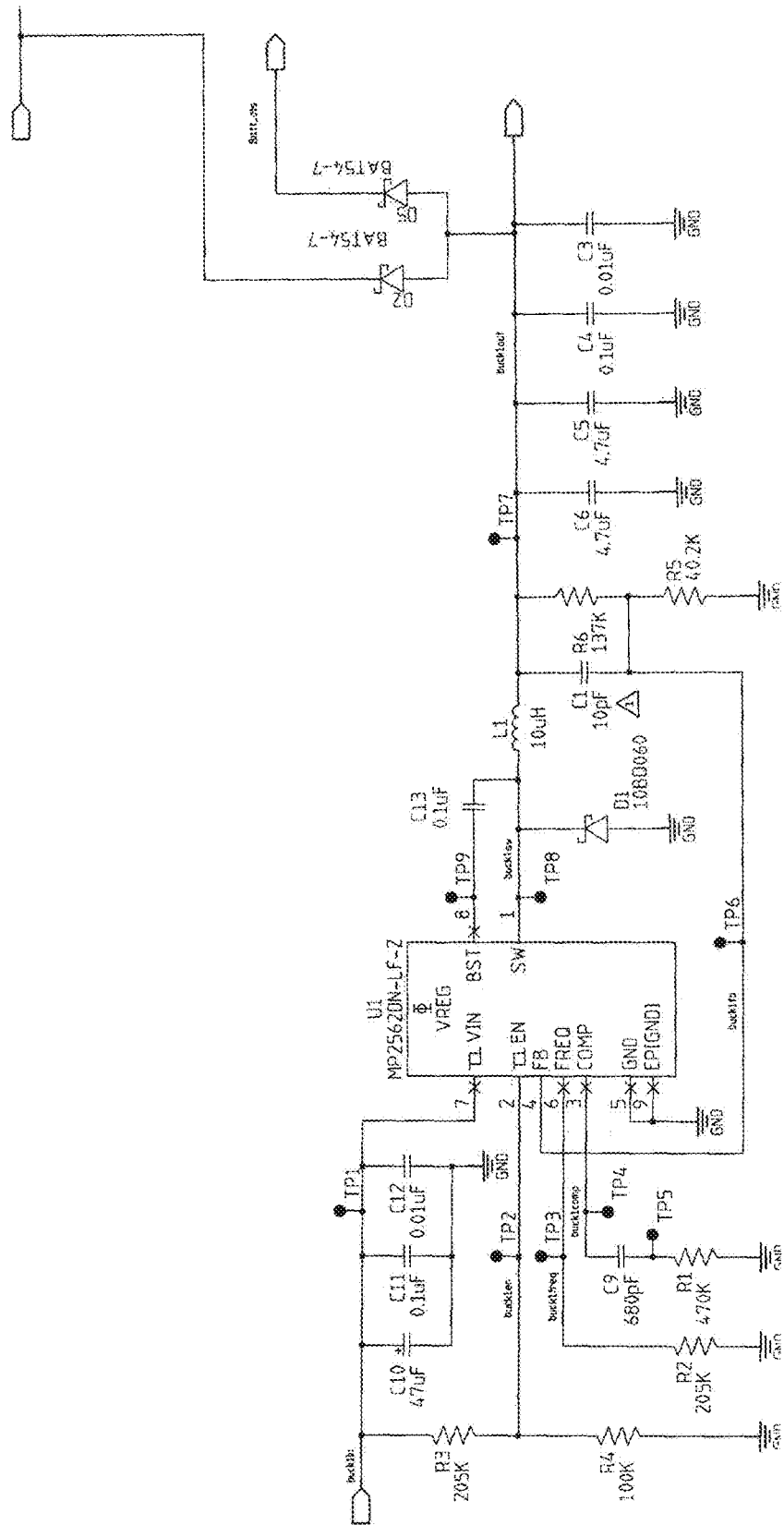
Figure 9C:
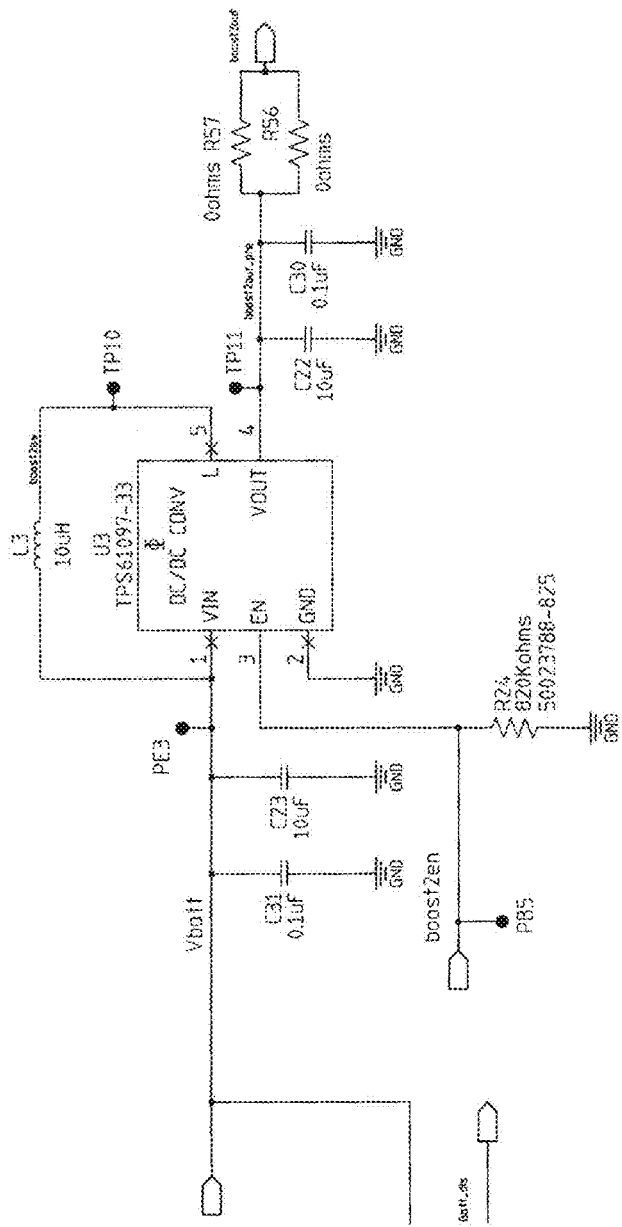
Figure 10A:
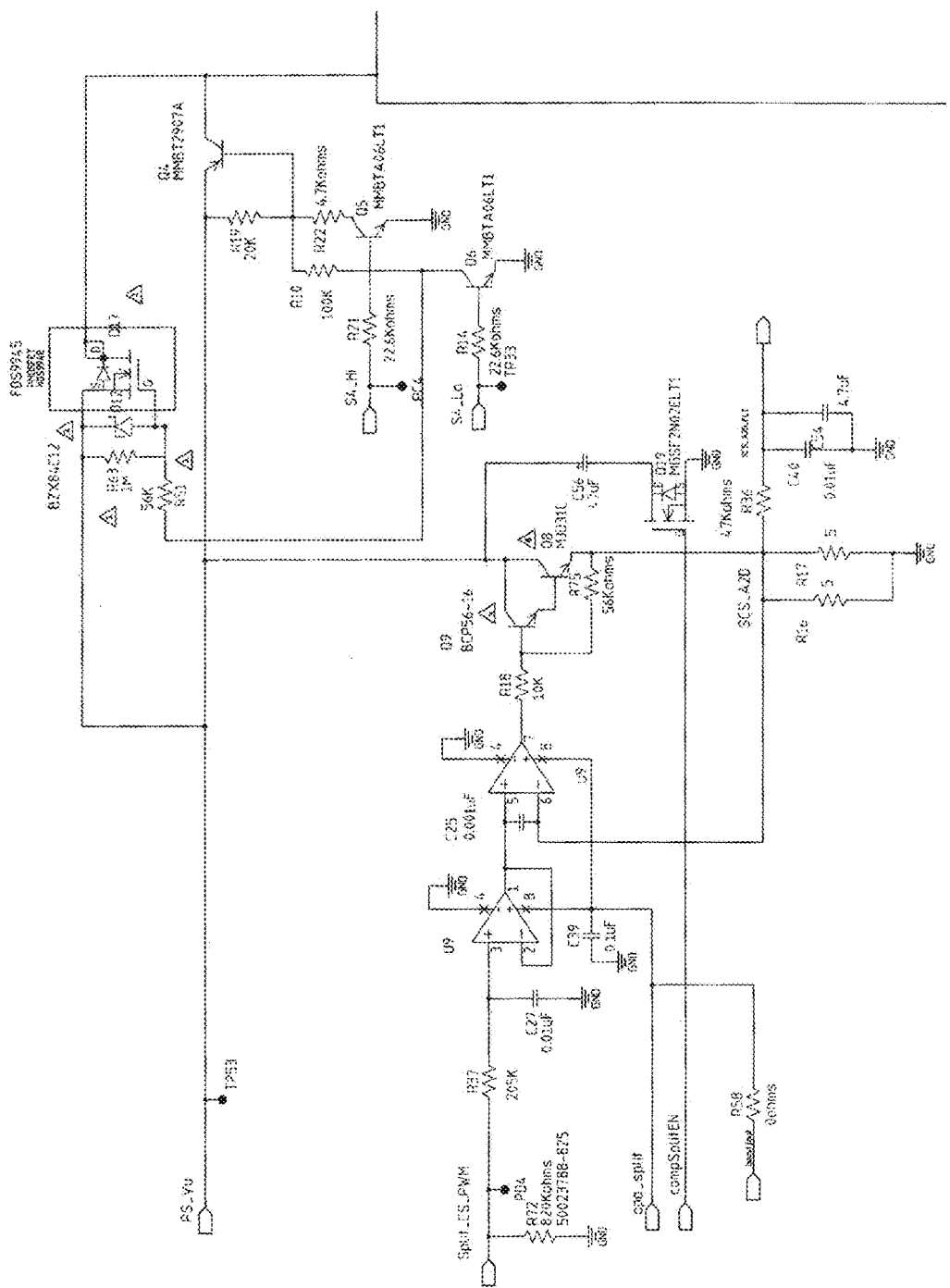
Figure 10B:
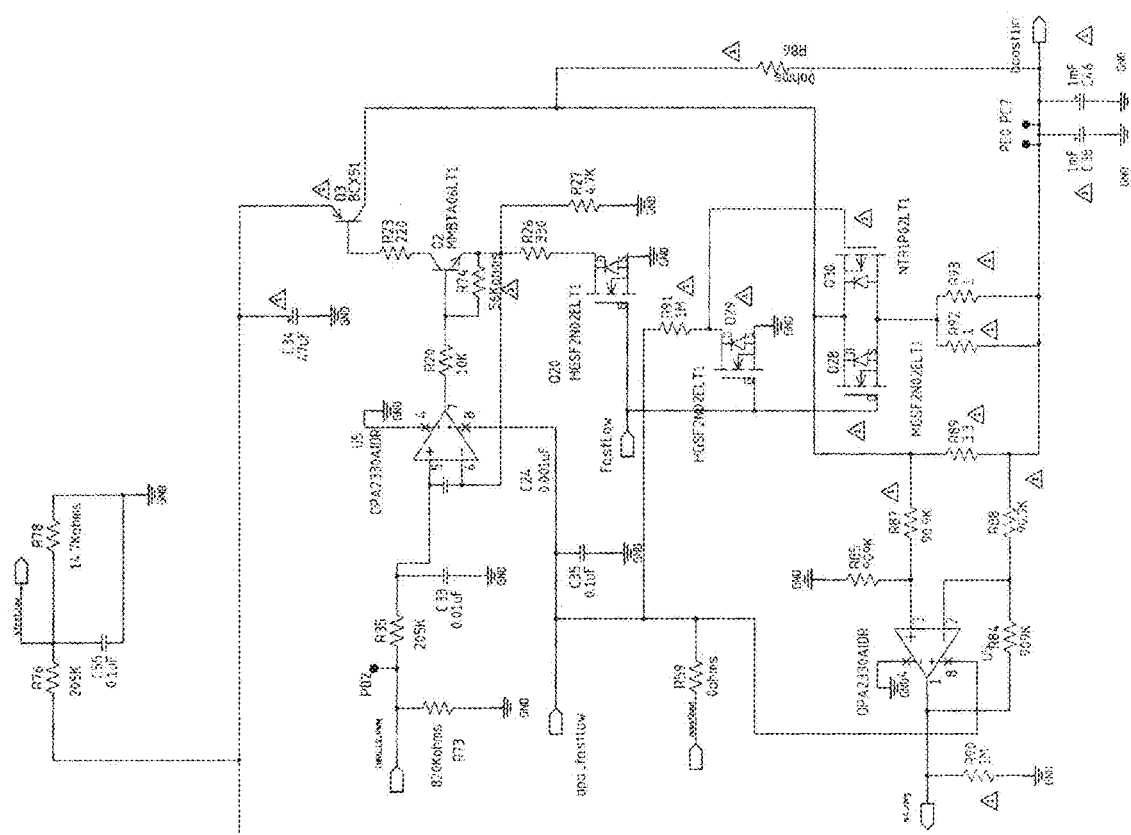
Figure 10C:
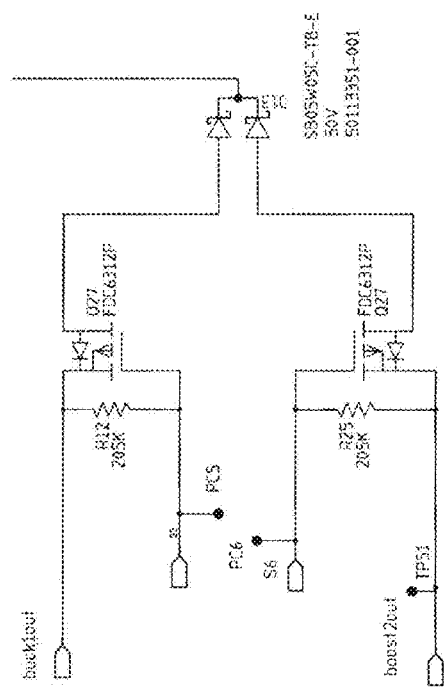

A right end of the circuit in a diagram of FIG. 9*a* may have a DC block.

Some power stealing systems may appear to have had issues working with furnace topologies which incorporate simple control systems. A particular class of equipment may have utilized the power controlled by the W terminal in series configuration with flame safety interlocks. Power stealing with this series connected load may have historically made the conventional power stealing problem difficult as the gas valves used in the furnace may be particularly sensitive to any voltage perturbation which will occur with energy is being diverted within the thermostat to run the thermostat in the most basic two wire system.

"W" may represent a heat relay or switch terminal, or the like. "C" may represent a 24 V common terminal or the like.

The present power transformation system may have introduced a new capability that allows the thermostat to learn what type of equipment it has connected. When the PT encounters a series gas valve system, the PT may deal with the valve system in a special way and provide additional insight to the operation of the furnace from a flame quality perspective. Having this feature in a communicating thermostat may allow the customer to receive advanced warnings that the flame sensing mechanism is becoming faulty before the mechanism completely fails to light.

This feature may be particularly useful for services such as Honeywell's contractor portal.

No known thermostat appears to have been known to provide an early warning that a light off problem is occurring and call for service.

The power transformation system may do this and "record" the real time current domain information which the furnace is using and "characterize" exactly when a main flame establishing period is occurring and also monitor whether it was successful or not.

Waveforms (FIGS. 17 and 18) may represent a normal light off and a sequence of three trials for main flame proving with subsequent failure. One may see from inspection of the three main flame establishing periods noted (at the 0.65 amp level) this is the time (after purging) where the igniter and valve are turned on and the light-off fails or succeeds and the sensing of it fails.

A file listed as stepped gas valve may illustrate a different burner system and specifically the current waveform through the W terminal. One may immediately note the five distinct levels occurring . . . from left to right: 0 mA=output off; 180 mA=purging; 260 mA=hot surface ignition (HIS) warm up period; 665 mA=main valve+HSI; and final and finally the main valve alone.

The characterization mode of this disclosure may record and process up to nine levels which are more than sufficient to handle the numerous burner types.

Another type of interesting challenging load is also included. This is a hot water zone valve operator that has caused many two wire energy harvesting systems problems for many years. This valve (i.e., wax motor operation) may have unique characteristics in that it has a resistive heater load that melts wax which allows a spring to open the valve. One valve mechanism may be completely open and cause a limit switch to trip which allows the wax to cool and the valve mechanism may start to close (by the spring pressure) until the switch is made and the heater is again energized. Existing energy harvesting systems cannot handle the loss of power the valve presents to the W terminal.

The characterization process within may easily handle the present system. A background of a mode objective may be noted.

An HB thermostat may run a special test on just a W terminal. The purpose may be two-fold. The first may be to determine whether a significant probability exists to indicate that a gas valve is being driven off the power supplied through this terminal. The second may be to determine whether a significant probability exist which indicates that a "power interrupting" wax powered hydropic valve present.

Entry of mode exclusions or deferrals may incorporate the following. 1) Characterization will not necessarily run if a C-wire is present. These requirements may be all dependent just when a phantom mode is selected. 2) Certain ISU (installer setup utility) settings that preclude characterization testing from running may be as follows. a) ISU has been configured to "Radiant with Hot water" heating type. Power may interrupt wax motor valve detection. b) System configuration indicates Heat Pump. c) There may be an electric heat operation.

3) There may be a wall plate configuration. Selecting DT (Dual Transformer) may preclude PS on W and hence characterization is not necessarily needed.

4) There may be temporary low latency ping rates. One may expect to use a battery and run for 120 seconds after a Wi-Fi reset specifically at the end of DIY mode. Any system call for load control may result in control deferral (W load will not necessarily engage) until low latency period expires.

5) All resets of the EM may cause a random start delay of equipment. The initiation of characterization mode should be deferred for 120 seconds. This period may allow stabilization of the Wi-Fi energy consumption prior to entering characterization mode on the W terminal.

6) Reaching the critical BBT may terminate characterization mode testing. K1 may be re-engaged to continue heat call. After the BB period is reached and provided the 80 second main flame establishing period has expired, the default of using soft start power stealing levels should be deployed for the balance of that call.

7) If the phantom is already charging from battery, one may delay the heat call until a battery charge is no longer needed.

If the test is proven affirmative, the device may run characterized load behavior thereafter for "on" cycle power stealing, until Y is known and which time the load is preferred of on and off cycle stealing.

For Heat only applications "Off" cycle power stealing should always only use the first interval level for power setting biased on impedance. For Heat/Cool mode operation the Effective Impedance for off cycle, stealing should be the parallel combination with Y load (when present) or known.

Re-setting a characterization mode may be noted. The test may require augmentation from the battery, therefore a non-volatile memory element should be written or reset under certain conditions to preclude excessive use of the battery. The results of the test may leave a non-volatile memory element which can only be reset by the following methods of Factory reset, Subsequent ISU configuration change affecting load control, and power method change (phantom to C wire).

A characterization mode algorithm test (CMAT) may be noted. Any call for W activation may be delayed until an ultra-capacitor is charged to >2.3V. The battery may be used to accelerate the charging. During the characterization period, a power broker should revert to a special substantial savings mode with Wi-Fi left running while disabling sound and the glow ring behavior. The device display should indicate a special screen indicating "Learning Heating Load" if display is on.

CMAT should run for about 80 seconds. A timer may be started when K1 engages for the first second (thereby removing any inrush component). An OPA Split may be brought on, Split PWM is set to 100%, and yet S4 Low and High may be held false.

CMAT should measure the load current every second while recording intervals where a step behavior (>50 mA) is noted. Subsequent operations of the W terminal may inherently blank out periods to avoid on cycle power stealing when a transition is likely to occur.

At the conclusion of the characterization interval, the phantom circuit may engage in either normal on-cycle mode (150 mA), or engage a special lower voltage drop mode known as soft start (75 mA). Characterization criteria may be noted below.

Loss of AC should be monitored by the CMAT readings in that any Vscs equivalent that is less than 50% of the first interval shall initiate entering into a survival mode for AC loss.

Characterization criteria and subsequent on cycle power action may be noted relative to types 1, 2 and 3 of loads. As to a type 1 load, the W load is not necessarily stepped. It may still involve a gas valve. If the load is >200 mA, one may declare the load as characterized and use a soft-start mechanism. Soft start power stealing may be used as needed with no time of activation restriction. An on-cycle BBT may be used consistent with a 400 ohm load.

As to a type 2 load, the W load may have at least one step greater than 50 mA detected during the characterization period. On cycle power stealing should not necessarily be engaged during the blank out periods and soft start power steal shall be used exclusively. BBT may be used consistent with a 400 ohm load.

A type 2 load relative to a loss of flame recovery may be noted. CMAT should declare a time period when the expected main valve is likely to be engaged. Phantom engagement should happen past that point in about +5 seconds minimum. If a measurement returns a lower level consistent with purge or HSI or Sparking, the CMA may terminate power stealing and characterization mode should be continued for up to two additional main flame establishing periods plus post purge times, or until a re-light is successful, at which point the soft start stealing method shall be re-engaged.

The power broker should be notified to institute a substantial savings mode until a characterization has concluded. If the system does not hold in the main valve (by evidence of level), the system should soft power steal at what-ever level is available: If the system cannot move the heating load within 15 minutes, the HB should report possible heating issue because of AC voltage or likely flame problem.

If the main valve is suddenly lost (after the first conformational measurement and first engagement has concluded) (per the above paragraph pertaining to a measurement returning a lower level consistent with a purge or HSI or sparking), it may appear to the phantom circuit as a sudden loss in mA charge rate has occurred consistent with a major change in applied AC. Prior to indicating that conclusion the phantom circuit should immediately re-enter characterization mode.

If the measured load is consistent with a previously known level, then an AC loss is not necessarily affirmative but a loss of flame may have occurred. If AC loss was detected, the device should enter survival mode for loss of AC.

Otherwise, the characterization mode should be continued for up to two additional main flame establishing periods plus post purge timing or until a re-light is successful, at which point the soft start stealing method should be re-engaged. The power broker should be notified to institute a substantial savings mode until when the characterization mode is complete.

If the system does not get into the main valve (by evidence of level), the system should soft power steal at what-ever level is available after three intervals of attempting main valve levels. If the system sensed temperature cannot move the heating load within 15 minutes, then the HB shall report a possible heating issue because of low AC voltage or a likely flame establishing an issue. This information may be particularly valuable to services such as contractor portal to generate a service call.

A system that has worked well for many cycles, yet suddenly starts to exhibit main flame establishing errata should be reported as a potential loss of service issue. This issue may be due to a poor flame proving as would occur with fouled flame rod. A message should be propagated for service suggestion.

If the situation happens at an initial install, a compatibility issue may be apparent and should be reported. A compatibility issue may be further apparent if the main valve is held in during the 80 second learning period but loses flame consistent with an engagement of a soft start power steal approach.

Possible causes may be an aged gas valve, low system voltage due to in-sufficient VA of transformer or low system voltage due to loading of other equipment such as humidifier. A work around recommendation for this situation may be to add a faux loading 1K ohm resistor from the cool terminal to the systems transformer common connection to retain H/C configuration option.

A power interrupting wax motor valve detection may be noted. A wax motor valve may have unique characteristics in that it has a resistive heater load that melts wax which allows a spring to open the valve. One, the valve mechanism is completely open, a limit switch may be tripped which allows the wax to cool and the mechanism starts to close (by the spring pressure) until the switch closure is made and the heater is again energized.

If the measured current of the valve is >750 mA, the characterized load testing should be run in testing for this behavior. Otherwise, do not necessarily characterize the load, but one may use a soft start. Normal on-cycle power stealing should be allowed. After 1 minute to 4 minutes of a sensed ma-charge, current may exhibit a significant change in value due to operation of the heater and power interrupting contact. If phantom logic detects an abrupt ma-charge change (within this interval), the system may switch to a characterized measurement process to determine if the special valve is present or if an actual power disturbance exists.

A characterized approach may be noted. The wax valve should be characterized by observing that an interrupted or significant current level change occurs, is greater than 500 mA and does not last longer than 60 seconds. If the duty cycle behavior is observed, the NV ram values should be set to characterize as a type 3. The characterize module may pass an average timing of the off (lower) interval as well. Values for the high interval and low interval should also be written.

The normal power stealing module may ignore the duty cycling behavior unless the time of the low interval duration increases by 50 percent. The normal module may return the load to the characterization module for a loss of AC determination. Otherwise, if no load changes are detected, the load may be treated as non-characterizable for the future.

Figure 14:
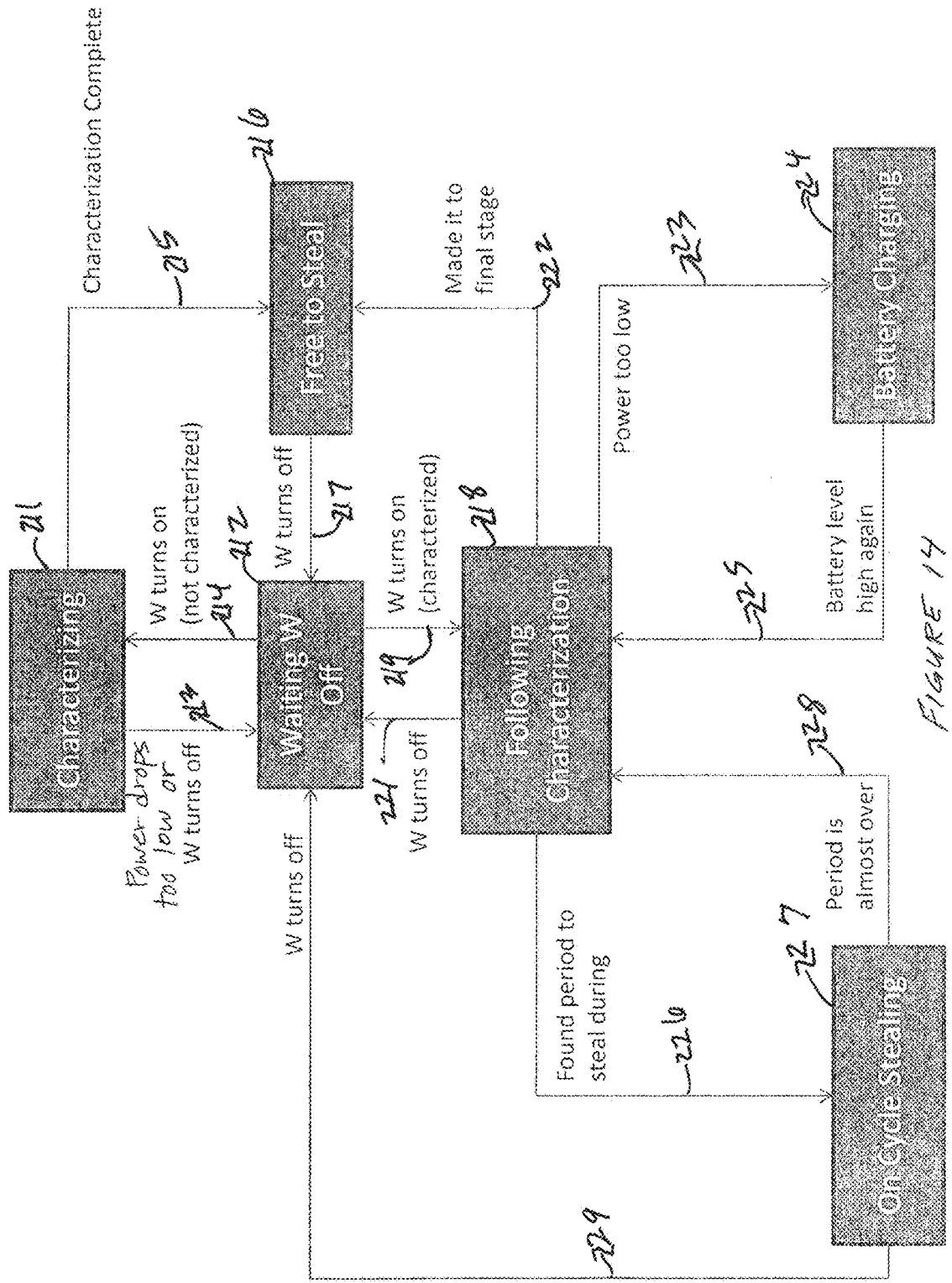
FIG. 14 is a diagram of a state overview.

The following ISUs, for an instance of a thermostat, may cause a load to be re-characterized when they are changed.
  INDEX_ISU_INSTALLATION_TYPE
  INDEX_ISU_HEAT_SYSTEM_TYPE_1
  INDEX_ISU_HEAT_EQUIP_TYPE_1
  INDEX_ISU_COOL_STAGES
  INDEX_ISU_HEAT_STAGES
  INDEX_ISU_FAN_OPERATION_IN_HEAT
  INDEX_ISU_AUX_BACKUP_HEAT_TYPE
  INDEX_ISU_EXTERNAL_FOSSIL_FUEL_KIT
  INDEX_ISU_AUX_BACKUP_HEAT_FAN_OPERATION
  INDEX_ISU_CPH_HEATS1
  INDEX_ISU_CPH_HEATS2
  INDEX_ISU_CPH_BACKUP1
  INDEX_ISU_HUMIDIFIER_TYPE
  INDEX_ISU_VENT_TYPE The following ISUs may not necessarily cause a re-characterization when changed.
  INDEX_ISU_TSTAT_CONFIGURED
  INDEX_ISU_LANGUAGE
  INDEX_ISU_ZONE_NUMBER
  INDEX_ISU_DEVICE_NAME
  INDEX_ISU_SCHED_OPTIONS
  INDEX_ISU_TEMP_FORMAT
  INDEX_ISU_OUTDOOR_TEMP_SENSOR
  INDEX_ISU_REV_VALVE_POLARITY
  INDEX_ISU_L_TERMINAL
  INDEX_ISU_AUTO_CHANGEOVER
  INDEX_ISU_DEADBAND
  INDEX_ISU_DROOP_LOCK_AUX_BACKUP_HEAT_STAGE_1
  INDEX_ISU_BACKUP_HEAT_UPSTAGE_TIMER
  INDEX_ISU_HP_CMPR_LOCKOUT
  INDEX_ISU_HP_AUX_LOCKOUT
  INDEX_ISU_CPH_COOLS1
  INDEX_ISU_CPH_COOLS2
  INDEX_ISU_MIN_CMPR_OFF
  INDEX_ISU_AIR_ENABLE
  INDEX_ISU_MIN_COOL_SP
  INDEX_ISU_MAX_HEAT_SP
  INDEX_ISU_KEYPAD_LOCKOUT
  INDEX_ISU_TEMP_SENSOR_SELECTION
  INDEX_ISU_INDOOR_HUM_SENSOR
  INDEX_ISU_HUMIDIFIER1_WIRING_ASSIGNMENT
  INDEX_ISU_HUM_FROST_PROTECTION
  INDEX_ISU_HUM_SYSTEM_MODE
  INDEX_ISU_DEHUM_EQUIP
  INDEX_ISU_INDOOR_DEHUM_SENSOR
  INDEX_ISU_DEHUMIDIFIER_WIRING_ASSIGNMENT
  INDEX_ISU_DEHUM_RELAY
  INDEX_ISU_DEHUM_ALGORITHM
  INDEX_ISU_DEHUM_MAX_DROOP
  INDEX_ISU_DEHUM_SYSTEM_MODE
  INDEX_ISU_DEHUM_FAN_MODE
  INDEX_ISU_SOUTHERN_DEHUM_FAN
  INDEX_ISU_SOUTHERN_DEHUM_LOW_LIMIT
  INDEX_ISU_SOUTHERN_DEHUM_TEMP_SETPOINT
  INDEX_ISU_SOUTHERN_DEHUM_RH_SETPOINT
  INDEX_ISU_VENT_WIRING_ASSIGNMENT
  INDEX_ISU_VENT_ALGORITHM
  INDEX_ISU_VENT_CTRL_FAN_MODE
  INDEX_ISU_VENT_PERCENT_ON_TIME
  INDEX_ISU_VENT_LOCKOUT_TEMP_LOW
  INDEX_ISU_VENT_LOCKOUT_TEMP_HIGH
  INDEX_ISU_VENT_LOCKOUT_DEWPOINT_HIGH_VALUE
  INDEX_ISU_VENT_CTRL
  INDEX_ISU_DEHUM_VIA_VENT
  INDEX_ISU_SMART_HEAT_TEMP_LIMIT
  INDEX_ISU_SMART_COOL_TEMP_LIMIT
  INDEX_ISU_HOME_HEAT_SETPOINT
  INDEX_ISU_HOME_COOL_SETPOINT
  INDEX_ISU_AWAY_HEAT_SETPOINT
  INDEX_ISU_AWAY_COOL_SETPOINT
  INDEX_ISU_AWAY_MODE_SETPOINT_CHOICE
  INDEX_ISU_FEELS_LIKE
  INDEX_ISU_IDEAL_RELATIVE_HUM
  INDEX_ISU_FEELS_LIKE_CORRECTION
  INDEX_ISU_R_VALUE_HOUSE
  INDEX_ISU_HUM_RESET_COOL
  INDEX_ISU_HUM_RESET_HEAT FIG. 14 is a diagram of a state overview. "Characterizing" may occur at symbol 211 on a line 213 with an arrow to "waiting W off" at symbol 212. Line 213 may indicate that power drops too low or "W turns off". A line 214 from symbol 212 to symbol 211 may indicate "W turns on (not characterized)".

"Characterization complete" may be indicated on line 215 from symbol 11 to "Free to Steal" at symbol 216. A line 217 from symbol 16 to symbol 212 may indicate "W turns off". From symbol 212 to a symbol 218 representing "Following Characterization", may be a line 219 indicating that "W turns on (characterized)". "Following Characterization" at symbol 218, "W urns off" may be indicated by a line 221 that goes from symbol 218 to symbol 212. A line 222 indicating "Made it to final stage" may go from symbol 218 to symbol 216.

"Power too low" may be indicated by a line 223 going from symbol 218 to a symbol 224 that represents "battery charging". When a battery is charged at symbol 224, a line 225 indicating "Battery level high again" may go from symbol 224 to symbol 218. A line 226 indicating a "found period to steal during [it]" may go from symbol 218 to a symbol 227 representing "On Cycle Stealing". A line 228 indicating "Period is almost over" may go from symbol 227 to symbol 218. Also from symbol 227 may be a line 229 indicating "W turns off" that goes from symbol 227 to symbol 212.

Figure 15:
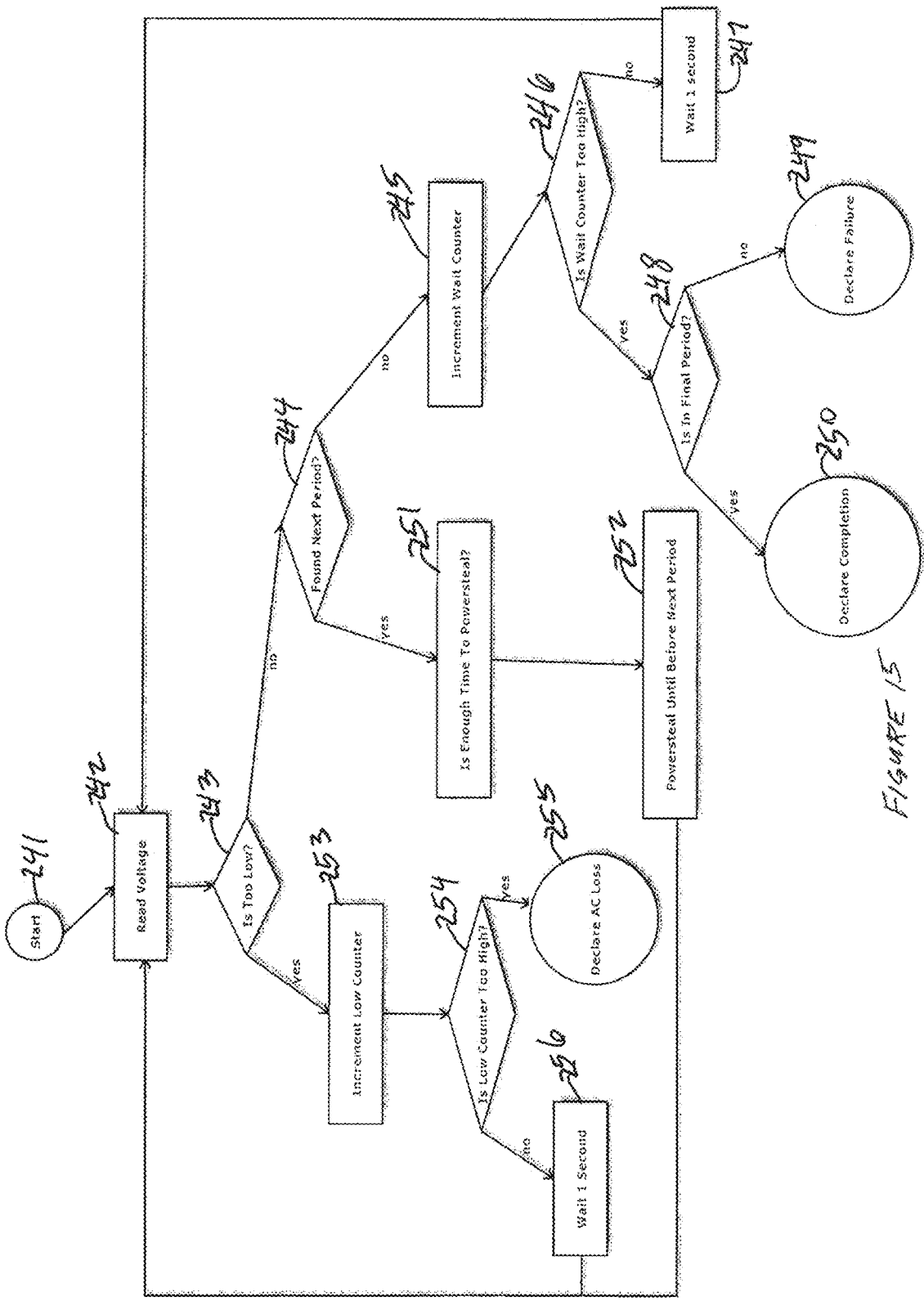
FIG. 15 is a flow diagram of a characterization.

FIG. 15 is a flow diagram of a characterization. From a start at symbol 231, a step to read voltage may occur at symbol 232. A question of whether the step is up may be asked at symbol 233. If an answer is yes, then a new step may be recorded at symbol 234. Following waiting about one second at a symbol 235, one may return to symbol 232 to read a voltage.

If the answer to the question at step 233 is no, then a question of whether the voltage is stable may be asked at a symbol 236. If an answer is no then, one may wait about one second after which a return to read voltage at symbol 232 may occur. If the answer is yes, then finish recording may occur at a symbol 237.

Figure 16:
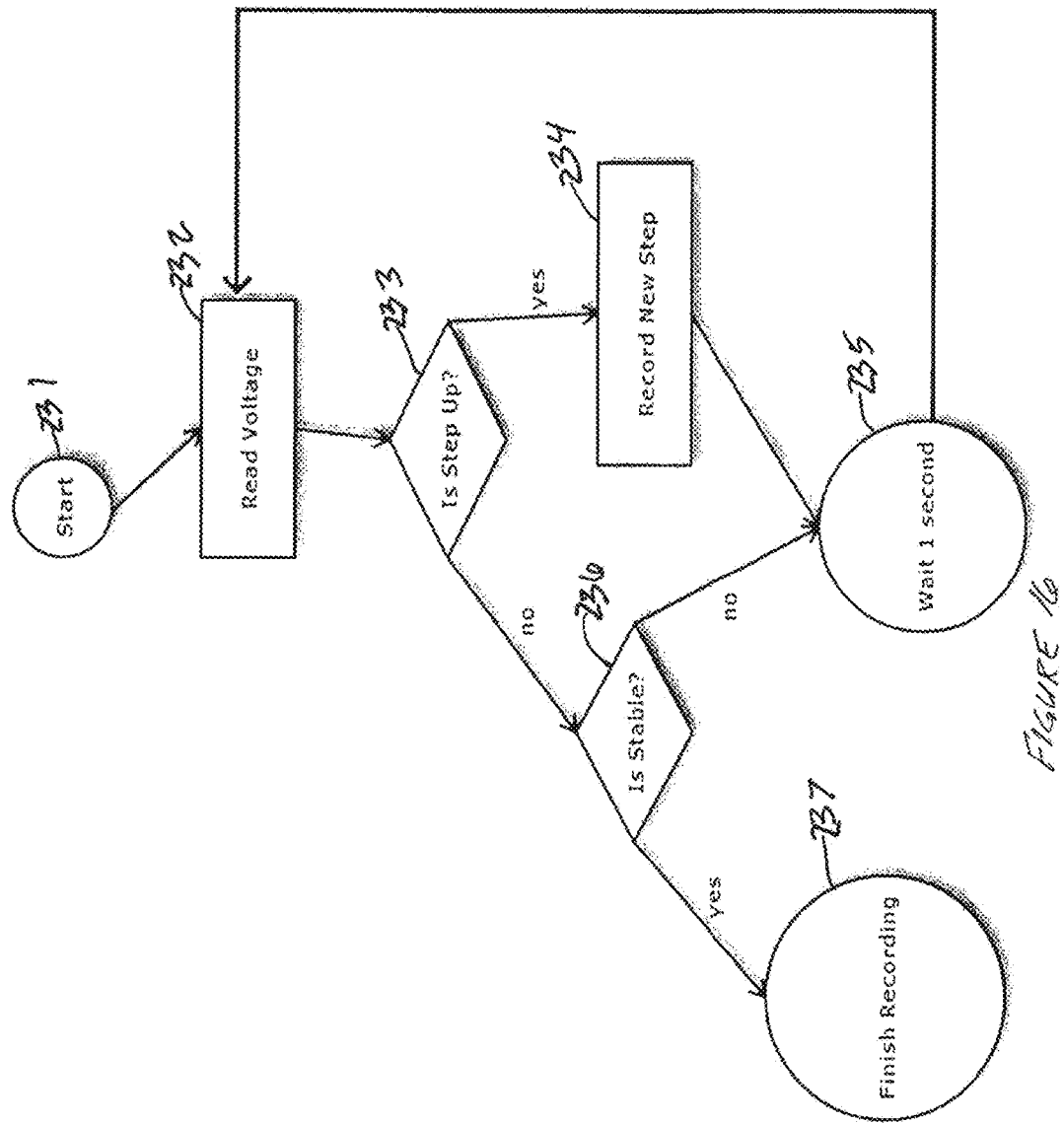
FIG. 16 is a flow diagram of an already characterized situation.

FIG. 16 is a flow diagram of an already characterized situation. From a start at symbol 241, a step of read voltage may occur at a symbol 242. A question of whether the voltage is too low may be asked at symbol 243. If an answer is no, then a question whether a next period if found may be asked at a symbol 244. If an answer is no, then a wait counter may be incremented at a symbol 245. A question may then be asked at symbol 246 whether the wait counter is too high. If the answer is no, then an about one second wait may occur at symbol 247. After symbol 247, a return may be made to read a voltage at symbol 242.

If the answer to symbol 246 is yes, then a question of whether one is in a final period at symbol 248 may be asked. If an answer is no, then a failure may be declared at symbol 249. If the answer to the question at symbol 248 is yes, then completion may be declared at symbol 250.

If the answer at symbol 244 is yes as to whether the next period is found, then if there is enough time to power steal may be noted at symbol 251 and the power steal can occur until before the next period at symbol 252. After symbol 252, a return to read voltage at symbol 242 may be done.

If an answer to the question at symbol 243 of whether the voltage is too low is yes, then a low counter may be incremented at a symbol 253. A question at symbol 254 of whether the low counter is too high may be asked. If an answer is yes, then an AC loss may be declared at symbol 255. If the answer is no, then an about one second wait may occur at symbol 256. After the wait, a return to symbol 242 to read a voltage may occur.

Figure 17:
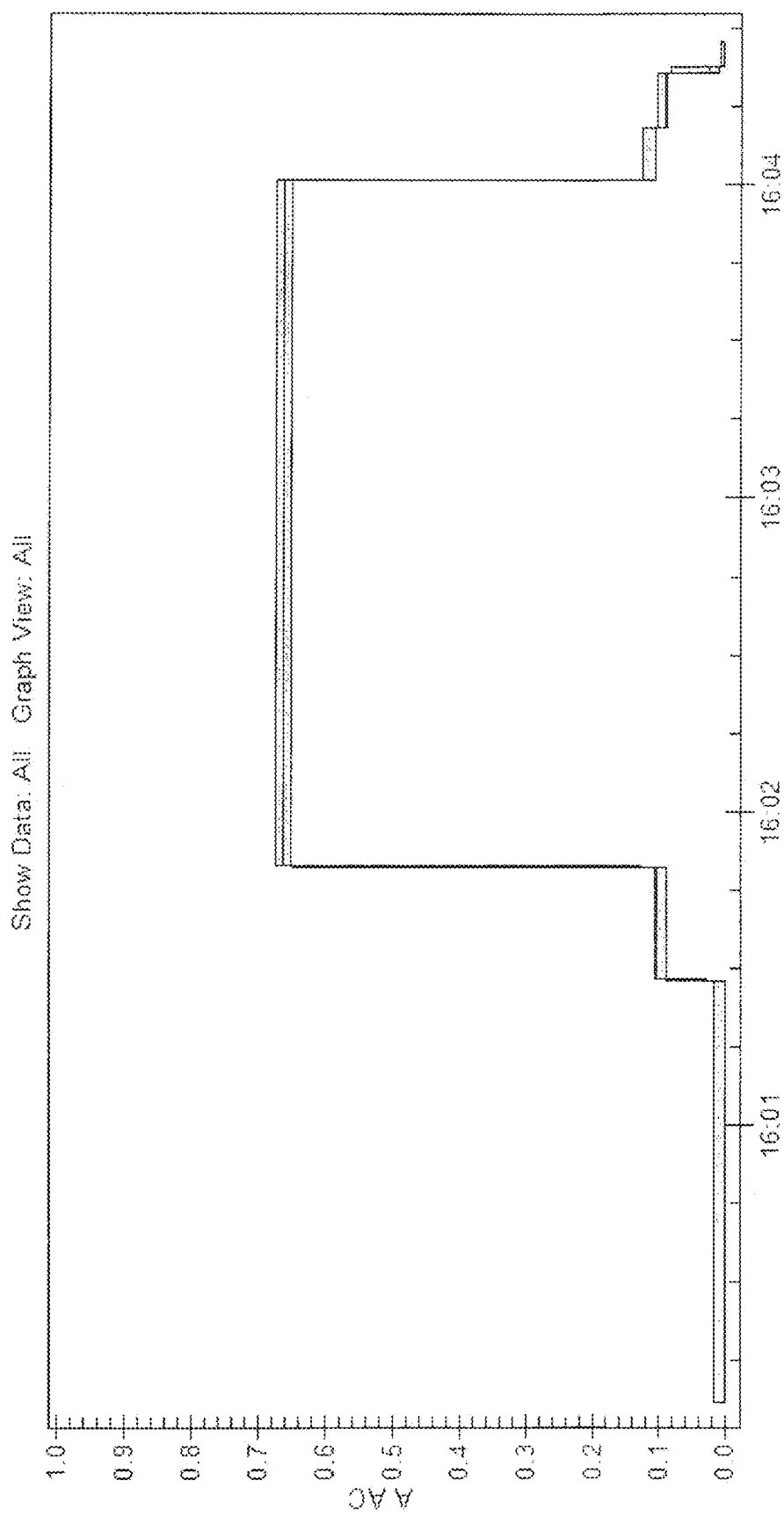
FIG. 17 is a diagram of a graph showing s fixture's process when it is in an off state, when a thermostat's call for heat, and when the call for heat is satisfied.
Figure 18:
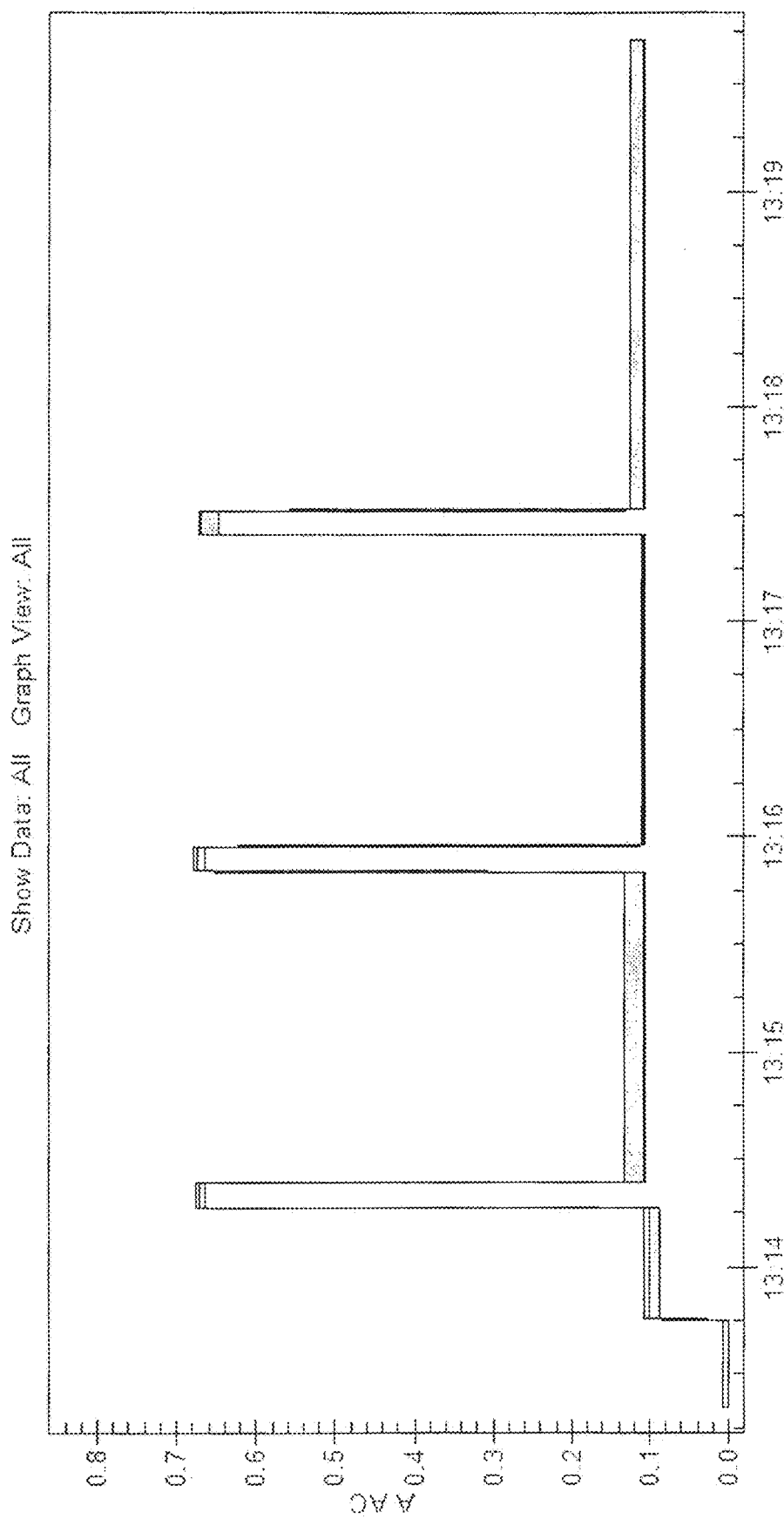
Figure 19:
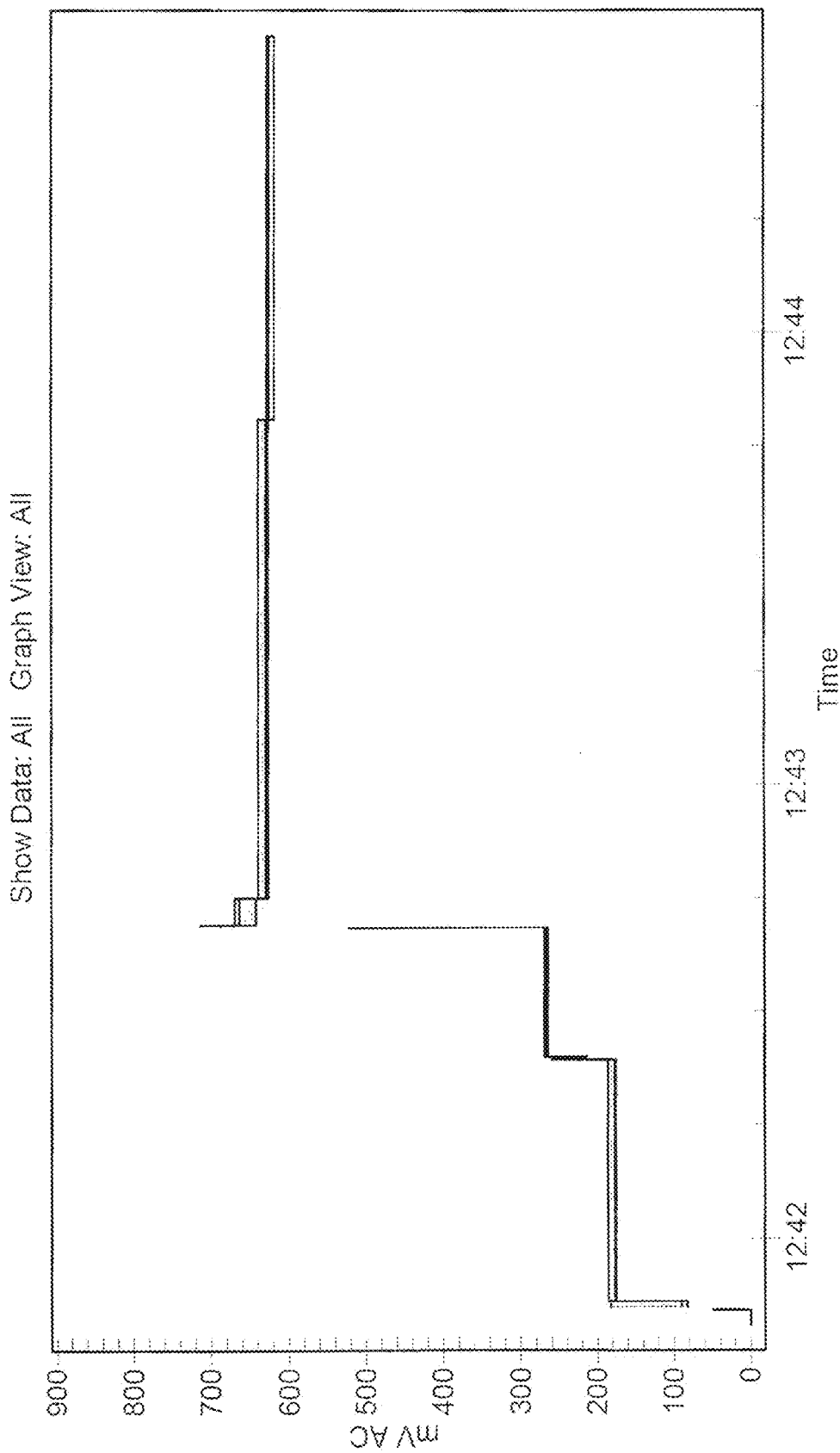
FIG. 19 is a diagram of a graph showing an area of purge, an igniter, a gas valve on, and a hold of the gas valve.
Figure 20:
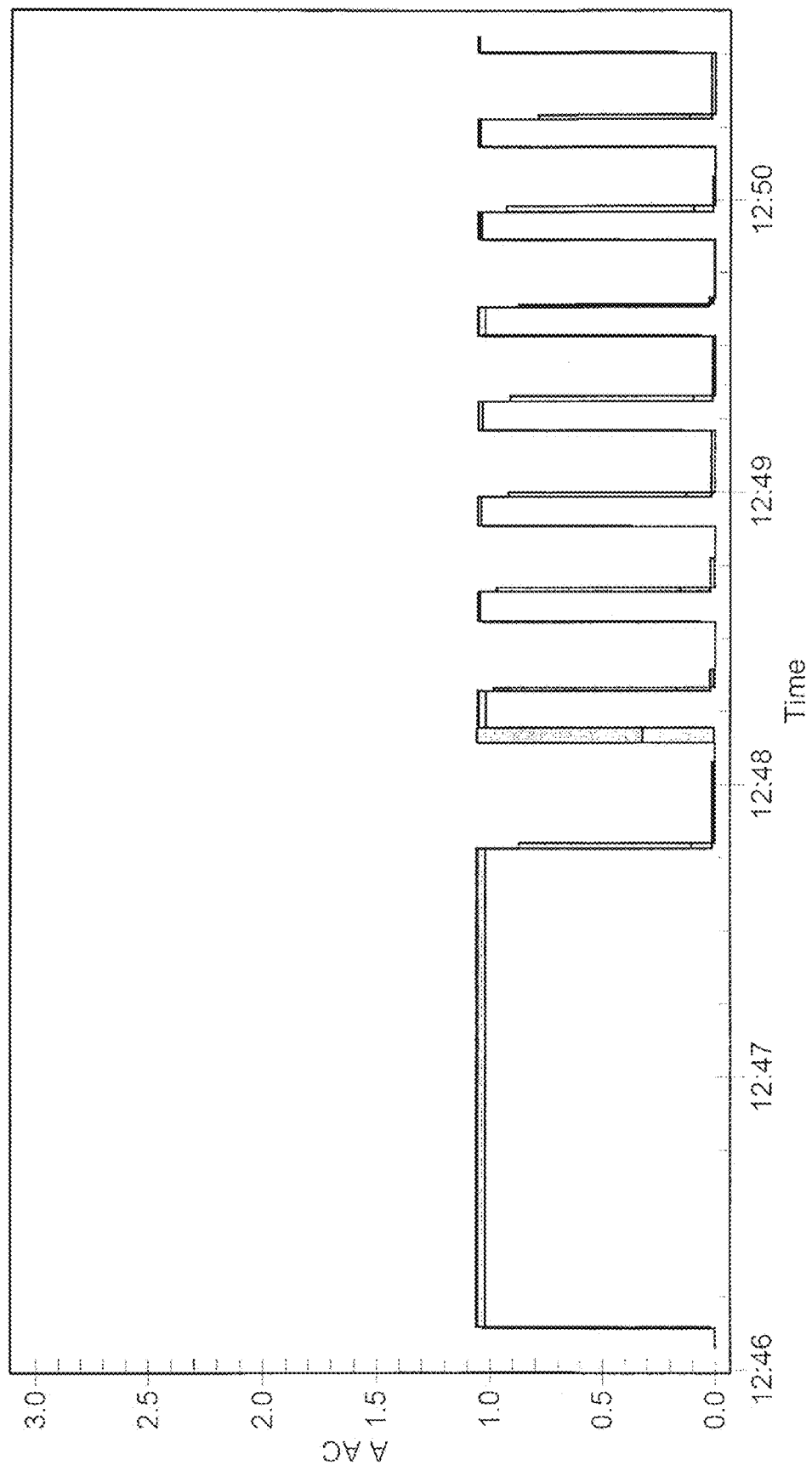
FIG. 20 is a diagram of a graph of a power steal, an activity of a wax motor valve operation.
Figure 21:
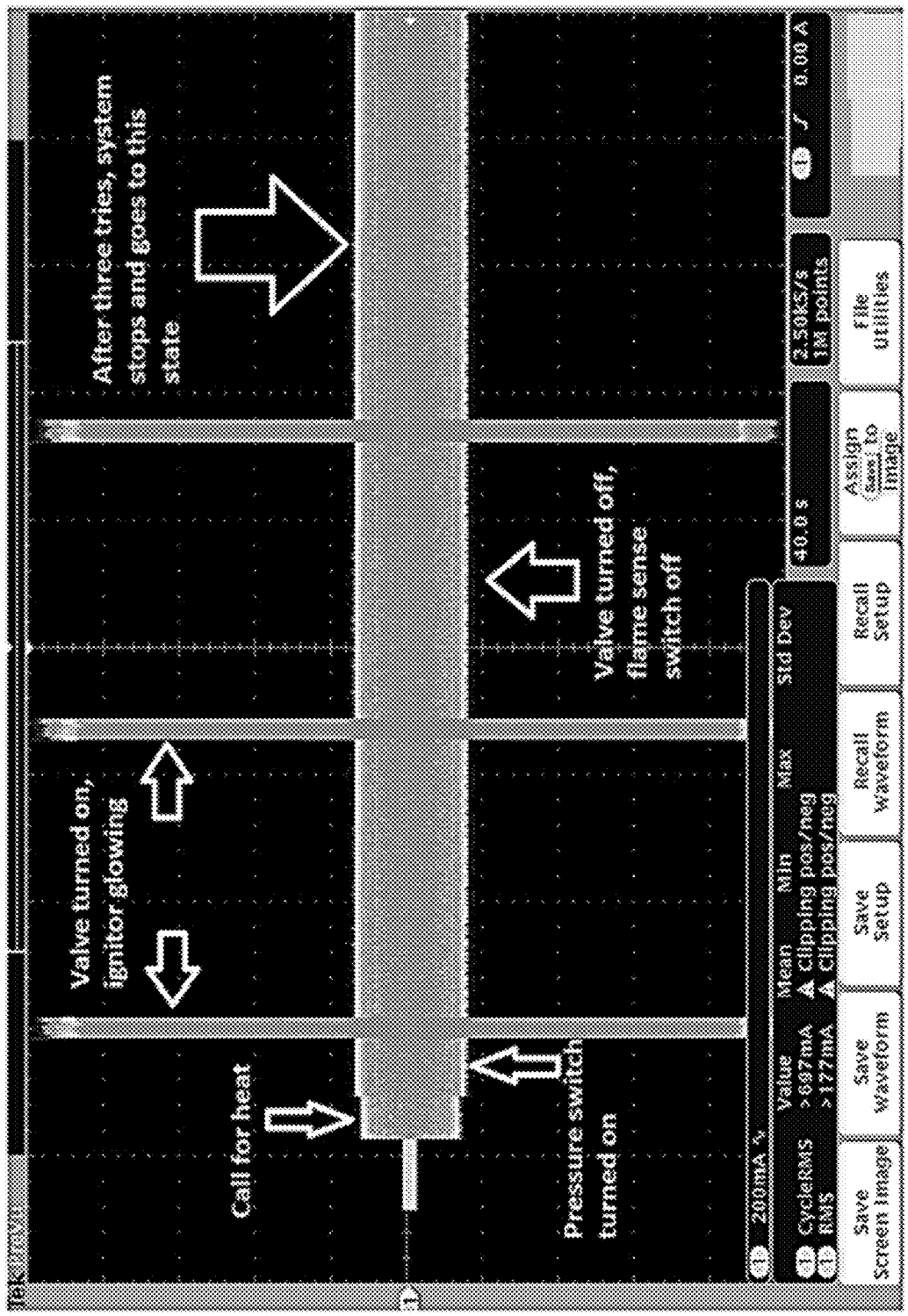
FIG. 21 is a diagram of a graph of an AC version of a waveform with certain events indicated along the waveform.
Figure 22:
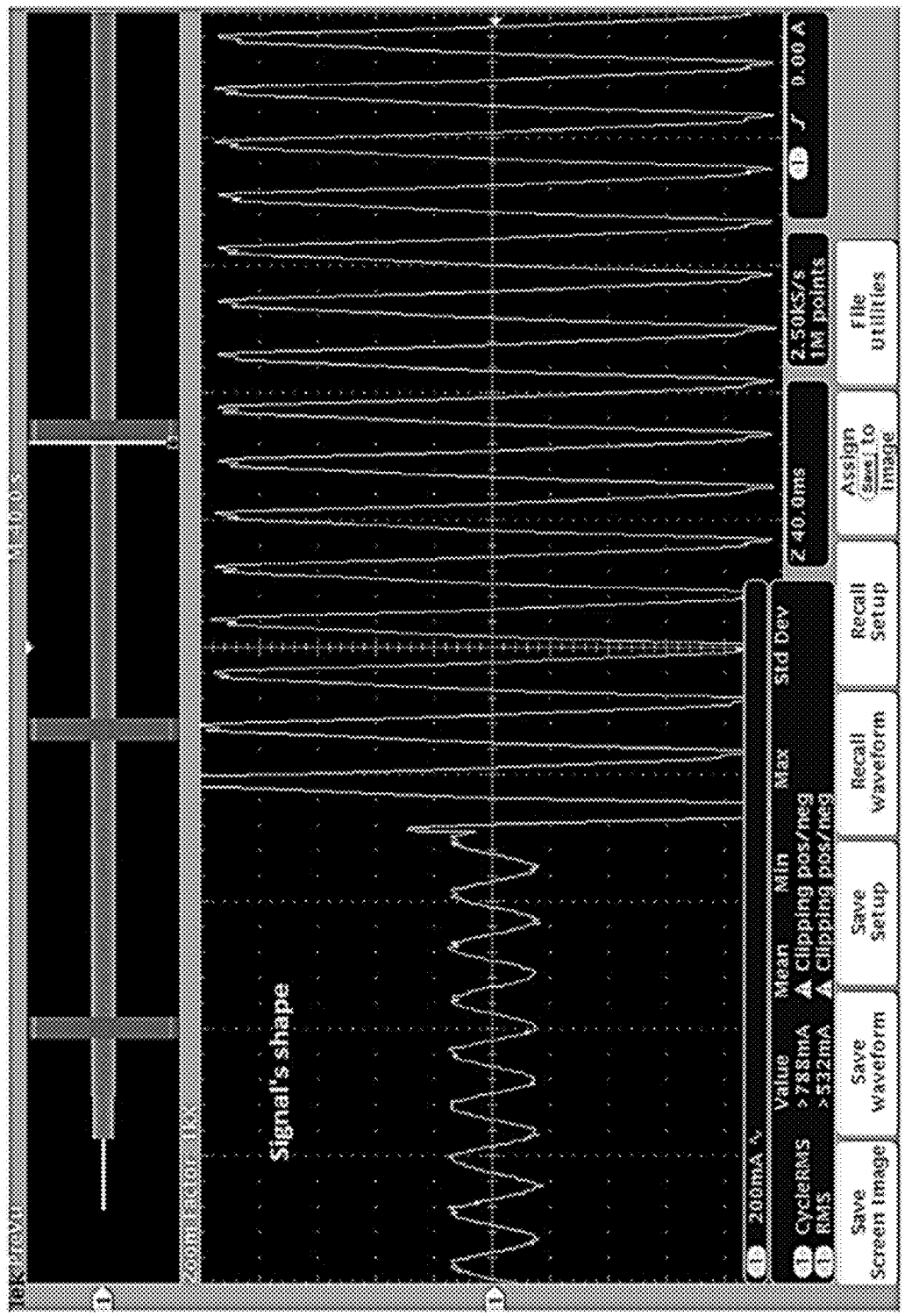
FIG. 22 is a diagram of a graph of a magnified portion of an AC version showing a signal's shape.

FIG. 17 is a diagram of a graph showing s fixture's process when it is in an off state, when a thermostat's call for heat, and when the call for heat is satisfied. FIG. 18 is a diagram of a graph where a fixture's process when it is in an off state, when the thermostat call for heat, and when the flame sense is not turned on. FIG. 19 is a diagram of a graph showing an area of purge, an igniter, a gas valve on, and a hold of the gas valve. FIG. 20 is a diagram of a graph of a power steal, an activity of a wax motor valve operation. FIG. 21 is a diagram of a graph of an AC version of a waveform with certain events indicated along the waveform. FIG. 22 is a diagram of a graph of a magnified portion of an AC version showing a signal's shape.

To recap, a power transformation module of a thermostat may incorporate a power harvesting mode, and a characterization mode. The power harvesting mode may incorporate pulling electrical power from a line carrying power for a load related to a thermostatic system, and storing the electrical power from the line available for use by the thermostatic system. The characterization mode may incorporate providing an electrical power to the load, measuring a waveform of the electrical power to the load in terms of magnitude and time to obtain a profile of the waveform, obtaining a signature from the profile of the waveform to identify one or more components of the load, and determining a condition of the one or more components from the signature.

The module may further incorporate obtaining installation configuration information corresponding to the thermostat related to the load to anticipate a general form of a waveform of the load to better identify the one or more components.

The load may be connected in series with the power transformation module. The power transformation module may be in a characterization mode or a power harvesting mode. The signature obtained by the characterization mode may indicate an identification of one or more components selected from a group consisting of a current interrupting wax coil valve, a hot surface igniter, and a flame rod. The signature of an identified component may reveal one or more activities of one or more components, selected from a group consisting of lighting, flame out, no light off, and general operation.

The activities of the one or more components that affect flame quality of a heating system controlled by the thermostat may be improved by items from a group consisting of entering and exiting the power transformation and less aggressively harvesting power.

A mechanism for characterization of a load related to a thermostat, may incorporate an instrument for measuring load current versus time, a plotter connected to the instrument for graphing a waveform of the load current versus time, an analyzer connected to the plotter for analyzing the waveform to identify one or more components of the load, and a diagnostics evaluator connected to the analyzer to determine a health of the one or more components.

The mechanism may further incorporate a connection between the instrument and a cloud. The cloud may incorporate one or more items selected from a group consisting of analysis, signatures, extraction, diagnostics, general processing, monitoring, and storage.

The instrument for measuring load current versus time may be an integral portion of a power transformation device. The instrument may measure load current versus time when the power transformation is not harvesting power.

A load current versus time measurement may reveal a sequence of activity by the one or more components. The sequence of activity may exhibit whether an operation of the one or more components is normal. If the one or more components have non-normal operation, then the load current versus time may be analyzed to determine a basis or cause of the non-normal operation.

A load current versus time measurement may reveal what type of equipment is being monitored by the measurement according to a catalog or table of measurements, or signatures as indicated by the measurements, that are correlated with types of equipment. Revealing a type of equipment may be a capability of a power transformation system that can instead divert energy from a load for at least partially operating a thermostat. A learning by the thermostat of the equipment enables the power transformation system to deal with an operation of a heating system relative to affecting flame quality.

An approach of a characterization mode of a power transformation system may incorporate providing an electrical waveform of power to a load related to a thermostat, measuring a profile of the electrical waveform in terms of magnitude and time, analyzing the magnitude versus time, and identifying one or more components of the load from analyzing the magnitude versus time of the current waveform.

The approach may further incorporate inferring a signature of the current from analyzing the magnitude versus time of the current waveform.

The approach may further incorporate sending the current waveform to a cloud for further analysis.

The approach may further incorporate sending the current waveform to a cloud for diagnosis of any apparent malfunction of the one or more components.

The current waveform is a current through a load of one or more components in a heating, ventilation and air conditioning system. The approach may further incorporate developing a characterization of equipment contributing to the load of a heating system.

The approach may further incorporate inferring a scenario of equipment from an analysis of the magnitude and time of the current waveform.

The approach may further incorporate diagnosing the one or more components of the load from analyzing the magnitude and time of the current waveform. If there is an issue of the one or more components of the load, there may be identifying the issue from the magnitude and time of the current waveform, and searching for a solution to resolve the issue.

The approach further incorporate providing a warning of a problem with the equipment from indications of a scenario, and facilitating a call for service to fix the problem with the equipment. The problem may be indicated by the current waveform as there being no light off of a flame of one or more components of a furnace, and the warning of the problem may be provided before an extended or complete failure of a light off of the flame occurs.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A mechanism for characterization of a load related to a thermostat, comprising:
   an instrument for measuring load current versus time;
   a plotter connected to the instrument for graphing a waveform of the load current versus time;
   an analyzer connected to the plotter for analyzing the waveform to identify one or more components of the load; and
   a diagnostics evaluator connected to the analyzer to determine a health of the one or more components; and
   wherein:
     a load current versus time measurement reveals what type of equipment is being monitored by the measurement according to a catalog or table of measurements, or signatures as indicated by the measurements, that are correlated with types of equipment;
     revealing a type of equipment is a capability of a power transformation system that can instead divert energy from a load for at least partially operating a thermostat; and
     a learning by the thermostat of the equipment enables the power transformation system to deal with an operation of a heating system relative to affecting flame quality.

2. The mechanism of claim 1, further comprising:
   a connection between the instrument and a cloud; and
   wherein the cloud comprises one or more items selected from a group consisting of analysis, signatures, extraction, diagnostics, general processing, monitoring, and storage.

3. The mechanism of claim 1, wherein:
   the instrument for measuring load current versus time is an integral portion of a power transformation device; and
   the instrument measures load current versus time when the power transformation is not harvesting power.

4. The mechanism of claim 1, wherein:
   the load current versus time measurement reveals a sequence of activity by the one or more components;
   the sequence of activity can exhibit whether an operation of the one or more components is normal; and
   if the one or more components have non-normal operation, then the load current versus time is analyzed to determine a basis or cause of the non-normal operation.

5. A method of a characterization mode of a power transformation system comprising:
   providing an electrical waveform of power to a load related to a thermostat;
   measuring a profile of the electrical waveform in terms of magnitude and time;
   analyzing the magnitude versus time;
   identifying one or more components of the load from analyzing the magnitude versus time of the current waveform;
   inferring a scenario of equipment from an analysis of the magnitude and time of the current waveform; and
   providing a warning of a problem with the equipment from indications of a scenario; and
   wherein:
     the problem is indicated by the current waveform as there being no light off of a flame of one or more components of a furnace; and
     the warning of the problem is provided before an extended or complete failure of a light off of the flame occurs.

6. The method of claim 5, wherein the current waveform is a current through a load of one or more components in a heating, ventilation and air conditioning system.

7. The method of claim 6, further comprising developing a characterization of equipment contributing to the load of a heating system.

8. The method of claim 5, further comprising inferring a signature of the current from analyzing the magnitude versus time of the current waveform.

9. The method of claim 5, further comprising sending the current waveform to a cloud for further analysis.

10. The method of claim 5, further comprising sending the current waveform to a cloud for diagnosis of any apparent malfunction of the one or more components.

11. The method of claim 5, further comprising:
    diagnosing the one or more components of the load from analyzing the magnitude and time of the current waveform; and
    wherein if there is an issue of the one or more components of the load, there are identifying the issue from the magnitude and time of the current waveform, and searching for a solution to resolve the issue.

12. The method of claim 5, further comprising:
    facilitating a call for service to fix the problem with the equipment.

* * * * *